(12) United States Patent
Kim et al.

(10) Patent No.: US 9,452,321 B2
(45) Date of Patent: Sep. 27, 2016

(54) PROCESS FOR DESIGNING RUGGED PATTERN ON GOLF BALL SURFACE

(71) Applicant: DUNLOP SPORTS CO. LTD., Kobe-shi, Hyogo (JP)

(72) Inventors: Hyoungchol Kim, Kobe (JP); Masahide Onuki, Kobe (JP)

(73) Assignee: DUNLOP SPORTS CO. LTD., Kobe-Shi (JP)

( * ) Notice: Subject to any disclaimer, the term of this patent is extended or adjusted under 35 U.S.C. 154(b) by 89 days.

(21) Appl. No.: 14/226,923

(22) Filed: Mar. 27, 2014

(65) Prior Publication Data

US 2014/0295997 A1    Oct. 2, 2014

(30) Foreign Application Priority Data

Mar. 28, 2013  (JP) ................................ 2013-067785
Feb. 28, 2014  (JP) ................................ 2014-037785

(51) Int. Cl.
*A63B 37/00* (2006.01)
*A63B 45/00* (2006.01)
*G06F 17/50* (2006.01)

(52) U.S. Cl.
CPC ......... *A63B 37/0006* (2013.01); *A63B 37/002* (2013.01); *A63B 37/0007* (2013.01); *A63B 37/0018* (2013.01); *A63B 37/0021* (2013.01); *A63B 45/00* (2013.01); *G06F 17/50* (2013.01); *A63B 37/0033* (2013.01); *A63B 37/0064* (2013.01); *A63B 37/0074* (2013.01); *A63B 37/0075* (2013.01); *A63B 37/0097* (2013.01)

(58) Field of Classification Search
CPC ........................... A63B 37/00; A63B 37/0006
See application file for complete search history.

(56) References Cited

U.S. PATENT DOCUMENTS

| 5,292,132 | A | 3/1994 | Oka | |
| 6,254,496 | B1 * | 7/2001 | Maehara | A63B 37/0004 473/378 |
| 6,409,615 | B1 * | 6/2002 | McGuire | A63B 37/0004 473/383 |
| 7,198,577 | B2 | 4/2007 | Ogg et al. | |
| 7,473,194 | B2 * | 1/2009 | Nardacci | A63B 37/0004 473/378 |
| 8,905,866 | B2 * | 12/2014 | Nakagawa | A63B 37/0003 473/378 |
| 2011/0028245 | A1 | 2/2011 | Nakagawa et al. | |
| 2011/0034274 | A1 | 2/2011 | Sajima et al. | |
| 2012/0165132 | A1 | 6/2012 | Nakamura | |
| 2013/0005510 | A1 * | 1/2013 | Kim | G06F 17/50 473/384 |

* cited by examiner

*Primary Examiner* — John E Simms, Jr.
(74) *Attorney, Agent, or Firm* — Birch, Stewart, Kolasch & Birch, LLP

(57) ABSTRACT

A golf ball 2 has, on a surface thereof, a rugged pattern composed of a land 10 and a large number of dimples 8. A process for designing the rugged pattern includes the steps of:
(1) arranging a large number of generating points on a surface of a phantom sphere;
(2) assuming a large number of Voronoi regions on the surface of the phantom sphere by a Voronoi tessellation based on the large number of generating points;
(3) calculating centers of gravity of the Voronoi regions and setting the centers of gravity as new generating points;
(4) assuming a large number of new Voronoi regions on the surface of the phantom sphere by a Voronoi tessellation based on a large number of the new generating points; and
(5) assigning dimples and a land to the surface of the phantom sphere based on contours of the new Voronoi regions.

15 Claims, 81 Drawing Sheets

PROCESS FOR DESIGNING RUGGED PATTERN ON GOLF BALL SURFACE

This application claims priority on Patent Application No. 2013-67785 filed in JAPAN on Mar. 28, 2013 and Patent Application No. 2014-37785 filed in JAPAN on Feb. 28, 2014. The entire contents of these Japanese Patent Applications are hereby incorporated by reference.

BACKGROUND OF THE INVENTION

1. Field of the Invention

The present invention relates to golf balls. Specifically, the present invention relates to processes for designing a rugged pattern on a golf ball surface.

2. Description of the Related Art

Golf balls have a large number of dimples on the surface thereof. The dimples disturb the air flow around the golf ball during flight to cause turbulent flow separation. By causing the turbulent flow separation, separation points of the air from the golf ball shift backwards leading to a reduction of drag. The turbulent flow separation promotes the displacement between the separation point on the upper side and the separation point on the lower side of the golf ball, which results from the backspin, thereby enhancing the lift force that acts upon the golf ball. The reduction of drag and the enhancement of lift force are referred to as a "dimple effect".

The ratio of the total area of dimples to the surface area of a phantom sphere of a golf ball is referred to as occupation ratio. It is known that the occupation ratio correlates to flight performance. A golf ball having an increased occupation ratio is disclosed in U.S. Pat. No. 5,292,132 (JP4-347177). The golf ball has circular dimples.

In a golf ball in which a small circular dimple is arranged in a zone surrounded by a plurality of large circular dimples, a high occupation ratio can be achieved. However, the small dimple does not contribute to the flight performance of the golf ball. There is a limit to the dimple effect of the golf ball having the circular dimples.

US2013/0005510 (JP2013-9906) discloses a golf ball having a dimple pattern designed by a Voronoi tessellation. The golf ball has a large number of non-circular dimples. The occupation ratio of the golf ball is high.

U.S. Pat. No. 7,198,577 discloses a golf ball having hexagonal dimples. The occupation ratio of the golf ball is high.

In the golf ball disclosed in US2013/0005510, variations of the areas of the dimples are great. The dimple effect of the golf ball is not sufficient. There is room for improvement in the flight performance of the golf ball.

In the golf ball disclosed in U.S. Pat. No. 7,198,577, the dimples are orderly arranged. The dimple effect of the golf ball is not sufficient. There is room for improvement in the flight performance of the golf ball.

An object of the present invention is to provide a golf ball having excellent flight performance.

SUMMARY OF THE INVENTION

A process for designing a rugged pattern on a golf ball surface according to the present invention includes the steps of:

(1) arranging a large number of generating points on a surface of a phantom sphere;

(2) assuming a large number of Voronoi regions on the surface of the phantom sphere by a Voronoi tessellation based on the large number of generating points;

(3) calculating a center of gravity of each of the Voronoi regions and setting the centers of gravity as new generating points;

(4) assuming a large number of new Voronoi regions on the surface of the phantom sphere by a Voronoi tessellation based on a large number of the new generating points; and (5) assigning dimples and a land to the surface of the phantom sphere based on contours of the large number of new Voronoi regions.

By the designing process according to the present invention, a golf ball having a high occupation ratio is obtained. In the golf ball, variations of the sizes of the dimples are small. The golf ball has excellent flight performance.

Preferably, the step (3) and the step (4) are further repeated between the step (2) and the step (5). A number of times of the repetition of the step (3) and the step (4) is n, and n is a natural number.

Preferably, when a maximum value Lmax(n) of distances between centers of gravity of Voronoi regions obtained when a number of times of the repetition is n and centers of gravity of Voronoi regions obtained when the number of times of the repetition is (n−1) is equal to or less than a predetermined value, the dimples and the land are assigned to the surface of the phantom sphere based on contours of the Voronoi regions obtained when the number of times of the repetition is n.

When a difference (Lmax(n−1)−Lmax(n)) between a maximum value Lmax(n−1) of distances between the centers of gravity of the Voronoi regions obtained when the number of times of the repetition is (n−1) and centers of gravity of Voronoi regions obtained when the number of times of the repetition is (n−2) and the maximum value Lmax(n) of the distances between the centers of gravity of the Voronoi regions obtained when the number of times of the repetition is n and the centers of gravity of the Voronoi regions obtained when the number of times of the repetition is (n−1) is equal to or less than a predetermined value, the dimples and the land may be assigned to the surface of the phantom sphere based on contours of the Voronoi regions obtained when the number of times of the repetition is n.

When an average Lave(n) of the distances between the centers of gravity of the Voronoi regions obtained when the number of times of the repetition is n and the centers of gravity of the Voronoi regions obtained when the number of times of the repetition is (n−1) is equal to or less than a predetermined value, the dimples and the land may be assigned to the surface of the phantom sphere based on contours of the Voronoi regions obtained when the number of times of the repetition is n.

When a difference (Lave(n−1)−Lave(n)) between an average Lave(n−1) of the distances between the centers of gravity of the Voronoi regions obtained when the number of times of the repetition is (n−1) and the centers of gravity of the Voronoi regions obtained when the number of times of the repetition is (n−2) and the average Lave(n) of the distances between the centers of gravity of the Voronoi regions obtained when the number of times of the repetition is n and the centers of gravity of the Voronoi regions obtained when the number of times of the repetition is (n−1) is equal to or less than a predetermined value, the dimples and the land may be assigned to the surface of the phantom sphere based on contours of the Voronoi regions obtained when the number of times of the repetition is n.

When a standard deviation σA(n) of areas of the Voronoi regions obtained when the number of times of the repetition is n is equal to or less than a predetermined value, the dimples and the land may be assigned to the surface of the phantom sphere based on contours of the Voronoi regions obtained when the number of times of the repetition is n.

When a difference ($\sigma A(n-1)-\sigma A(n)$) between a standard deviation $\sigma A(n-1)$ of areas of the Voronoi regions obtained when the number of times of the repetition is (n−1) and the standard deviation $\sigma A(n)$ of the areas of the Voronoi regions obtained when the number of times of the repetition is n is equal to or less than a predetermined value, the dimples and the land may be assigned to the surface of the phantom sphere based on contours of the Voronoi regions obtained when the number of times of the repetition is n.

When a ratio of the standard deviation $\sigma A(n)$ of the areas of the Voronoi regions obtained when the number of times of the repetition is n, relative to an average $Aave(n)$ of the areas of these Voronoi regions, is equal to or less than a predetermined value, the dimples and the land may be assigned to the surface of the phantom sphere based on contours of the Voronoi regions obtained when the number of times of the repetition is n.

When a maximum value $Amax(n)$ of the areas of the Voronoi regions obtained when the number of times of the repetition is n is equal to or less than a predetermined value, the dimples and the land may be assigned to the surface of the phantom sphere based on contours of the Voronoi regions obtained when the number of times of the repetition is n.

When a difference ($Amax(n-1)-Amax(n)$) between a maximum value $Amax(n-1)$ of the areas of the Voronoi regions obtained when the number of times of the repetition is (n−1) and the maximum value $Amax(n)$ of the areas of the Voronoi regions obtained when the number of times of the repetition is n is equal to or less than a predetermined value, the dimples and the land may be assigned to the surface of the phantom sphere based on contours of the Voronoi regions obtained when the number of times of the repetition is n.

When a standard deviation $\sigma D(n)$ of average diameters of the Voronoi regions obtained when the number of times of the repetition is n is equal to or less than a predetermined value, the dimples and the land may be assigned to the surface of the phantom sphere based on contours of the Voronoi regions obtained when the number of times of the repetition is n.

When a difference ($\sigma D(n-1)-\sigma D(n)$) between a standard deviation $\sigma D(n-1)$ of average diameters of the Voronoi regions obtained when the number of times of the repetition is (n−1) and the standard deviation $\sigma D(n)$ of the average diameters of the Voronoi regions obtained when the number of times of the repetition is n is equal to or less than a predetermined value, the dimples and the land may be assigned to the surface of the phantom sphere based on contours of the Voronoi regions obtained when the number of times of the repetition is n.

When a ratio of the standard deviation $\sigma D(n)$ of the average diameters of the Voronoi regions obtained when the number of times of the repetition is n, relative to an average of average radii $Rave(n)$ of these Voronoi regions, is equal to or less than a predetermined value, the dimples and the land may be assigned to the surface of the phantom sphere based on contours of the Voronoi regions obtained when the number of times of the repetition is n.

When a radius variation range $Rhmax(n)$ of a Voronoi region having a maximum radius variation range Rh among the Voronoi regions obtained when the number of times of the repetition is n is equal to or less than a predetermined value, the dimples and the land may be assigned to the surface of the phantom sphere based on contours of the Voronoi regions obtained when the number of times of the repetition is n.

When a difference ($Rhmax(n-1)-Rhmax(n)$) between a radius variation range $Rhmax(n-1)$ of a Voronoi region having a maximum radius variation range Rh among the Voronoi regions obtained when the number of times of the repetition is (n−1) and the radius variation range $Rhmax(n)$ of the Voronoi region having a maximum radius variation range Rh among the Voronoi regions obtained when the number of times of the repetition is n is equal to or less than a predetermined value, the dimples and the land may be assigned to the surface of the phantom sphere based on contours of the Voronoi regions obtained when the number of times of the repetition is n.

When a ratio of the radius variation range $Rhmax(n)$ of the Voronoi region having a maximum radius variation range Rh among the Voronoi regions obtained when the number of times of the repetition is n, relative to the average of the average radii $Rave(n)$ of these Voronoi regions, is equal to or less than a predetermined value, the dimples and the land may be assigned to the surface of the phantom sphere based on contours of the Voronoi regions obtained when the number of times of the repetition is n.

When a difference ($Rhmax(n)-Rhmin(n)$) between the radius variation range $Rhmax(n)$ of the Voronoi region having a maximum radius variation range Rh and a radius variation range $Rhmin(n)$ of a Voronoi region having a minimum radius variation range Rh among the Voronoi regions obtained when the number of times of the repetition is n is equal to or less than a predetermined value, the dimples and the land may be assigned to the surface of the phantom sphere based on contours of the Voronoi regions obtained when the number of times of the repetition is n.

When a difference (($Rhmax(n-1)-Rhmin(n-1)$)−($Rhmax(n)-Rhmin(n)$)) between a difference ($Rhmax(n-1)-Rhmin(n-1)$) between the radius variation range $Rhmax(n-1)$ of the Voronoi region having a maximum radius variation range Rh and a radius variation range $Rhmin(n-1)$ of a Voronoi region having a minimum radius variation range Rh among the Voronoi regions obtained when the number of times of the repetition is (n−1) and the difference ($Rhmax(n)-Rhmin(n)$) between the radius variation range $Rhmax(n)$ of the Voronoi region having a maximum radius variation range Rh and the radius variation range $Rhmin(n)$ of the Voronoi region having a minimum radius variation range Rh among the Voronoi regions obtained when the number of times of the repetition is n is equal to or less than a predetermined value, the dimples and the land may be assigned to the surface of the phantom sphere based on contours of the Voronoi regions obtained when the number of times of the repetition is n.

Preferably, at the step (5), the land is assigned to a vicinity of a contour of each Voronoi region of the surface of the phantom sphere.

A golf ball according to the present invention has a rugged pattern on a surface thereof and the rugged pattern is obtained by a designing process comprising the steps of:

(1) arranging a large number of generating points on a surface of a phantom sphere;

(2) assuming a large number of Voronoi regions on the surface of the phantom sphere by a Voronoi tessellation based on the large number of generating points;

(3) calculating a center of gravity of each of the Voronoi regions and setting the centers of gravity as new generating points;

(4) assuming a large number of new Voronoi regions on the surface of the phantom sphere by a Voronoi tessellation based on a large number of the new generating points; and (5) assigning dimples and a land to the surface of the phantom sphere based on contours of the large number of new Voronoi regions.

The golf ball has a large number of dimples on the surface thereof. Preferably, a ratio P1 of a number of dimples having a radius variation range Rh of 0.4 mm or greater relative to a total number of the dimples is equal to or greater than 30%.

Preferably, a ratio of a total area of all the dimples relative to a surface area of the phantom sphere is equal to or greater than 85%.

Preferably, a ratio of a standard deviation of average diameters of all the dimples relative to an average of average radii of all the dimples is equal to or less than 10%.

Preferably, a ratio of a standard deviation of areas of all the dimples relative to an average area of all the dimples is equal to or less than 10%.

According to another aspect, a golf ball according to the present invention has a large number of dimples on a surface thereof. A standard deviation of average diameters of all the dimples is equal to or less than 0.20 mm. A ratio of the standard deviation of the average diameters of all the dimples relative to an average of average radii of all the dimples is equal to or less than 10%. A standard deviation of areas of all the dimples is equal to or less than 1.40 mm². A ratio of the standard deviation of the areas of all the dimples relative to an average area of all the dimples is equal to or less than 10%. A radius variation range Rhmax of a dimple having a maximum radius variation range Rh among all the dimples is equal to or less than 1.8 mm. A radius variation range Rhmin of a dimple having a minimum radius variation range Rh among all the dimples is equal to or greater than 0.25 mm. A difference between the radius variation range Rhmax and the radius variation range Rhmin is equal to or less than 1.4 mm.

According to still another aspect, a golf ball according to the present invention has a large number of dimples on a surface thereof. A ratio P1 of a number of dimples having a radius variation range Rh of 0.4 mm or greater relative to a total number of the dimples is equal to or greater than 30%. A ratio of a total area of all the dimples relative to a surface area of a phantom sphere is equal to or greater than 85%. A ratio of a standard deviation of average diameters of all the dimples relative to an average of average radii of all the dimples is equal to or less than 10%.

According to still another aspect, a golf ball according to the present invention has a large number of dimples on a surface thereof. A ratio P1 of a number of dimples having a radius variation range Rh of 0.4 mm or greater relative to a total number of the dimples is equal to or greater than 30%. A ratio of a total area of all the dimples relative to a surface area of a phantom sphere is equal to or greater than 85%. A ratio of a standard deviation of areas of all the dimples relative to an average area of all the dimples is equal to or less than 10%.

According to still another aspect, a golf ball according to the present invention has a large number of dimples on a surface thereof. A variation of a radius of each dimple is not periodic. A ratio of a total area of all the dimples relative to a surface area of a phantom sphere is equal to or greater than 85%. A ratio of a standard deviation of average diameters of all the dimples relative to an average of average radii of all the dimples is equal to or less than 10%.

According to still another aspect, a golf ball according to the present invention has a large number of dimples on a surface thereof. A variation of a radius of each dimple is not periodic. A ratio of a total area of all the dimples relative to a surface area of a phantom sphere is equal to or greater than 85%. A ratio of a standard deviation of areas of all the dimples relative to an average area of all the dimples is equal to or less than 10%.

DESCRIPTION OF THE PREFERRED EMBODIMENTS

The following will describe in detail the present invention based on preferred embodiments with reference to the accompanying drawings.

Figure 1:
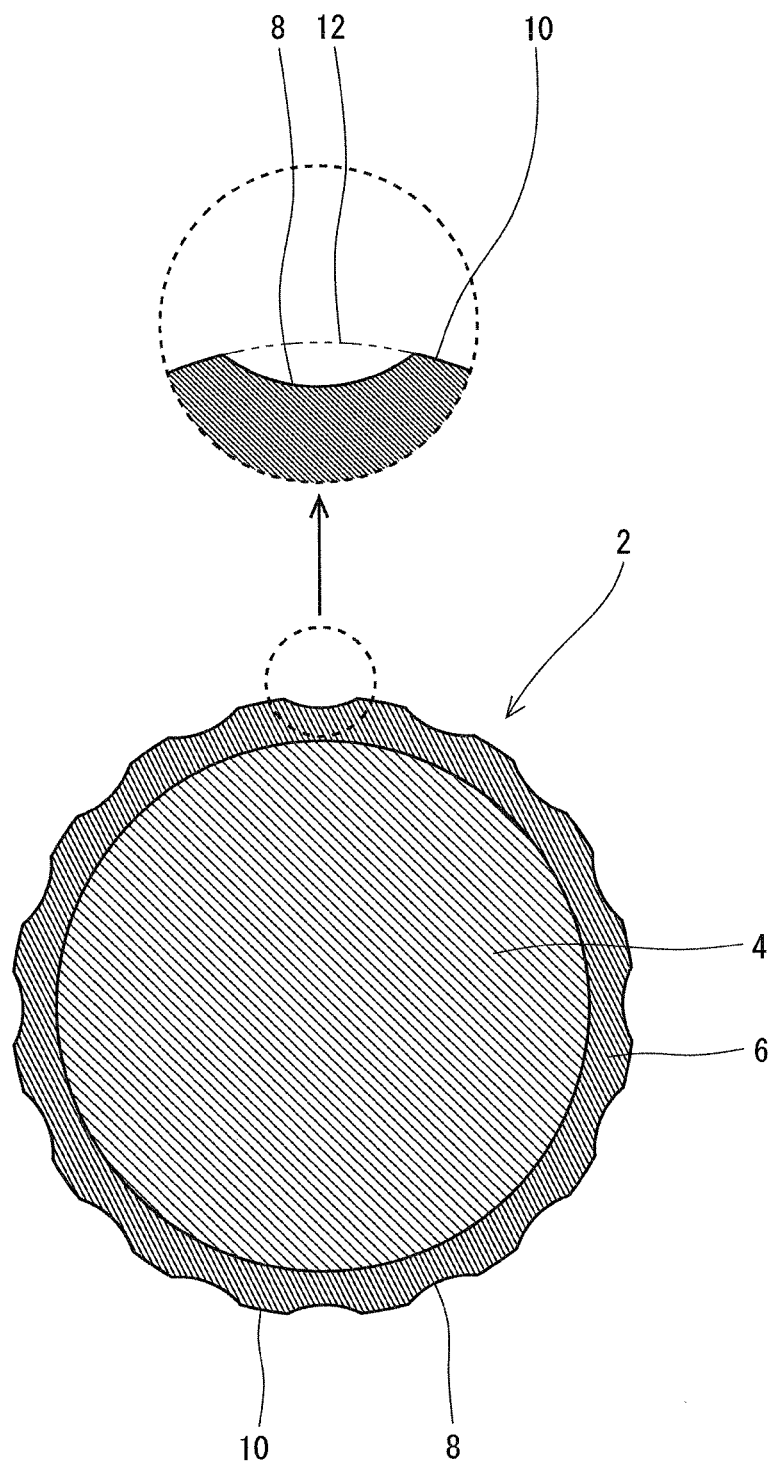
FIG. 1 is a schematic cross-sectional view of a golf ball obtained by a designing process according to one embodiment of the present invention.

A golf ball 2 shown in FIG. 1 includes a spherical core 4 and a cover 6. On the surface of the cover 6, a large number of dimples 8 are formed. Of the surface of the golf ball 2, a part other than the dimples 8 is a land 10. The golf ball 2 includes a paint layer and a mark layer on the external side of the cover 6 although these layers are not shown in the drawing. A mid layer may be provided between the core 4 and the cover 6.

The golf ball 2 has a diameter of preferably 40 mm or greater but 45 mm or less. From the standpoint of conformity to the rules established by the United States Golf Association (USGA), the diameter is particularly preferably equal to or greater than 42.67 mm. In light of suppression of air resistance, the diameter is more preferably equal to or less than 44 mm and particularly preferably equal to or less than 42.80 mm. The golf ball 2 has a weight of preferably 40 g or greater but 50 g or less. In light of attainment of great inertia, the weight is more preferably equal to or greater than 44 g and particularly preferably equal to or greater than 45.00 g. From the standpoint of conformity to the rules established by the USGA, the weight is particularly preferably equal to or less than 45.93 g.

The core 4 is formed by crosslinking a rubber composition. Examples of base rubbers for use in the rubber composition include polybutadienes, polyisoprenes, styrene-butadiene copolymers, ethylene-propylene-diene copolymers, and natural rubbers. Two or more rubbers may be used in combination. In light of resilience performance, polybutadienes are preferred, and, high-cis polybutadienes are particularly preferred.

In order to crosslink the core 4, a co-crosslinking agent can be used. Examples of preferable co-crosslinking agents in light of resilience performance include zinc acrylate, magnesium acrylate, zinc methacrylate, and magnesium methacrylate. Preferably, the rubber composition includes an organic peroxide together with a co-crosslinking agent. Examples of suitable organic peroxides include dicumyl peroxide, 1,1-bis(t-butylperoxy)-3,3,5-trimethylcyclohexane, 2,5-dimethyl-2,5-di(t-butylperoxy)hexane, and di-t-butyl peroxide.

According to need, various additives such as sulfur, a sulfur compound, a carboxylate, a filler, an anti-aging agent, a coloring agent, a plasticizer, a dispersant, and the like are included in the rubber composition of the core 4 in an adequate amount. Crosslinked rubber powder or synthetic resin powder may also be included in the rubber composition.

The core 4 has a diameter of preferably 30.0 mm or greater and particularly preferably 38.0 mm or greater. The diameter of the core 4 is preferably equal to or less than 42.0 mm and particularly preferably equal to or less than 41.5 mm. The core 4 may have two or more layers. The core 4 may have a rib on its surface.

A suitable polymer for the cover 6 is an ionomer resin. Examples of preferable ionomer resins include binary copolymers formed with an α-olefin and an α,β-unsaturated carboxylic acid having 3 to 8 carbon atoms. Examples of other preferable ionomer resins include ternary copolymers formed with: an α-olefin; an α,β-unsaturated carboxylic acid having 3 to 8 carbon atoms; and an α,β-unsaturated carboxylate ester having 2 to 22 carbon atoms. For the binary copolymers and ternary copolymers, preferable α-olefins are ethylene and propylene, while preferable α,β-unsaturated carboxylic acids are acrylic acid and methacrylic acid. In the binary copolymers and ternary copolymers, some of the carboxyl groups are neutralized with metal ions. Examples of metal ions for use in neutralization include sodium ion, potassium ion, lithium ion, zinc ion, calcium ion, magnesium ion, aluminum ion, and neodymium ion.

Another polymer may be used instead of or together with an ionomer resin. Examples of the other polymer include thermoplastic polyurethane elastomers, thermoplastic styrene elastomers, thermoplastic polyamide elastomers, thermoplastic polyester elastomers, and thermoplastic polyolefin elastomers. In light of spin performance, thermoplastic polyurethane elastomers are preferred.

According to need, a coloring agent such as titanium dioxide, a filler such as barium sulfate, a dispersant, an antioxidant, an ultraviolet absorber, a light stabilizer, a fluorescent material, a fluorescent brightener, and the like are included in the cover 6 in an adequate amount. For the purpose of adjusting specific gravity, powder of a metal with a high specific gravity such as tungsten, molybdenum, and the like may be included in the cover 6.

The cover 6 has a thickness of preferably 0.1 mm or greater and particularly preferably 0.3 mm or greater. The thickness of the cover 6 is preferably equal to or less than 2.5 mm and particularly preferably equal to or less than 2.2 mm. The cover 6 has a specific gravity of preferably 0.90 or greater and particularly preferably 0.95 or greater. The specific gravity of the cover 6 is preferably equal to or less than 1.10 and particularly preferably equal to or less than 1.05. The cover 6 may have two or more layers.

Figure 2:
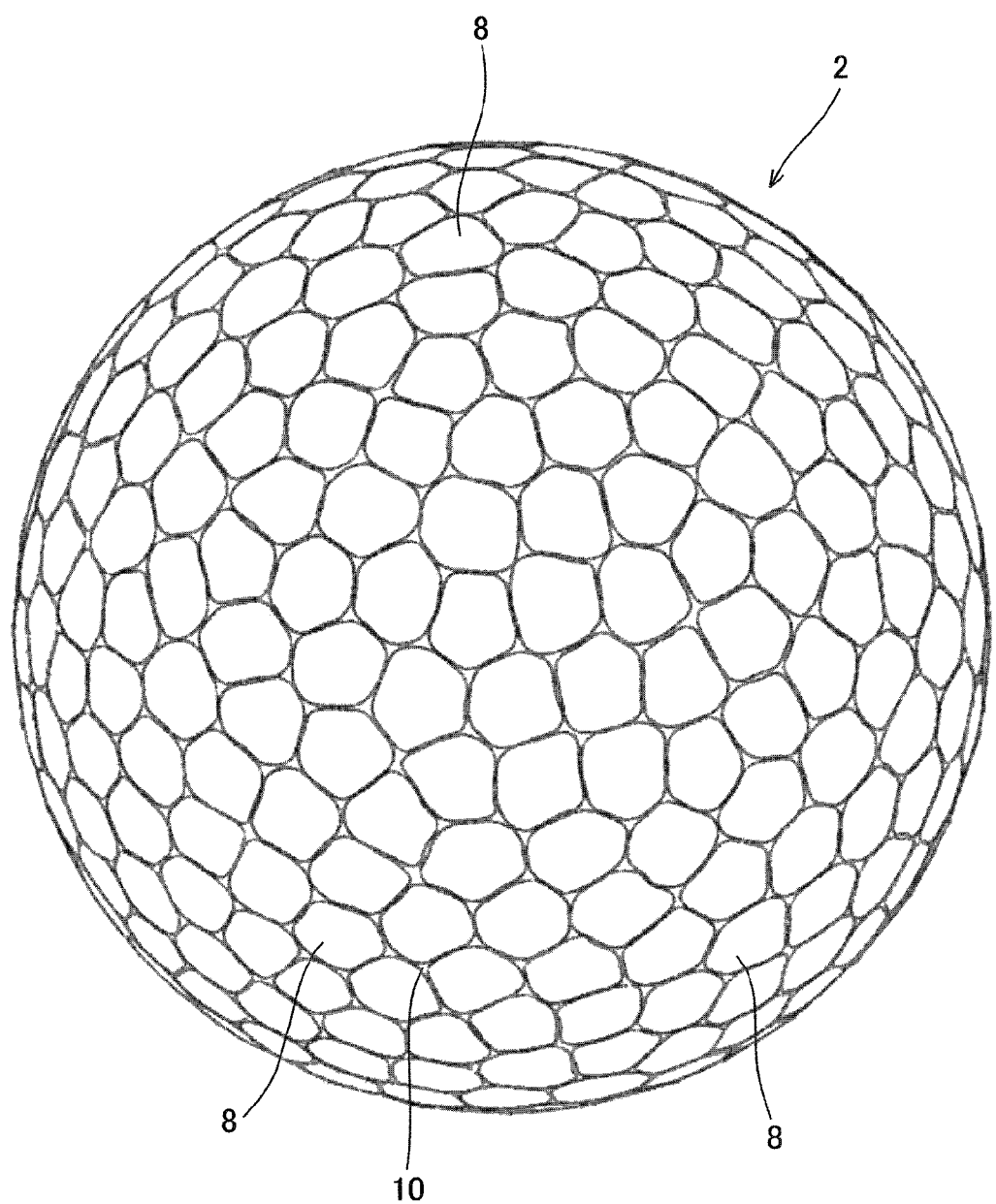
FIG. 2 is an enlarged front view of the golf ball in FIG. 1.
Figure 3:
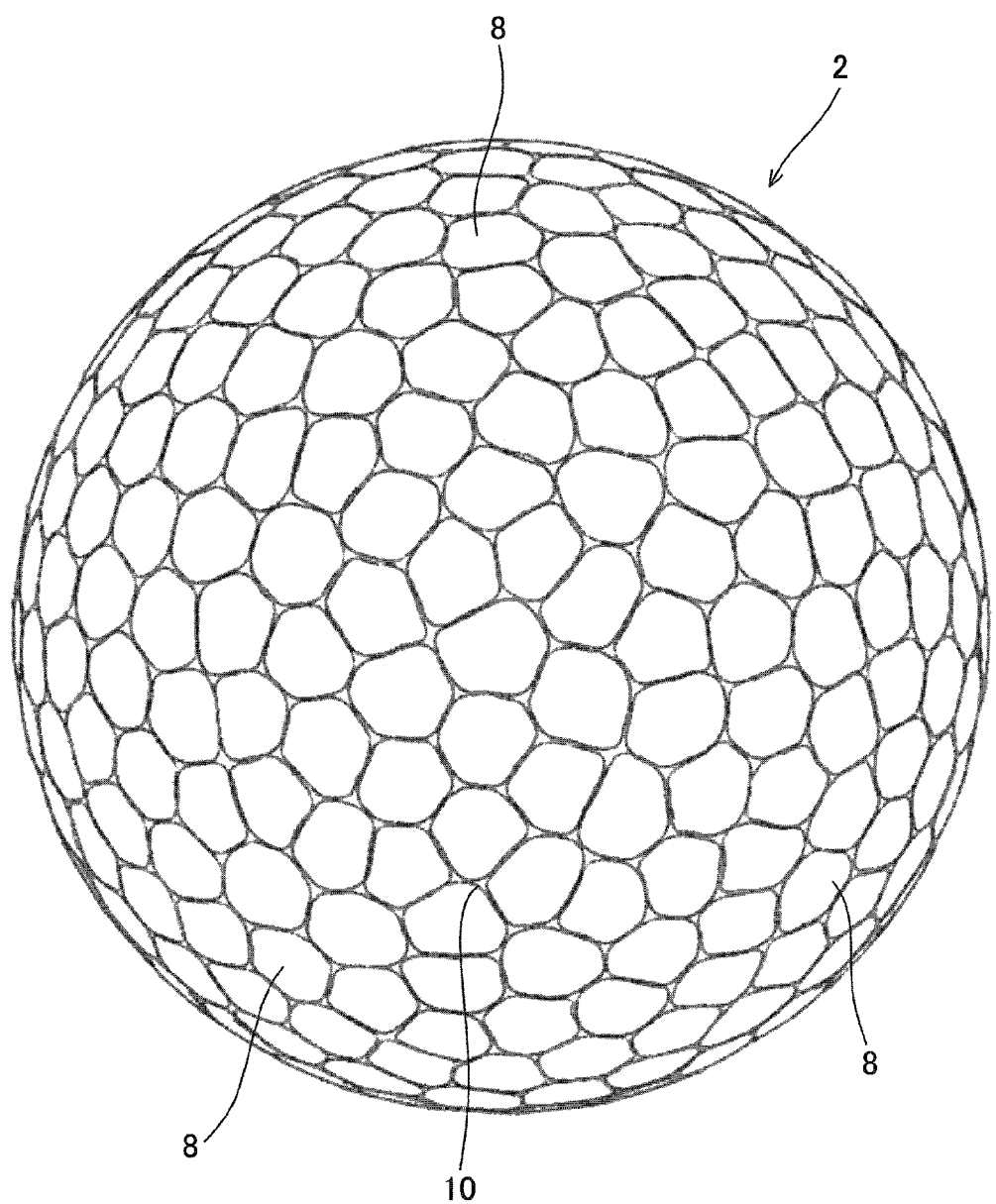
FIG. 3 is a plan view of the golf ball in FIG. 2.

FIG. 2 is an enlarged front view of the golf ball 2 in FIG. 1. FIG. 3 is a plan view of the golf ball 2 in FIG. 2. As is obvious from FIGS. 2 and 3, the golf ball 2 has a large number of non-circular dimples 8. By these dimples 8 and the land 10, a rugged pattern is formed on the surface of the golf ball 2.

In a process for designing the rugged pattern, a Voronoi tessellation is used. The designing process includes the steps of:

(1) arranging a large number of generating points on a surface of a phantom sphere;

(2) assuming a large number of Voronoi regions on the surface of the phantom sphere by a Voronoi tessellation based on the large number of generating points;

(3) calculating a center of gravity of each of the Voronoi regions and setting the centers of gravity as new generating points;

(4) assuming a large number of new Voronoi regions on the surface of the phantom sphere by a Voronoi tessellation based on a large number of the new generating points; and (5) assigning dimples and a land to the surface of the phantom sphere based on contours of the large number of new Voronoi regions.

In the present specification, each region assumed on the surface of the phantom sphere by a Voronoi tessellation is referred to as "Voronoi region". The designing process is preferably executed using a computer and software in light of efficiency. Of course, the present invention is practicable even by hand calculation. The essence of the present invention is not in a computer and software. The following will describe the designing process in detail.

Figure 4:
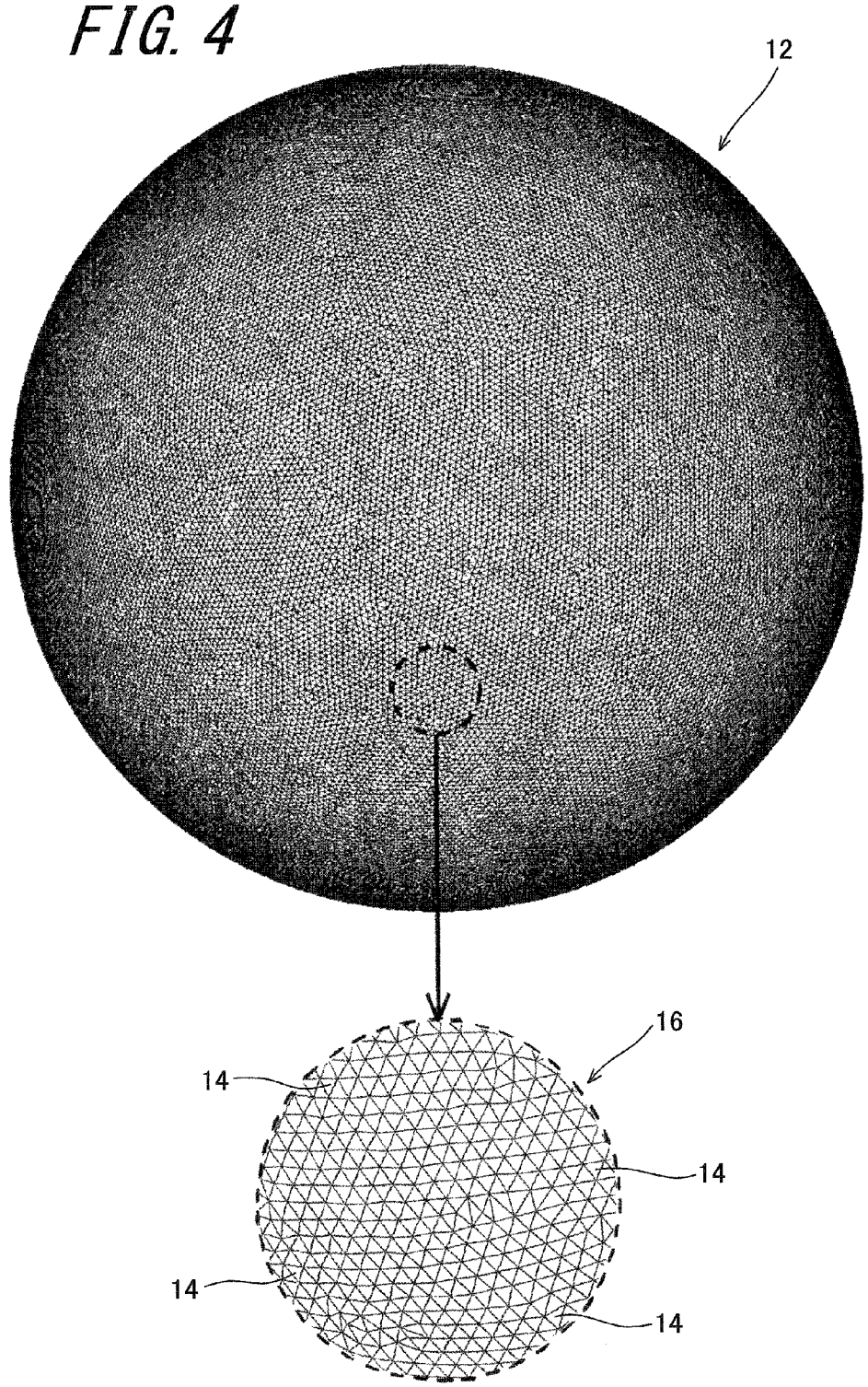
FIG. 4 is a front view of a mesh used in the designing process.

In the designing process, the surface of a phantom sphere 12 is divided into a large number of spherical triangles 14. This division is performed based on an advancing front method. The advancing front method is disclosed at Pages 195 to 197 of "Daigakuin Johoshorikogaku 3, Keisan Rikigaku (Information Science and Technology for Graduate School 3, Computational Dynamics)" (edited by Koichi ITO, published by Kodansha Ltd.). A mesh 16 shown in FIG. 4 is obtained by this division. The mesh 16 has 314086 triangles 14 and 157045 vertices. Each vertex is defined as a cell (or the center of a cell). The mesh 16 has 157045 cells. The phantom sphere 12 may be divided by other methods. The number of the cells is preferably equal to or greater than 10000 and particularly preferably equal to or greater than 100000.

Figure 5:
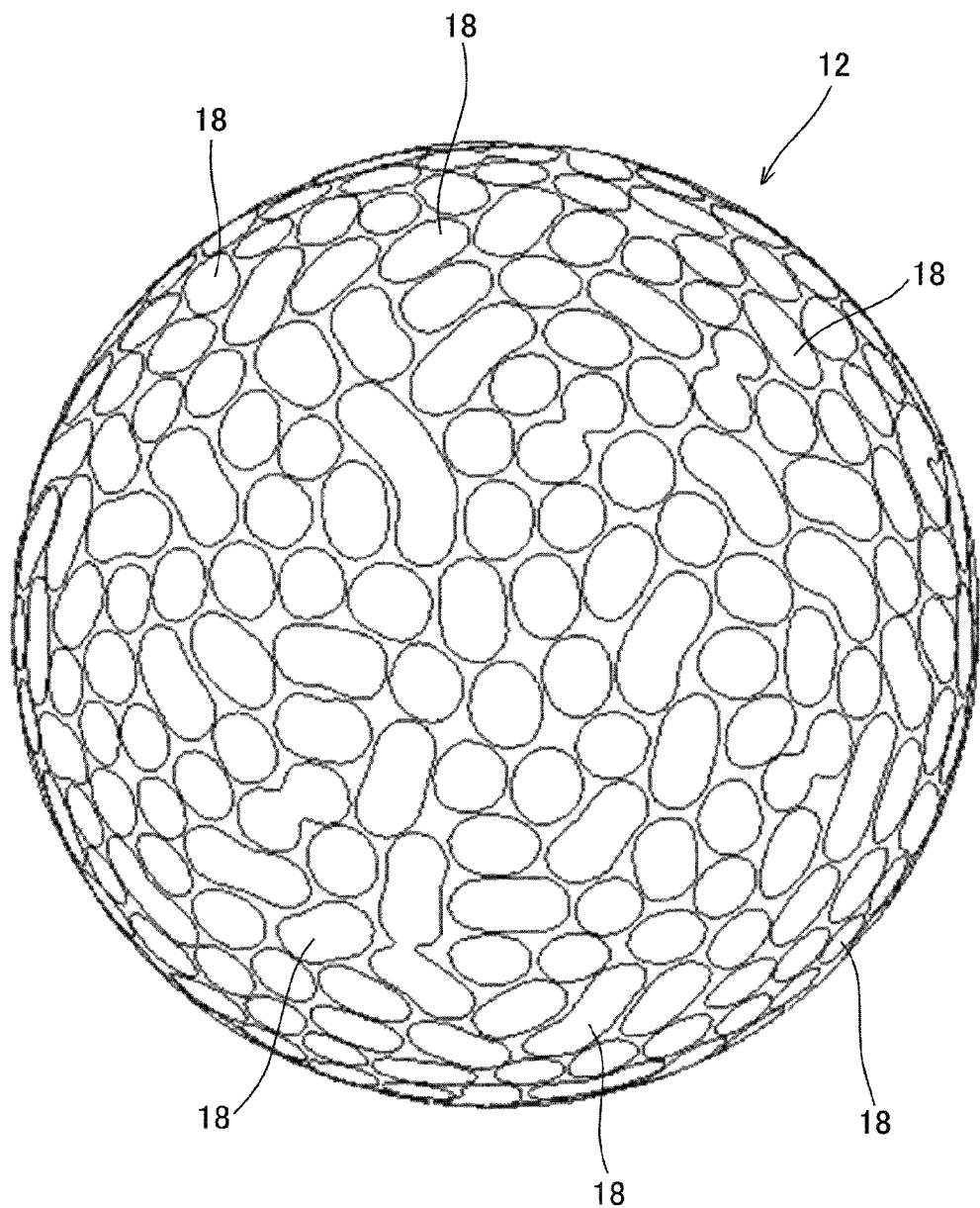
FIG. 5 is a front view of a golf ball having craters.
Figure 6:
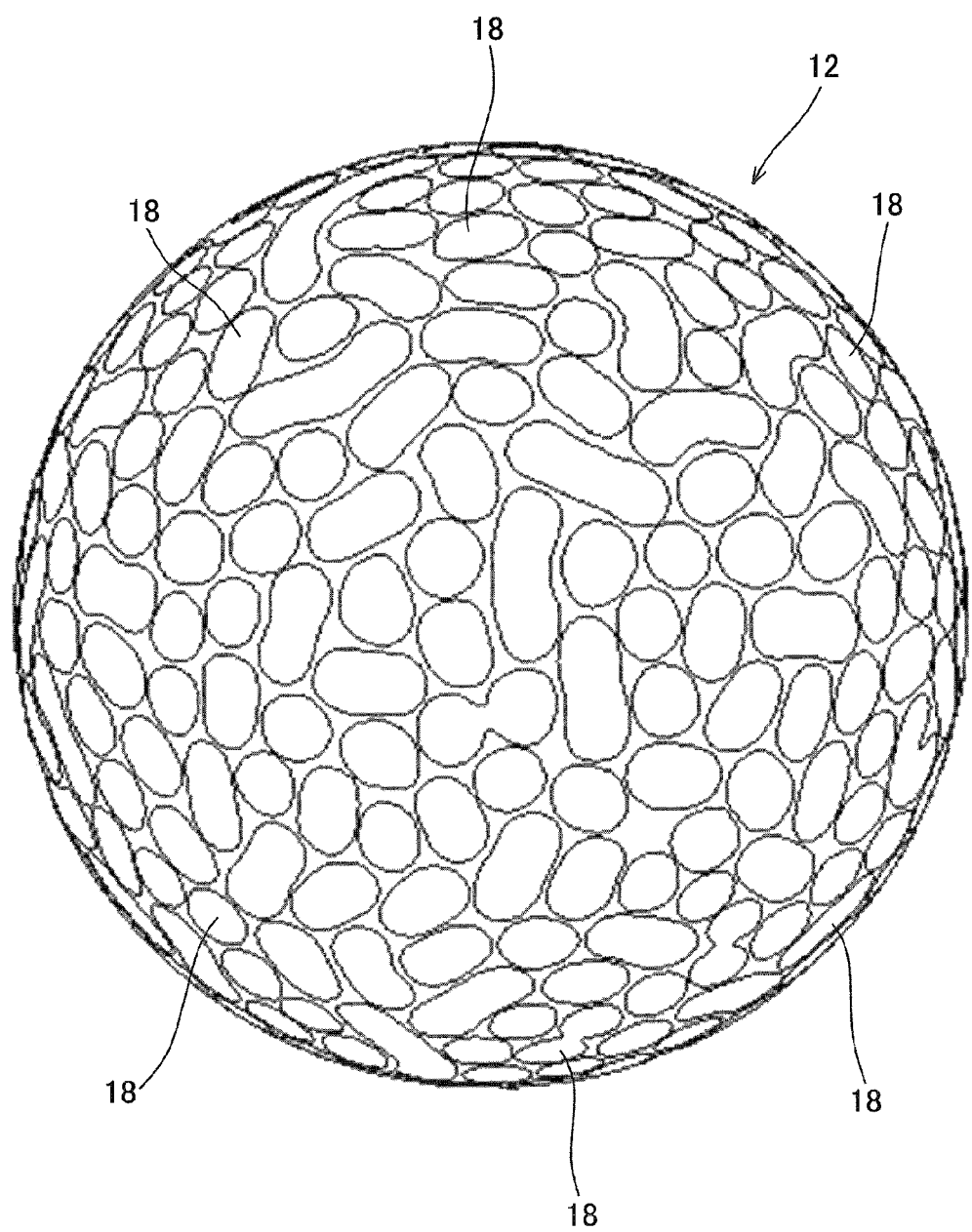
FIG. 6 is a plan view of the golf ball in FIG. 5.

As shown in FIGS. 5 and 6, a large number of craters 18 are assumed on the surface of the phantom sphere 12 based on these cells. A pattern of the craters 18 shown in FIGS. 5 and 6 is the same as the pattern shown in FIGS. 20 and 21 of JP2003-9906. The pattern can be obtained by the Cellular Automaton method disclosed in the above publication. In the present embodiment, the number of the craters 18 is 391.

Figure 7:
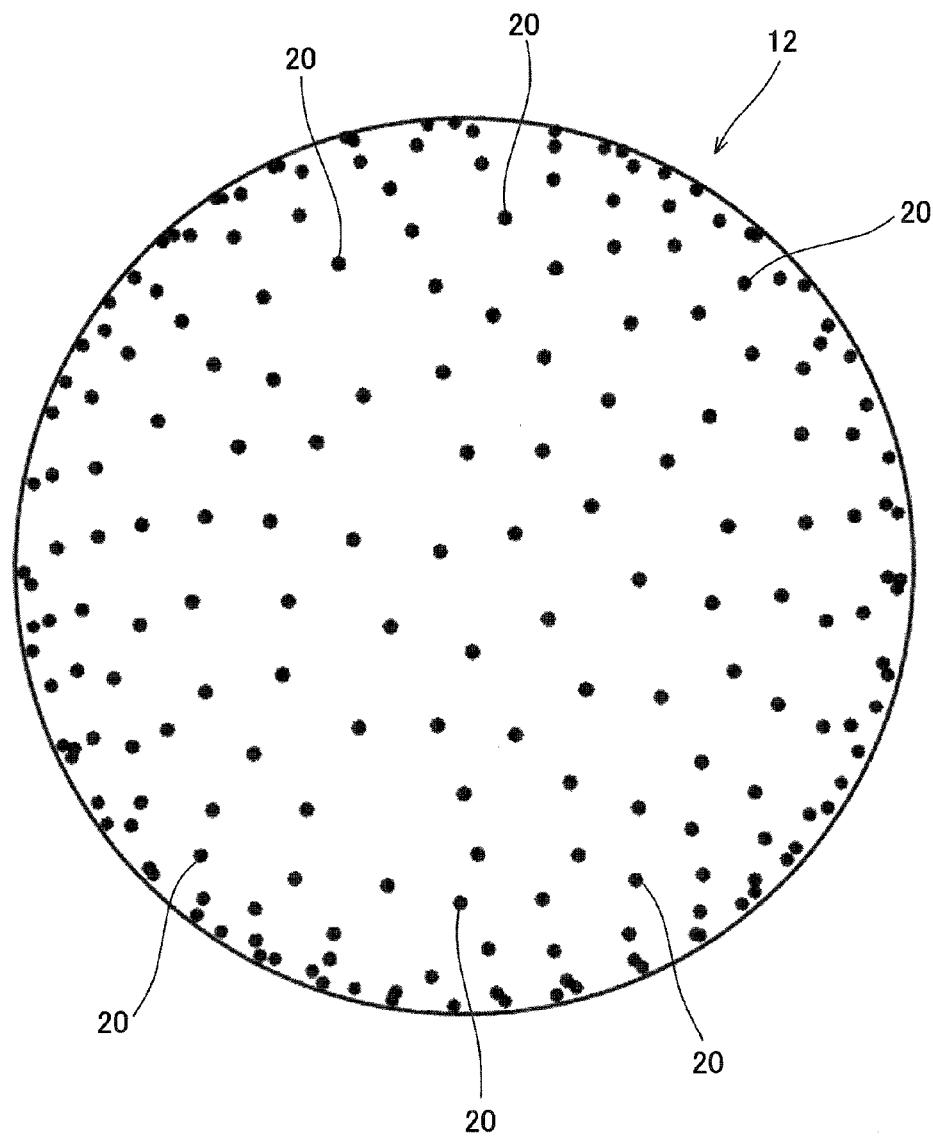
FIG. 7 is a front view showing generating points of the craters of the golf ball in FIG. 5.
Figure 8:
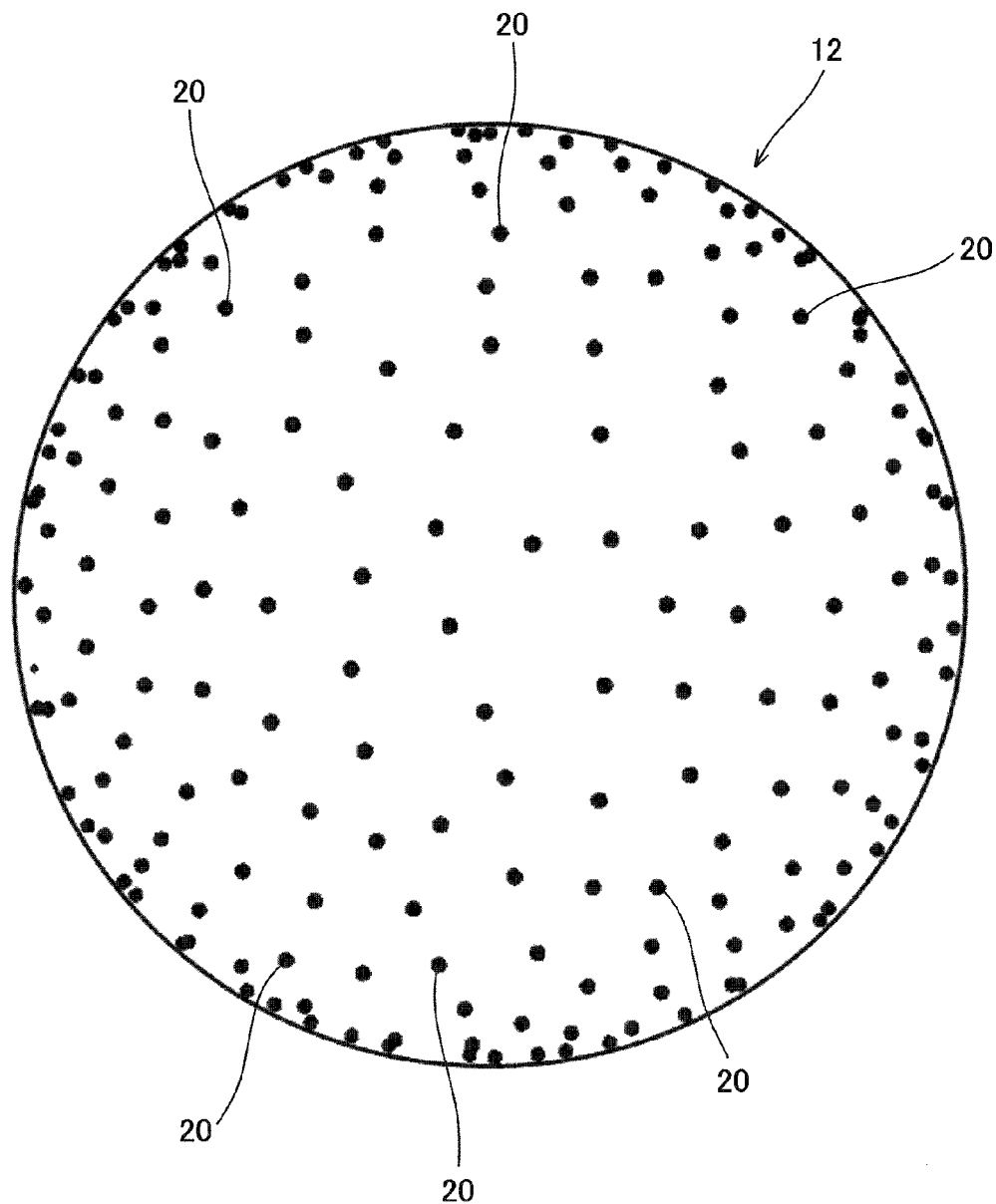
FIG. 8 is a plan view showing the generating points of the craters of the golf ball in FIG. 7.

A large number of generating points are assumed on the surface of the phantom sphere 12 based on the positions of these craters 18 (STEP 1). In the present embodiment, a coordinate of a reference point is obtained by averaging coordinates of cells on the contour of each crater 18. A point obtained by projecting the reference point onto the surface of the phantom sphere 12 is a generating point. This projection is performed by light emitted from the center of the phantom sphere 12. FIGS. 7 and 8 show these generating points 20. In the present embodiment, since the number of the craters 18 is 391, the number of the generating points 20 is 391.

Figure 9:
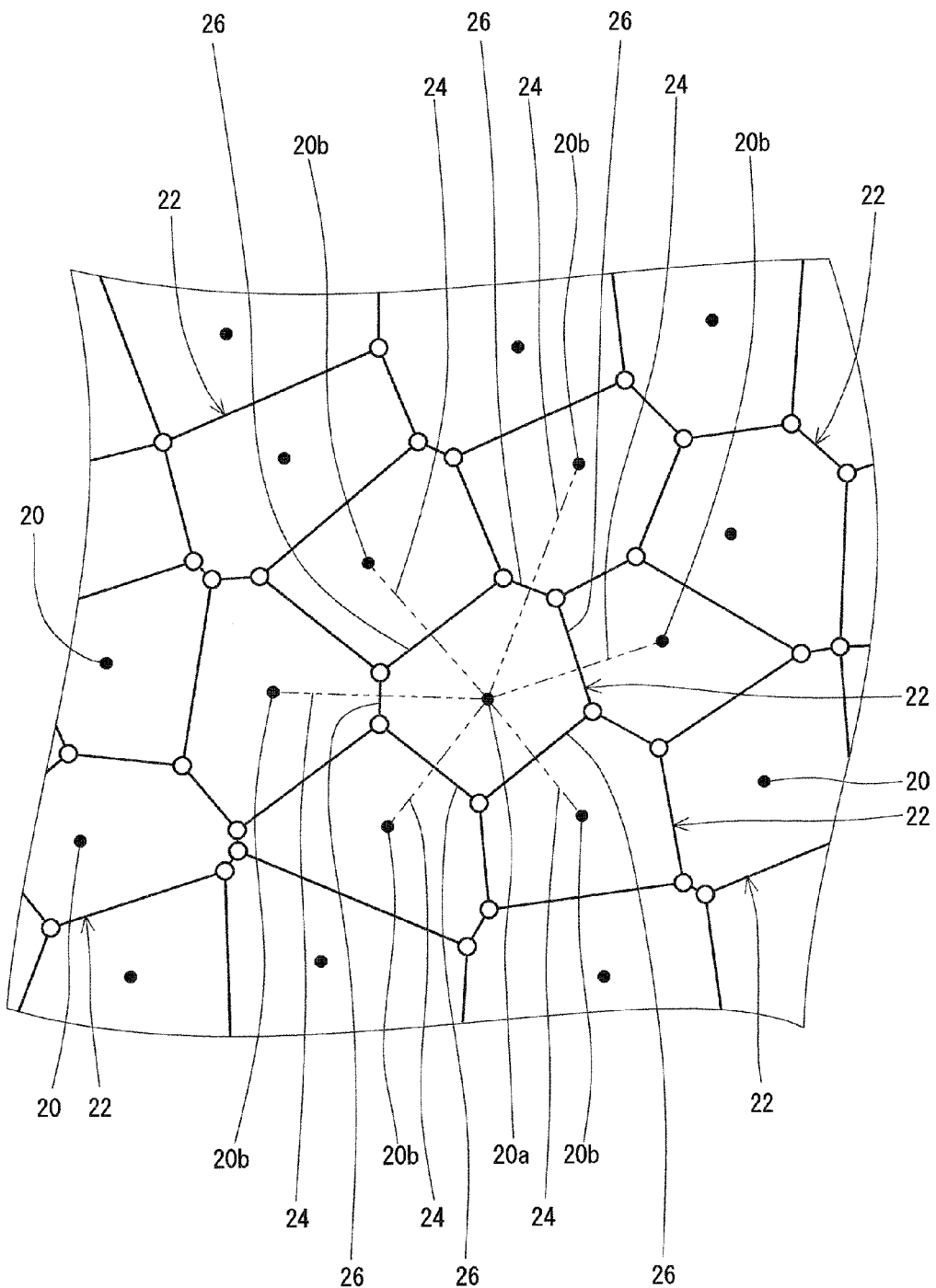
FIG. 9 is an enlarged view showing the generating points in FIGS. 7 and 8 together with Voronoi regions.

A large number of Voronoi regions are assumed based on these generating points 20 (STEP 2). FIG. 9 shows the Voronoi regions 22. In FIG. 9, a generating point 20a is adjacent to six generating points 20b. Each reference sign 24 indicates a line segment connecting the generating point 20a to the generating point 20b. FIG. 9 shows six line segments 24. Each reference sign 26 indicates the perpendicular bisector of each line segment 24. The generating point 20a is surrounded by six perpendicular bisectors 26. In FIG. 9, each outline circle indicates the intersection point between a perpendicular bisector 26 and another perpendicular bisector 26. A point obtained by projecting the intersection point onto the surface of the phantom sphere 12 is a vertex of a spherical polygon (e.g., a spherical hexagon). This projection is performed by light emitted from the center of the phantom sphere 12. The spherical polygon is a Voronoi region 22. The surface of the phantom sphere 12 is divided into a large number of the Voronoi regions 22. The method for the division is referred to as a Voronoi tessellation. In the present embodiment, since the number of the generating points 20 is 391, the number of the Voronoi regions 22 is 391.

Calculation for defining the contour of each Voronoi region 22 based on the perpendicular bisectors 26 is complicated. The following will describe a method for simply obtaining Voronoi regions 22. In this method, the distances between each cell in the mesh shown in FIG. 4 and all the generating points 20 are calculated. For each cell, distances the number of which is the same as the number of the generating points 20 are calculated. The shortest distance is selected from among these distances. The cell is associated with the generating point 20 on which the shortest distance is based. In other words, the generating point 20 that is closest to the cell is selected. It is noted that calculation of the distances between the cell and the generating points 20 whose distances from the cell are obviously large may be omitted.

Figure 10:
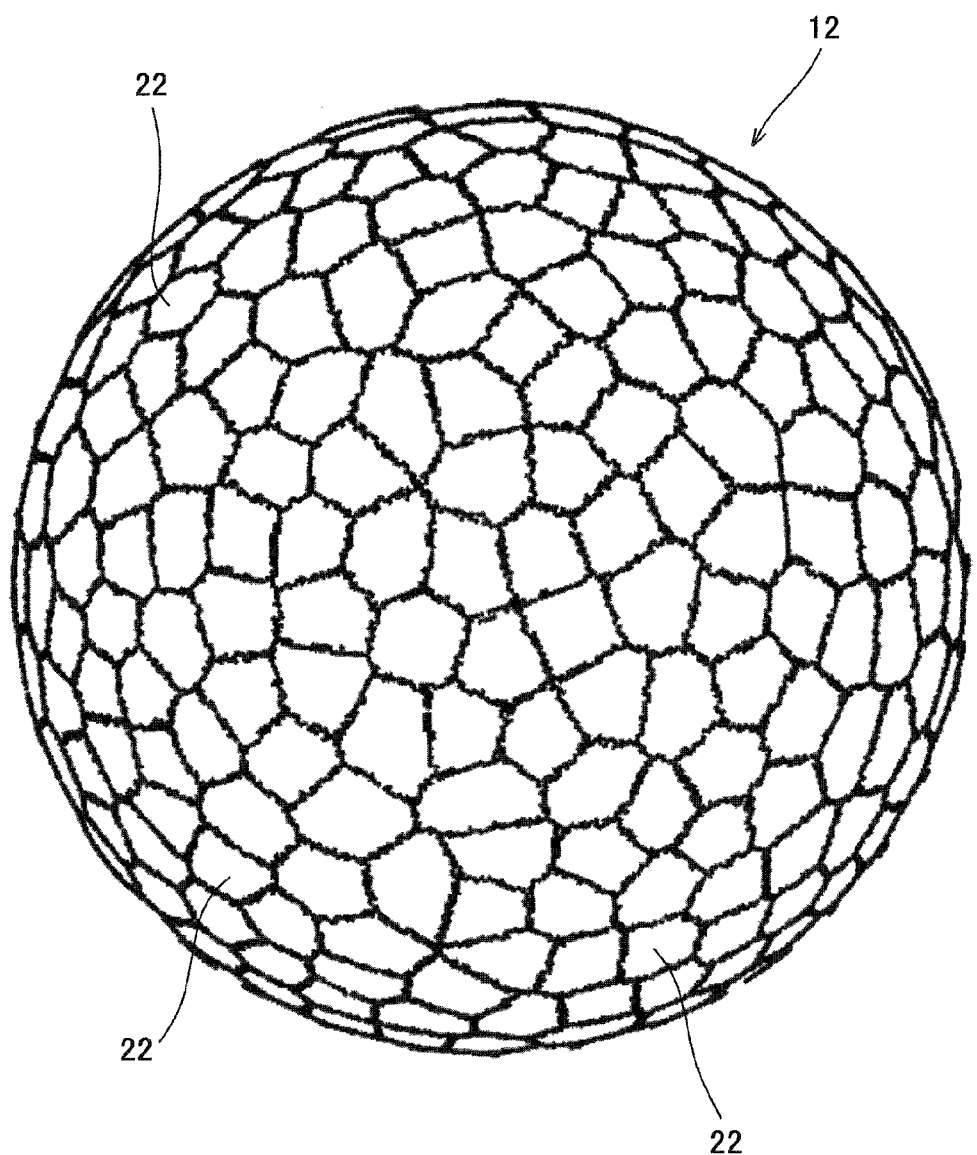
FIG. 10 is a front view of a pattern of Voronoi regions obtained based on the craters in FIG. 8.
Figure 11:
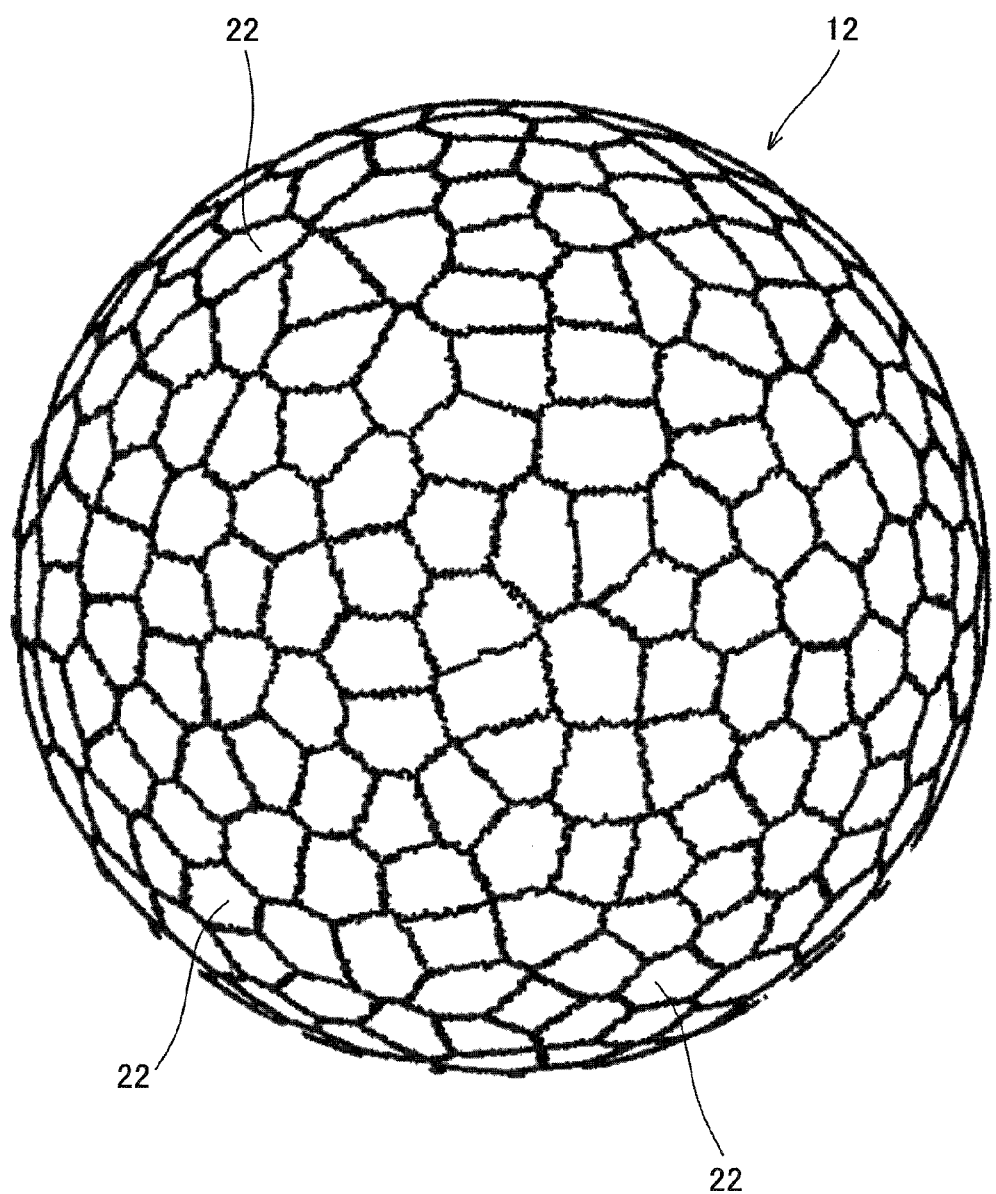
FIG. 11 is a plan view of the pattern in FIG. 10.

For each generating point 20, a set of cells associated with the generating point 20 is assumed. In other words, a set of cells for which this generating point 20 is the closest generating point 20 is assumed. The set is set as a Voronoi region 22. A large number of the Voronoi regions 22 obtained thus are shown in FIGS. 10 and 11. In FIGS. 10 and 11, when another cell adjacent to a certain cell belongs to a Voronoi region 22 different from a Voronoi region 22 to which the certain cell belongs, the certain cell is filled with black.

As is obvious from FIGS. 10 and 11, the contour of each Voronoi region 22 is a zigzag contour. This contour is subjected to smoothing or the like. Typical smoothing is moving averaging. Smoothing by three-point moving average, five-point moving average, seven-point moving average, or the like can be used.

In the three-point moving average, coordinates of the following three cells are averaged:
(1) a cell;
(2) a cell that is closest to the cell in a clockwise direction; and
(3) a cell that is closest to the cell in a counterclockwise direction.

In the five-point moving average, coordinates of the following five cells are averaged:
(1) a cell;
(2) a cell that is closest to the cell in the clockwise direction;
(3) a cell that is closest to the cell in the counterclockwise direction;
(4) a cell that is second closest to the cell in the clockwise direction; and
(5) a cell that is second closest to the cell in the counterclockwise direction.

In the seven-point moving average, coordinates of the following seven cells are averaged:
(1) a cell;
(2) a cell that is closest to the cell in the clockwise direction;
(3) a cell that is closest to the cell in the counterclockwise direction;
(4) a cell that is second closest to the cell in the clockwise direction;
(5) a cell that is second closest to the cell in the counterclockwise direction;
(6) a cell that is third closest to the cell in the clockwise direction; and
(7) a cell that is third closest to the cell in the counterclockwise direction.

A plurality of points having the coordinates obtained by the moving average are connected to each other by a spline curve. A loop is obtained by the spline curve. When forming a loop, some of the points may be removed, and a spline curve may be drawn. The loop may be enlarged or reduced in size to obtain a new loop. In the present invention, this loop is also referred to as a Voronoi region 22. In this manner, a pattern of Voronoi regions 22 shown in FIGS. 12 and 13 is obtained.

Figure 12:
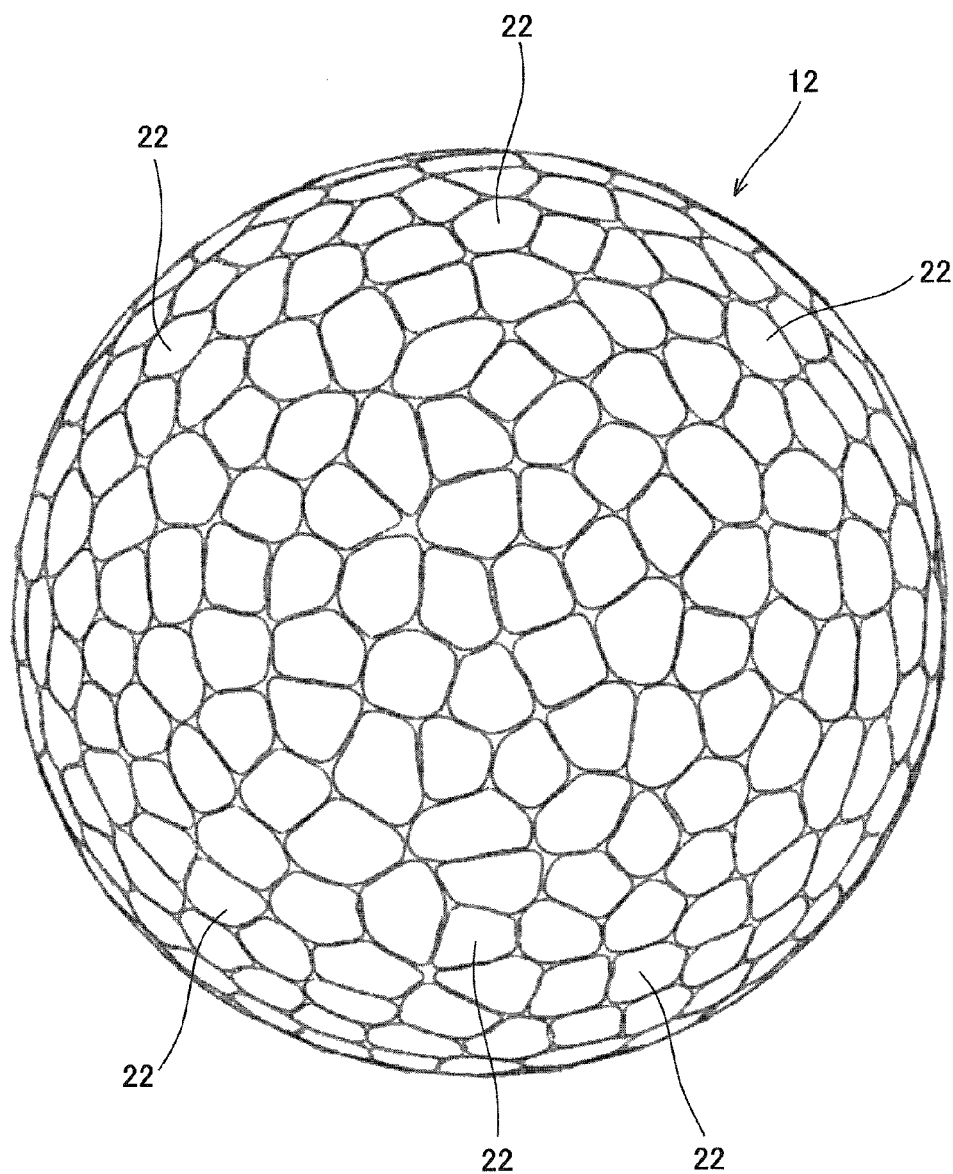
FIG. 12 is a front view of a pattern obtained by performing smoothing on the pattern in FIG. 10.
Figure 13:
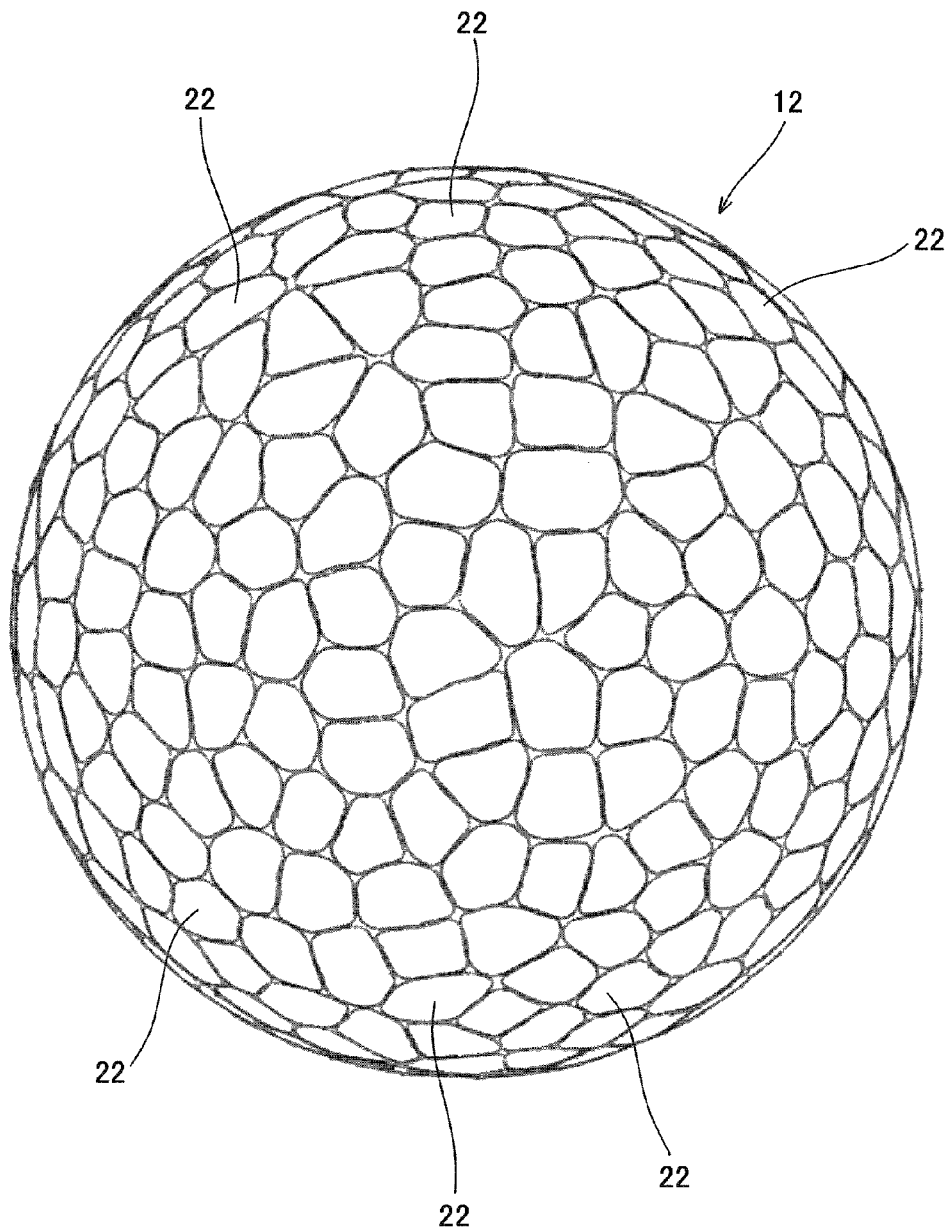
FIG. 13 is a plan view of the pattern in FIG. 12.
Figure 14:
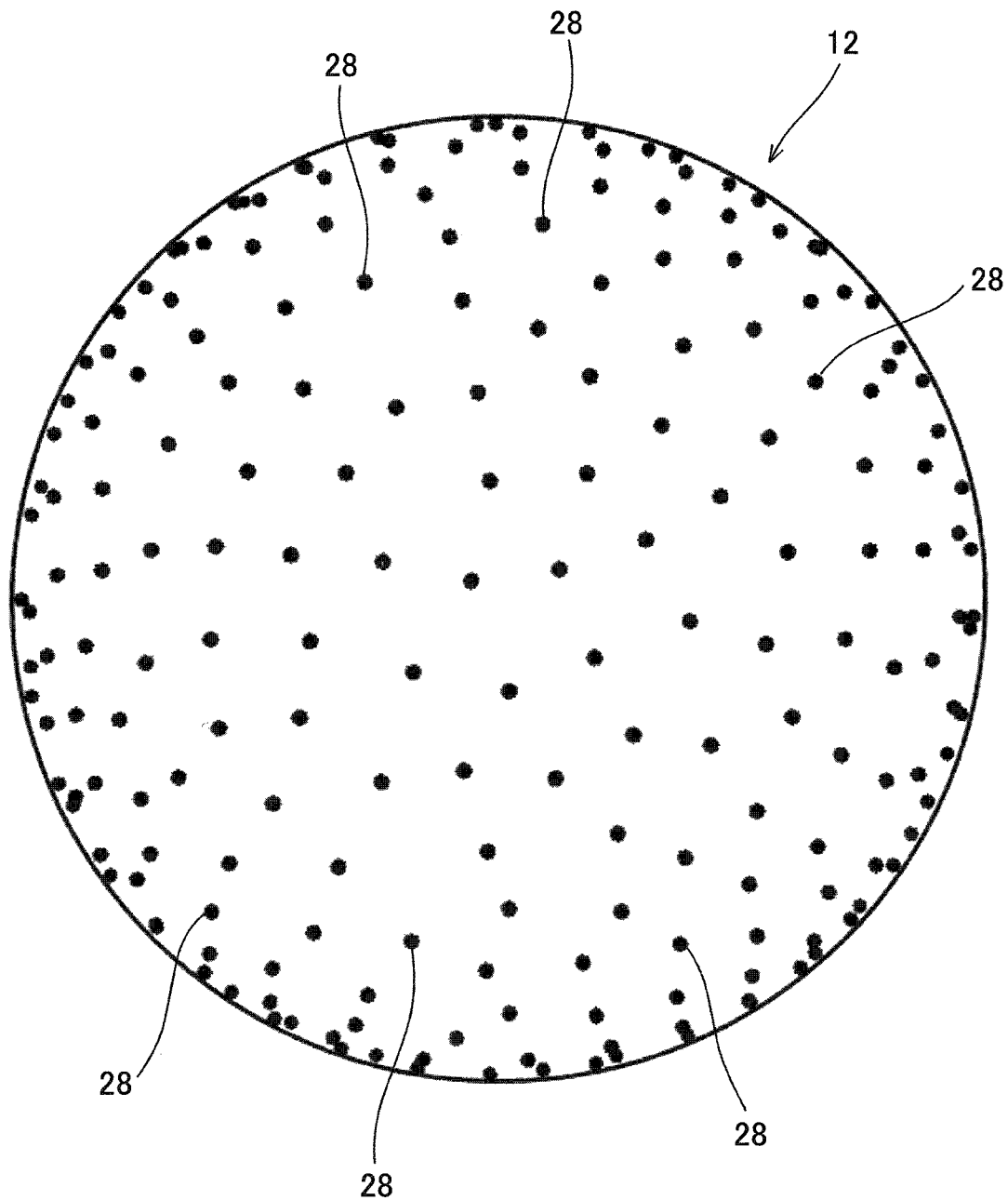
FIG. 14 is a front view showing generating points for the pattern in FIG. 12.
Figure 15:
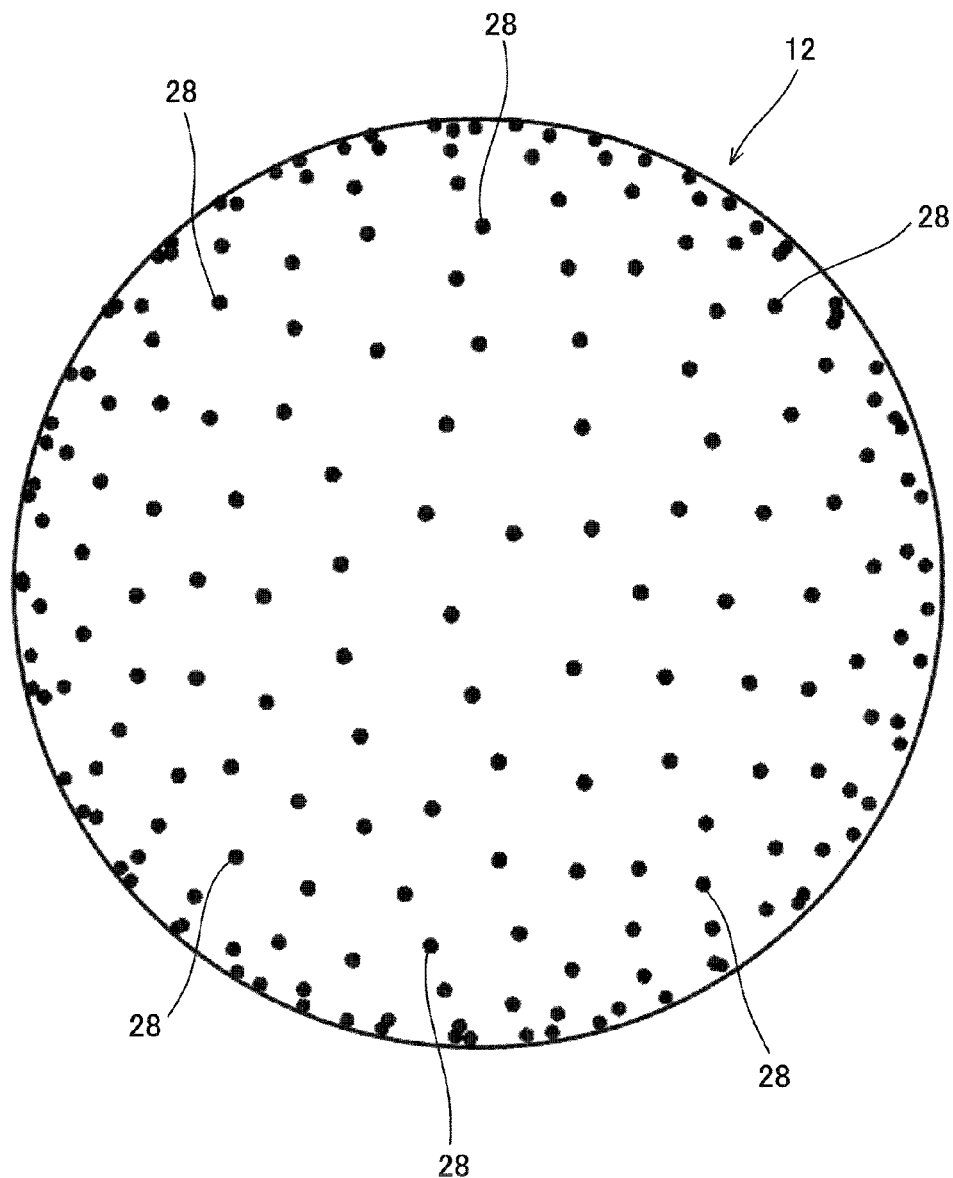
FIG. 15 is a plan view showing generating points for the pattern in FIG. 13.

The center of gravity of each of the Voronoi regions 22 shown in FIGS. 12 and 13 is calculated (STEP 3). The center of gravity is a new generating point 28. A large number of generating points 28 are shown in FIGS. 14 and 15. The centers of gravity of the Voronoi regions 22 shown in FIGS. 10 and 11 may be regarded as new generating points 28.

A large number of new Voronoi regions are assumed on the phantom sphere 12 by a Voronoi tessellation based on these new generating points 28 (STEP 4). The contours of the Voronoi regions may be subjected to smoothing or the like.

Figure 16:
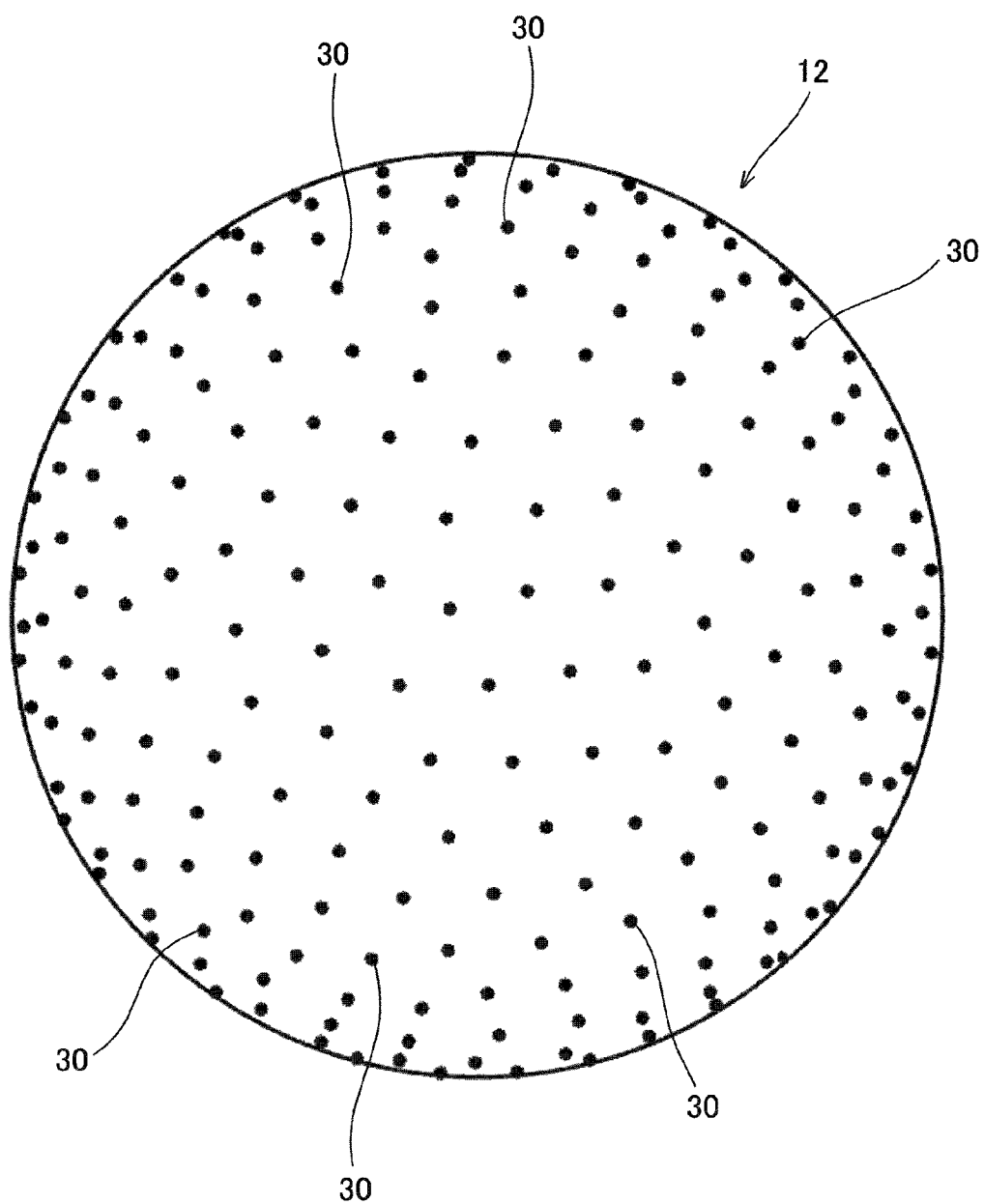
FIG. 16 is a front view showing generating points of Voronoi regions of the golf ball in FIG. 2.
Figure 17:
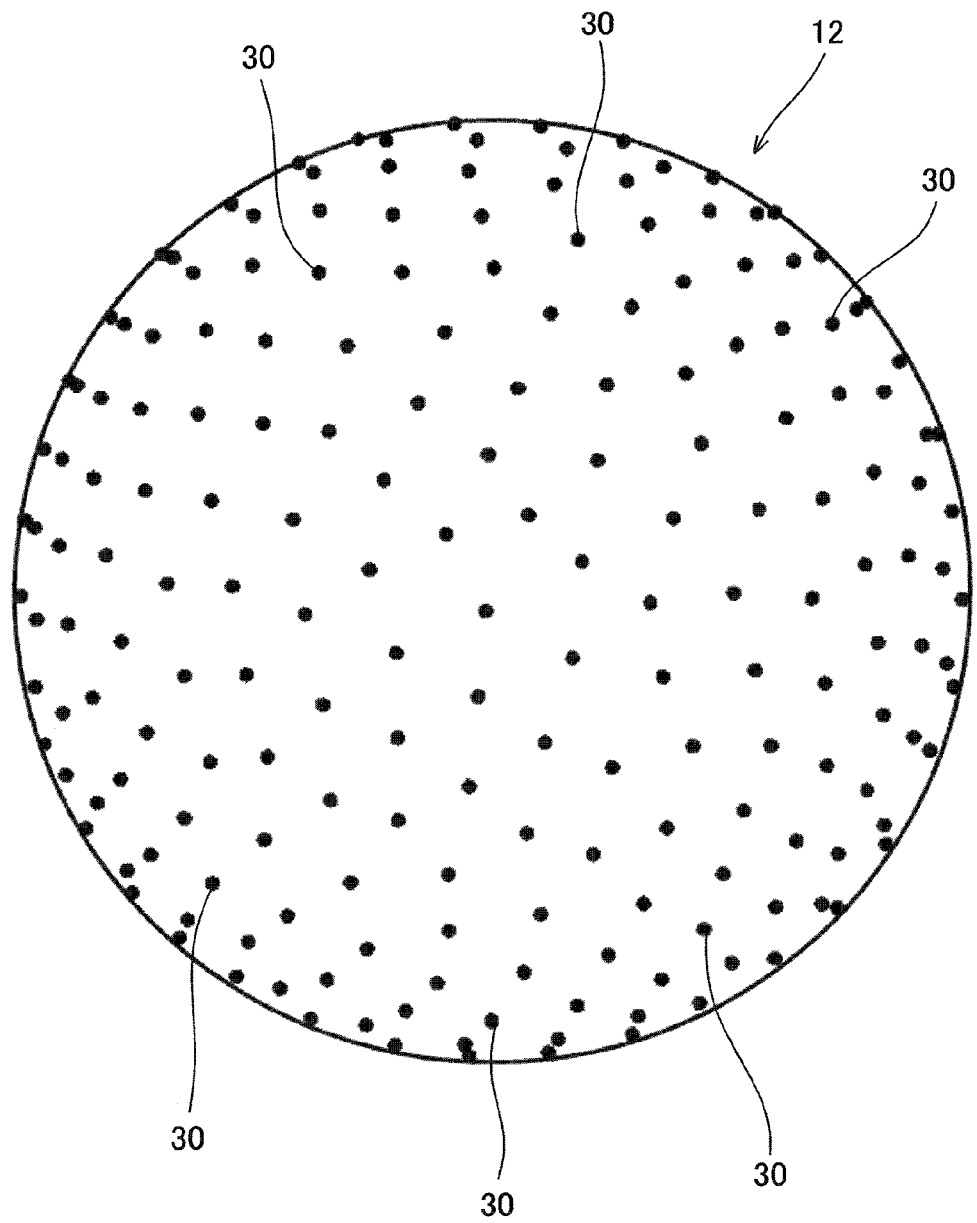
FIG. 17 is a plan view showing the generating points of the Voronoi regions of the golf ball in FIG. 3.

Decision of generating points (STEP 3) and assumption of Voronoi regions (STEP 4) are repeated. Loops obtained when the number of times n of the repetition is 30 are shown in FIGS. 2 and 3. The loops are Voronoi regions and are the dimples 8. In addition, the centers of gravity 30 of these Voronoi regions are shown in FIGS. 16 and 17.

The land 10 is assigned to the outside of each loop. In other words, the land 10 is assigned to the vicinity of the contour of each Voronoi region. Meanwhile, the dimple 8 is assigned to the inside of each loop or onto each loop.

In the pattern shown in FIGS. 2 and 3, variations of the sizes of the Voronoi regions are small as compared to the pattern shown in FIGS. 12 and 13. The golf ball 2 having the pattern shown in FIGS. 2 and 3 has excellent flight performance. The reason for this is that all the dimples 8 exert a sufficient dimple effect.

In light of flight performance of the golf ball 2, the occupation ratio of the dimples 8 is preferably equal to or greater than 85%, more preferably equal to or greater than 90%, and particularly preferably equal to or greater than 92%. In light of durability of the golf ball 2, the occupation ratio is preferably equal to or less than 98%. Use of the Voronoi tessellation can achieve a high occupation ratio even when no small dimple 8 is arranged.

As is obvious from FIGS. 2 and 3, the dimples 8 are not orderly arranged in the golf ball 2. The golf ball 2 has a large number of types of dimples 8 whose contour shapes are different from each other. These dimples 8 achieve a superior dimple effect. The number of the types of the dimples 8 is preferably equal to or greater than 50 and particularly preferably equal to or greater than 100. In the present embodiment, each dimple 8 has a contour shape different from those of any other dimples 8.

In light of suppression of rising of the golf ball 2 during flight, each dimple 8 has a depth of preferably 0.05 mm or greater, more preferably 0.08 mm or greater, and particularly preferably 0.10 mm or greater. In light of suppression of dropping of the golf ball 2 during flight, the depth is preferably equal to or less than 0.60 mm, more preferably equal to or less than 0.45 mm, and particularly preferably equal to or less than 0.40 mm. The depth is the distance between the deepest point of the dimple 8 and the surface of the phantom sphere 12.

In the present invention, the term "dimple volume" means the volume of a part surrounded by the surface of the phantom sphere 12 and the surface of the dimple 8. In light of suppression of rising of the golf ball 2 during flight, the sum of the volumes (total volume) of all the dimples 8 is preferably equal to or greater than 500 mm³, more preferably equal to or greater than 550 mm³, and particularly preferably equal to or greater than 600 mm³. In light of suppression of dropping of the golf ball 2 during flight, the sum is preferably equal to or less than 900 mm³, more preferably equal to or less than 850 mm³, and particularly preferably equal to or less than 800 mm³.

From the standpoint that a fundamental feature of the golf ball 2 being substantially a sphere is not impaired, the total number of the dimples 8 is preferably equal to or greater than 100, more preferably equal to or greater than 250, more preferably equal to or greater than 280, and particularly preferably equal to or greater than 310. From the standpoint that each dimple 8 can contribute to the dimple effect, the total number is preferably equal to or less than 600, more preferably equal to or less than 500, more preferably equal to or less than 450, and particularly preferably equal to or less than 400.

Figure 18:
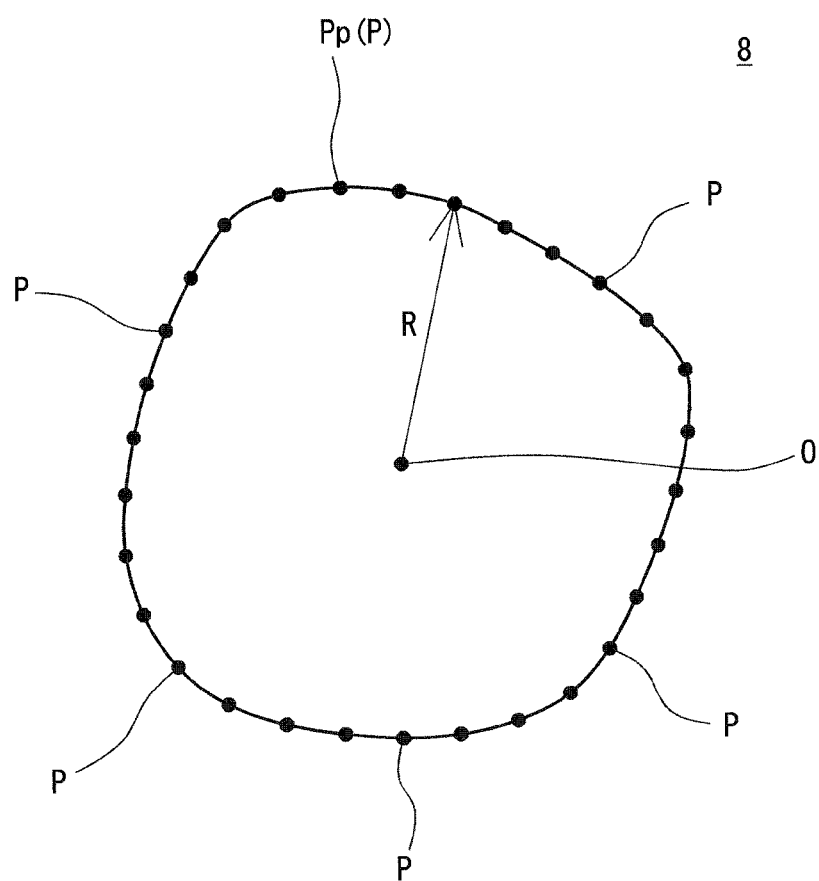
FIG. 18 is an enlarged view of a dimple of the golf ball in FIG. 2.

The golf ball 2 has dimples 8 having a radius variation range Rh of 0.4 mm or greater. A method for calculating a radius variation range Rh is shown in FIG. 18. In this method, 30 points P are assumed on the contour of the dimple 8 such that the length of the contour is divided into 30 equal parts. These points P include a point Pp that is located on the contour of the dimple 8 and closest to a pole. A coordinate of a center O is decided by averaging coordinates of the 30 points P.

Figure 19:
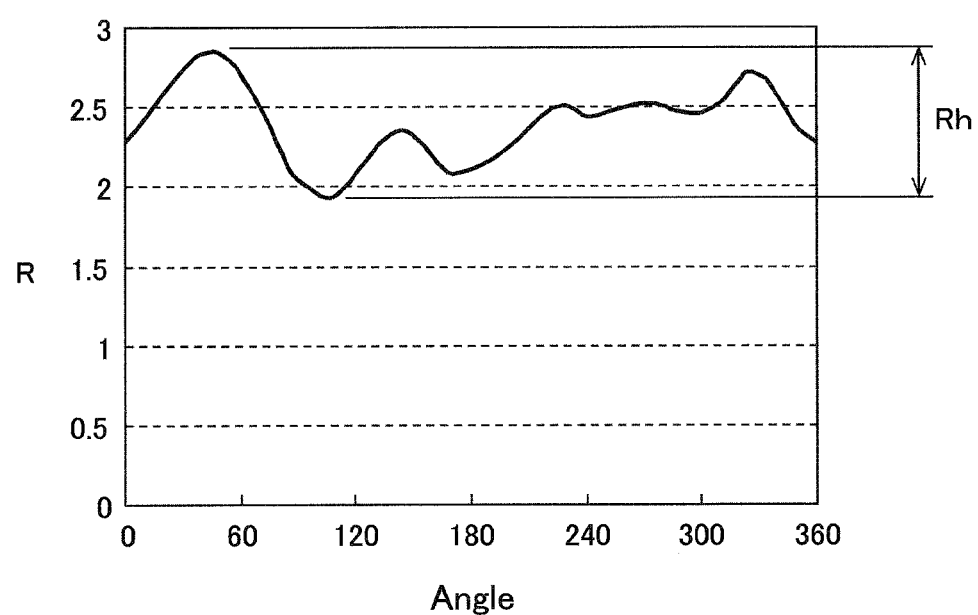
FIG. 19 is a graph for explaining a method for calculating a radius variation range of the dimple in FIG. 18.

After the coordinate of the center O is decided, the distance between the center O and the point P (i.e., a radius R) is calculated. For each point P, the radius R is calculated. FIG. 19 is a graph in which the radius R is plotted. The horizontal axis of the graph indicates an angle of a line connecting the center O to each point P, relative to a longitude direction. As shown in the graph, a value obtained by subtracting the minimum value of the radius R from the maximum value of the radius R is the radius variation range Rh. The radius variation range Rh is an index indicating distortion of the dimple 8.

In the golf ball 2 having the dimples 8 having a radius variation range Rh of 0.4 mm or greater, the dimples 8 are not orderly arranged. The golf ball 2 has excellent flight performance. The ratio P1 of the number of the dimples 8 having a radius variation range Rh of 0.4 mm or greater relative to the total number of the dimples 8 is preferably equal to or greater than 30%, more preferably equal to or greater than 50%, and particularly preferably equal to or greater than 70%. The ratio P1 is ideally 100%.

As is obvious from FIG. 19, the variation of the radius R of the dimple 8 is not periodic. In the golf ball 2, the dimples 8 are not orderly arranged. The golf ball 2 has excellent flight performance.

In light of flight performance, the difference between the radius variation range Rhmax of the dimple 8 having a maximum radius variation range Rh and the radius variation range Rhmin of the dimple 8 having a minimum radius variation range Rh is preferably equal to or greater than 0.1 mm, more preferably equal to or greater than 0.3 mm, and particularly preferably equal to or greater than 0.5 mm.

In light of flight performance, the standard deviation σRh of the radius variation ranges Rh of all the dimples 8 is preferably equal to or greater than 0.10 and particularly preferably equal to or greater than 0.13.

The golf ball 2 has dimples 8 that meet the following mathematical formula (I).

$$Rh/Rave \geq 0.25 \quad (I)$$

In this mathematical formula, Rh represents a radius variation range, and Rave represents an average radius. Rave is the average of the radii R at 30 points P.

In the golf ball 2 that meets the above mathematical formula (I), the dimples 8 are not orderly arranged. The golf ball 2 has excellent flight performance. The ratio P2 of the number of the dimples 8 that meet the above mathematical formula (I), relative to the total number of the dimples 8, is preferably equal to or greater than 10%, more preferably equal to or greater than 20%, and particularly preferably equal to or greater than 30%. The ratio P2 is ideally 100%.

In light of flight performance, the radius variation range Rhmax of the dimple 8 having a maximum radius variation range Rh is preferably equal to or greater than 0.70 mm and particularly preferably equal to or greater than 0.80 mm. The radius variation range Rhmax is preferably equal to or less than 1.80 mm.

In light of flight performance, the radius variation range Rhmin of the dimple 8 having a minimum radius variation range Rh is preferably equal to or greater than 0.10 mm and particularly preferably equal to or greater than 0.25 mm. The radius variation range Rhmin is preferably equal to or less than 0.40 mm.

In light of flight performance, the standard deviation σD of the average diameters D of all the dimples 8 is preferably equal to or less than 0.20 mm and particularly preferably equal to or less than 0.15 mm.

In light of flight performance, the ratio of the standard deviation σD of the average diameters D of all the dimples 8 relative to the average AveRave of the average radii Rave of all the dimples 8 is preferably equal to or less than 10% and particularly preferably equal to or less than 7%. The average diameter D is twice the average radius Rave.

In light of flight performance, the standard deviation σA of the areas of all the dimples 8 is preferably equal to or less than 1.40 mm² and particularly preferably equal to or less than 1.30 mm².

In light of flight performance, the ratio of the standard deviation σA of the areas of all the dimples 8 relative to the average area Aave of all the dimples 8 is preferably equal to or less than 10%, more preferably equal to or less than 9%, and particularly preferably equal to or less than 7%. In the present invention, the area of the dimple 8 means the area of a portion of the surface of the phantom sphere 12. The portion is surrounded by the contour of the dimple 8.

In the designing process according to the present invention, Voronoi regions are decided based on original centers of gravity, and new centers of gravity are decided based on the Voronoi regions. The position of each new center of gravity can be different from the position of the original center of gravity. The distance between the position of the original center of gravity and the position of a new center of gravity obtained when the number of times of the repetition of the decision of generating points (STEP 3) and the assumption of Voronoi regions (STEP 4) is n represented by L(n). A Voronoi region having a maximum distance L(n) is decided among all Voronoi regions obtained when the number of times of the repetition is n. The distance L(n) of this Voronoi region is referred to as "maximum value Lmax(n)".

Figure 20:
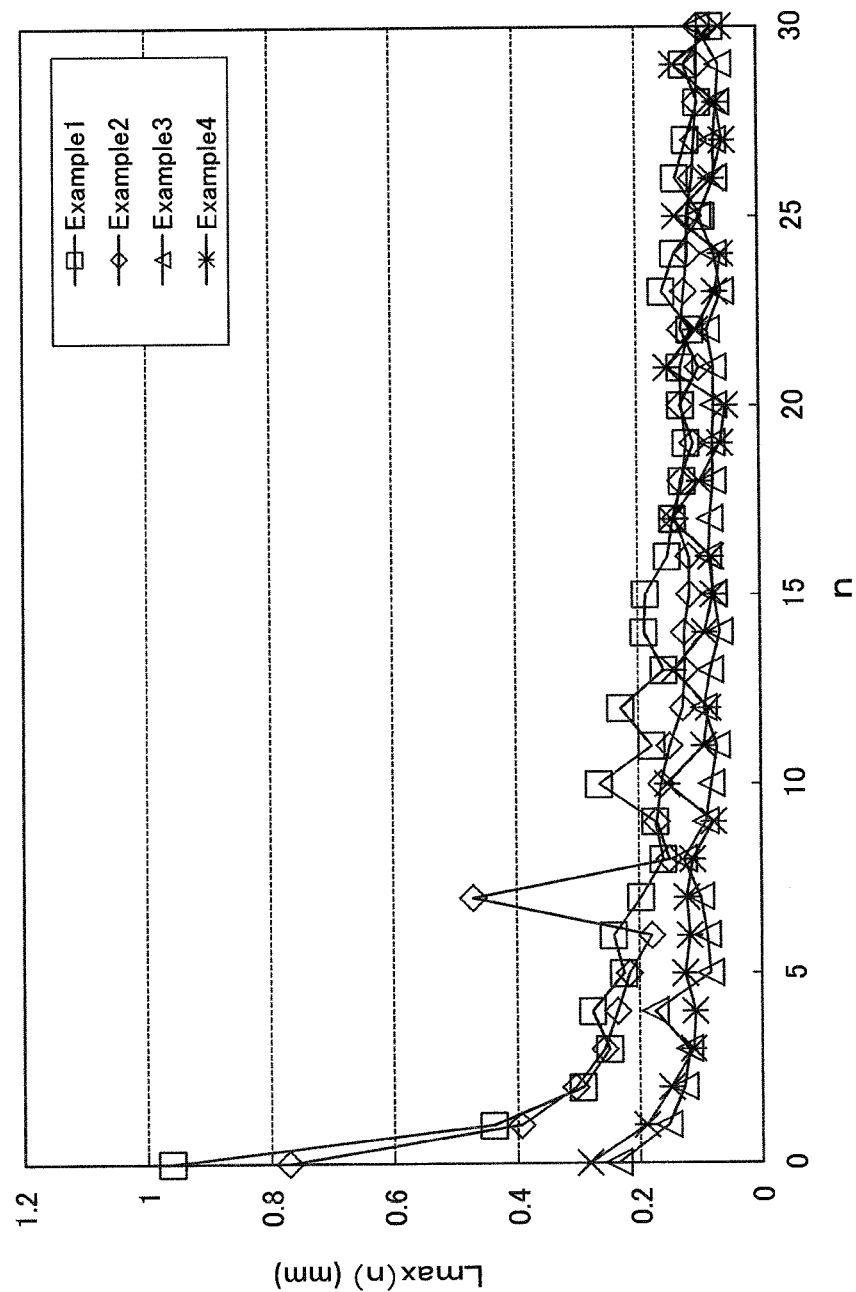
FIG. 20 is a graph showing a maximum value Lmax(n)

FIG. 20 is a graph showing the maximum value Lmax(n). In the graph, the vertical axis indicates the maximum value Lmax(n), and the horizontal axis indicates the number of times n of the repetition. In the graph, the maximum values Lmax(n) of golf balls of Examples 1 to 4 described in detail later are plotted. As is obvious from the graph, there is a tendency that the maximum value Lmax(n) decreases as the number of times n increases. The maximum value Lmax(n) converges as the number of times n increases.

Further repetition after the converge is wasted. In light of efficiency, the repetition is stopped when the maximum value Lmax(n) reaches a predetermined value or less. The dimples 8 and the land 10 are assigned based on the contours of Voronoi regions obtained at the time of the stop. Preferably, the repetition is stopped when the maximum value Lmax(n) is equal to or less than 0.2 mm. The repetition may be stopped when the maximum value Lmax(n) is equal to or less than 0.5% of the diameter of the phantom sphere 12.

The repetition may be stopped when the difference (Lmax(n−1)−Lmax(n)) between the maximum value Lmax(n−1) of the distances between the centers of gravity of Voronoi regions obtained when the number of times of the repetition is (n−1) and the centers of gravity of Voronoi regions obtained when the number of times of the repetition is (n−2) and the maximum value Lmax(n) of the distances between the centers of gravity of the Voronoi regions obtained when the number of times of the repetition is n and the centers of gravity of the Voronoi regions obtained when the number of times of the repetition is (n−1) reaches a predetermined value or less. The dimples 8 and the land 10 are assigned to the surface of the phantom sphere 12 based on the contours of the Voronoi regions obtained when the number of times of the repetition is n.

Figure 21:
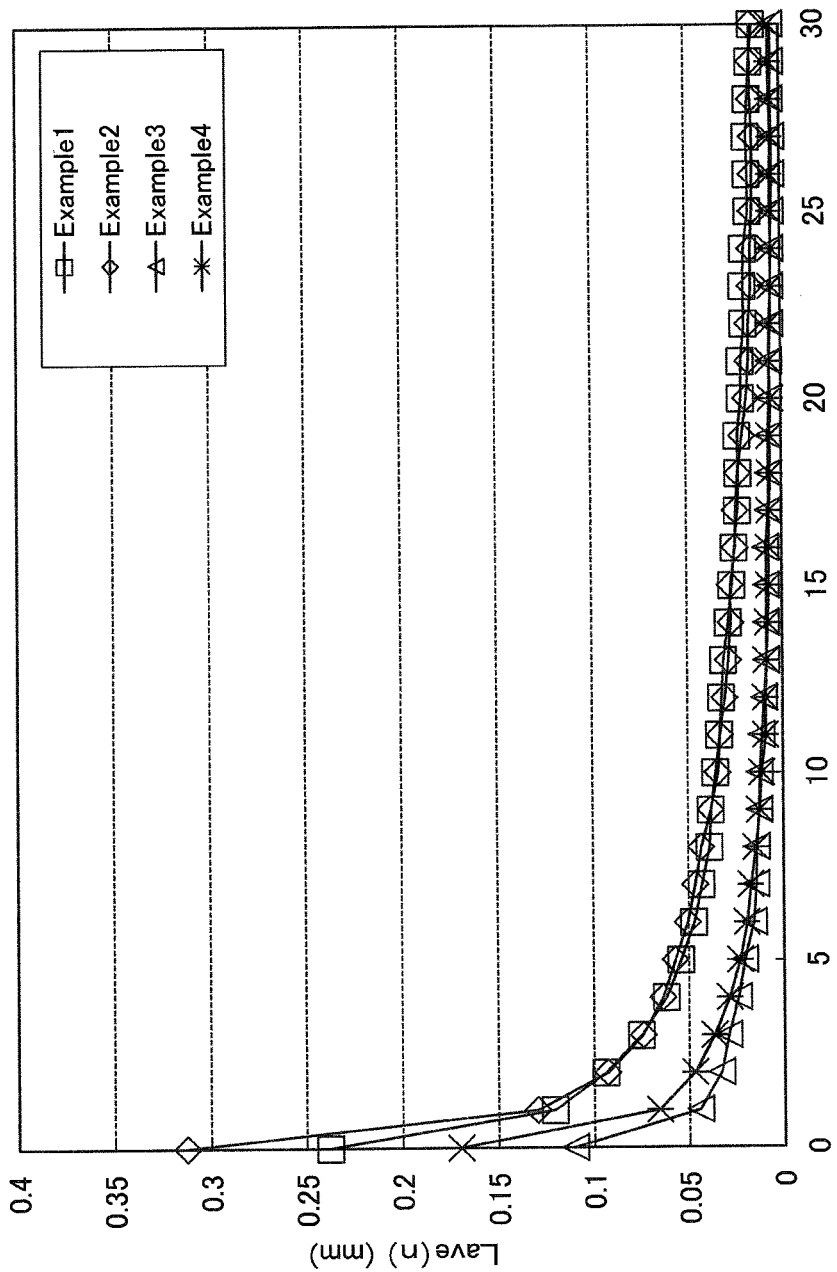
FIG. 21 is a graph showing an average Lave(n) of Voronoi regions.

The average of the distances L(n) of all the Voronoi regions obtained when the number of times of the repetition is n is referred to as "average Lave(n)". FIG. 21 is a graph showing the average Lave(n). In the graph, the vertical axis indicates the average Lave(n), and the horizontal axis indicates the number of times n of the repetition. In the graph, the averages Lave(n) of the golf balls of Examples 1 to 4 described in detail later are plotted. As is obvious from the graph, there is a tendency that the average Lave(n) decreases as the number of times n increases. The average Lave(n) converges as the number of times n increases.

Further repetition after the converge is wasted. In light of efficiency, the repetition is stopped when the average Lave(n) reaches a predetermined value or less. The dimples 8 and the land 10 are assigned based on the contours of Voronoi regions obtained at the time of the stop. Preferably, the repetition is stopped when the average Lave(n) is equal to or less than 0.05 mm. The repetition may be stopped when the average Lave(n) is equal to or less than 0.12% of the diameter of the phantom sphere 12.

The repetition may be stopped when the difference (Lave(n−1)−Lave(n)) between the average Lave(n−1) of the distances between the centers of gravity of the Voronoi regions obtained when the number of times of the repetition is (n−1) and the centers of gravity of the Voronoi regions obtained when the number of times of the repetition is (n−2) and the average Lave(n) of the distances between the centers of gravity of the Voronoi regions obtained when the number of times of the repetition is n and the centers of gravity of the Voronoi regions obtained when the number of times of the repetition is (n−1) is equal to or less than a predetermined value. The dimples 8 and the land 10 are assigned to the surface of the phantom sphere 12 based on the contours of the Voronoi regions obtained when the number of times of the repetition is n. Preferably, the repetition is stopped when the difference (Lave(n−1)−Lave(n)) is equal to or less than 0.01 mm. The repetition may be stopped when the difference (Lave(n−1)−Lave(n)) is equal to or less than 0.02% of the diameter of the phantom sphere 12.

Figure 22:
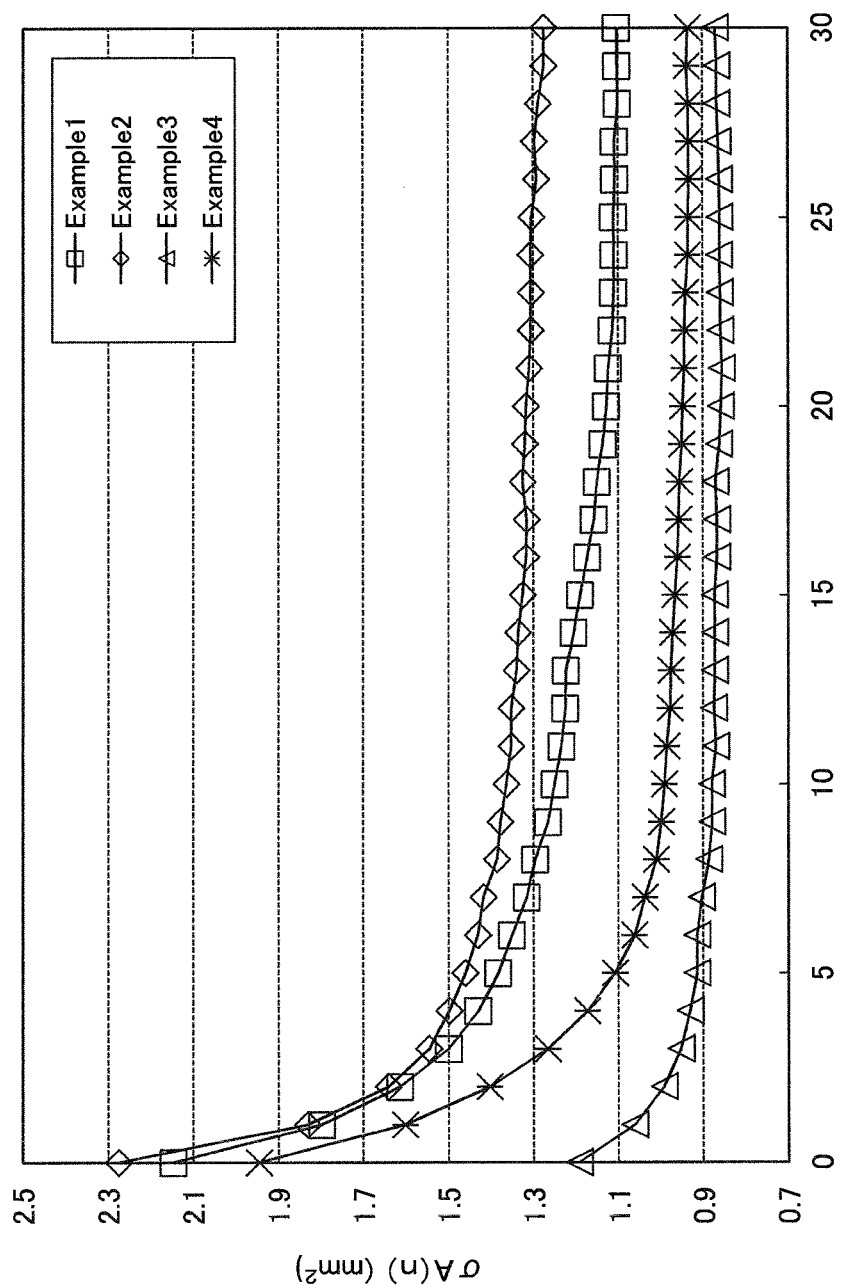
FIG. 22 is a graph showing a standard deviation σA(n) of Voronoi regions.

In the present invention, the area A(n) of the Voronoi region means the area of a portion of the surface of the phantom sphere 12. The portion is surrounded by the contour of the Voronoi region. The standard deviation of the areas A(n) of all the Voronoi regions obtained when the number of times of the repetition is n is represented by σA(n). FIG. 22 is a graph showing the standard deviation σA(n). In the graph, the vertical axis indicates the standard deviation σA(n), and the horizontal axis indicates the number of times n of the repetition. In the graph, the standard deviations σA(n) of the golf balls of Examples 1 to 4 described in detail later are plotted. As is obvious from this graph, there is a tendency that the standard deviation σA(n) decreases as the number of times n increases. The standard deviation σA(n) converges as the number of times n increases.

Further repetition after the converge is wasted. In light of efficiency, the repetition is stopped when the standard deviation σA(n) reaches a predetermined value or less. The dimples 8 and the land 10 are assigned based on the contours of Voronoi regions obtained at the time of the stop. The repetition may be stopped when the ratio of the standard deviation σA(n) to the average area Aave(n) of the Voronoi regions reaches a predetermined value or less. Preferably, the repetition is stopped when the standard deviation σA(n) is equal to or less than 10% of the average area Aave(n) of the Voronoi regions. The repetition may be stopped when the difference (σA(n−1)−σA(n)) between the standard deviation σA(n−1) of the areas A(n−1) of the Voronoi regions obtained when the number of times of the repetition is (n−1) and the standard deviation σA(n) of the areas A(n) of the Voronoi regions obtained when the number of times of the repetition is n is equal to or less than a predetermined value.

A Voronoi region having a maximum area A(n) is decided among all the Voronoi regions obtained when the number of times of the repetition is n. The area A(n) of this Voronoi region is referred to as "maximum value Amax(n)".

Figure 24:
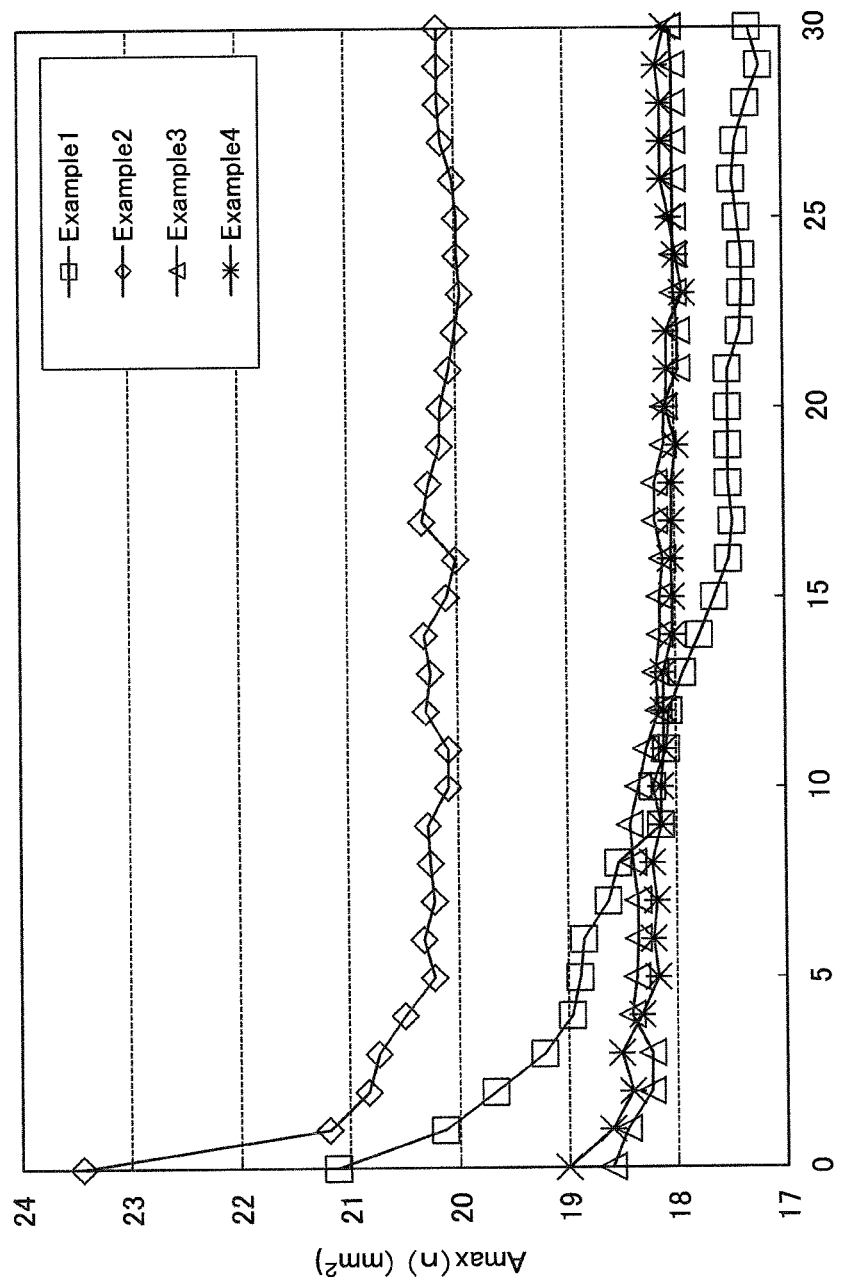
FIG. 24 is a graph showing a maximum value Amax(n) of Voronoi regions.

FIG. 24 is a graph showing the maximum value Amax(n). In the graph, the vertical axis indicates the maximum value Amax(n), and the horizontal axis indicates the number of times n of the repetition. In the graph, the maximum values Amax(n) of the golf balls of Examples 1 to 4 described in detail later are plotted. As is obvious from this graph, there is a tendency that the maximum value Amax(n) decreases as the number of times n increases. The maximum value Amax(n) converges as the number of times n increases.

Further repetition after the converge is wasted. In light of efficiency, the repetition is stopped when the maximum value Amax(n) reaches a predetermined value or less. The dimples 8 and the land 10 are assigned based on the contours of Voronoi regions obtained at the time of the stop. Preferably, the repetition is stopped when the maximum value Amax(n) is equal to or less than a value Y calculated by the following mathematical formula.

$$Y = TA/m * 1.2$$

In the above mathematical formula, TA represents the surface area of the phantom sphere 12, and m represents the total number of Voronoi regions.

The repetition may be stopped when the difference (Amax(n−1)−Amax(n)) between the maximum value Amax(n−1) of the areas of the Voronoi regions obtained when the number of times of the repetition is (n−1) and the maximum value Amax(n) of the areas of the Voronoi regions obtained when the number of times of the repetition is n is equal to or less than a predetermined value.

Figure 23:
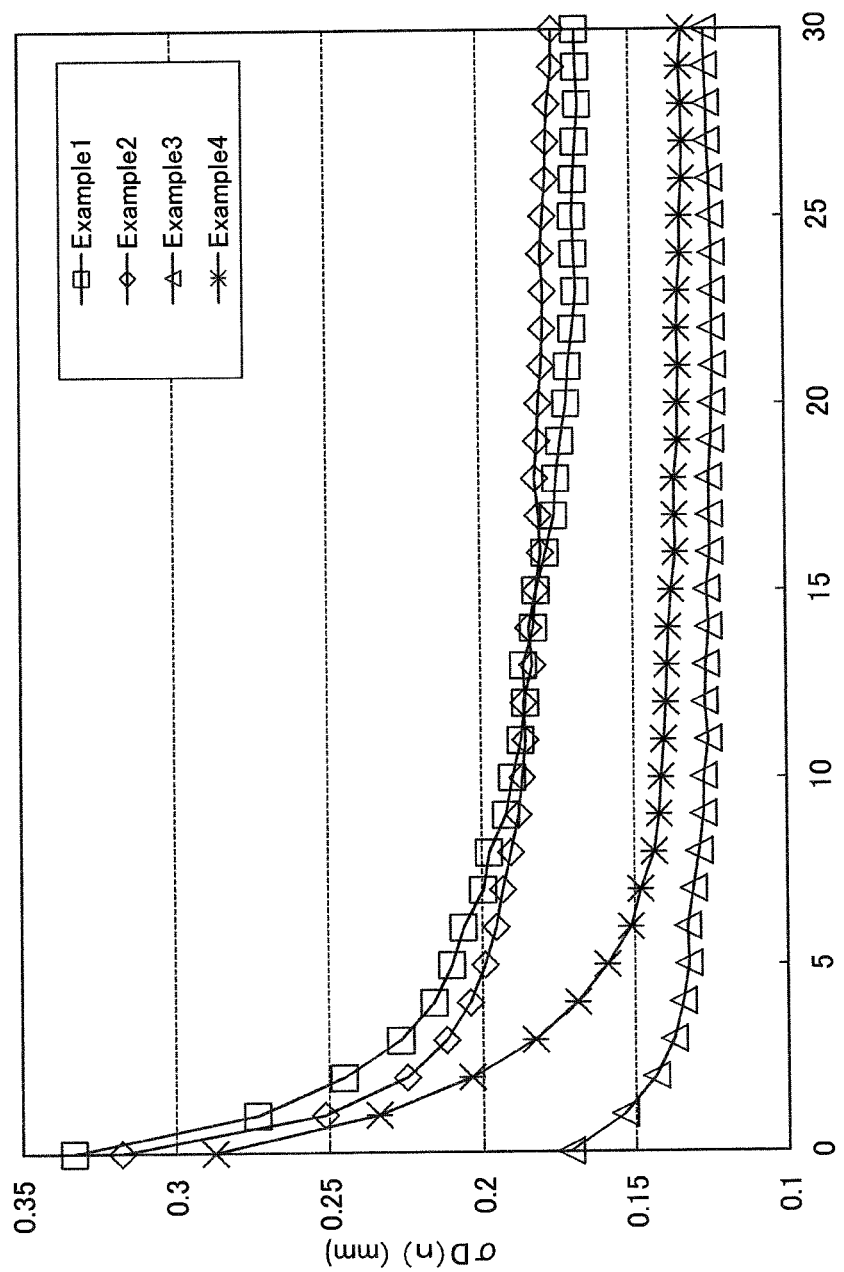
FIG. 23 is a graph showing a standard deviation σD(n) of Voronoi regions.

A value that is twice an average radius Rave(n) is referred to as average diameter D(n). The standard deviation of the average diameters D(n) of all the Voronoi regions obtained when the number of times of the repetition is n is represented by σD(n). FIG. 23 is a graph showing the standard deviation σD(n). In the graph, the vertical axis indicates the standard deviation σD(n), and the horizontal axis indicates the number of times n of the repetition. In the graph, the standard deviations σD(n) of the golf balls of Examples 1 to 4 described in detail later are plotted. As is obvious from this graph, there is a tendency that the standard deviation σD(n) decreases as the number of times n increases. The standard deviation σD(n) converges as the number of times n increases.

Further repetition after the converge is wasted. In light of efficiency, the repetition is stopped when the standard deviation σD(n) reaches a predetermined value or less. The dimples 8 and the land 10 are assigned based on the contours of Voronoi regions obtained at the time of the stop. The repetition may be stopped when the ratio of the standard deviation σD(n) to the average AveRave(n) of the average radii Rave(n) reaches a predetermined value or less. Preferably, the repetition is stopped when the standard deviation σD(n) is equal to or less than 10% of the average of the average radii Rave(n).

The repetition may be stopped when the radius variation range Rhmax(n) of the Voronoi region having a maximum radius variation range Rh among the Voronoi regions obtained when the number of times of the repetition is n is equal to or less than a predetermined value. The repetition may be stopped when the ratio of the radius variation range Rhmax(n) to the average AveRave of the average radii Rave is equal to or less than a predetermined value.

The repetition may be stopped when the difference (Rhmax(n−1)−Rhmax(n)) between a radius variation range Rhmax(n−1) obtained when the number of times of the repetition is (n−1) and the radius variation range Rhmax(n) obtained when the number of times of the repetition is n is equal to or less than a predetermined value.

The repetition may be stopped when the difference (Rhmax(n)−Rhmin(n)) between the radius variation range Rhmax(n) of the Voronoi region having a maximum radius variation range Rh and the radius variation range Rhmin(n) of the Voronoi region having a minimum radius variation range Rh among the Voronoi regions obtained when the number of times of the repetition is n is equal to or less than a predetermined value.

The repetition may be stopped when a value X calculated by the following mathematical formula is equal to or less than a predetermined value.

$$X=(Rh\max(n-1)-Rh\min(n-1))-(Rh\max(n)-(Rh\min(n))$$

In this mathematical formula, Rhmax(n−1) represents the radius variation range of the Voronoi region having a maximum radius variation range among the Voronoi regions obtained when the number of times of the repetition is (n−1), Rhmin(n−1) represents the radius variation range of the Voronoi region having a minimum radius variation range among the Voronoi regions obtained when the number of times of the repetition is (n−1), Rhmax(n) represents the radius variation range of the Voronoi region having a maximum radius variation range among the Voronoi regions when the number of times of the repetition is n, and Rhmin(n) represents the radius variation range of the Voronoi region having a minimum radius variation range among the Voronoi regions obtained when the number of times of the repetition is n.

Figure 25:
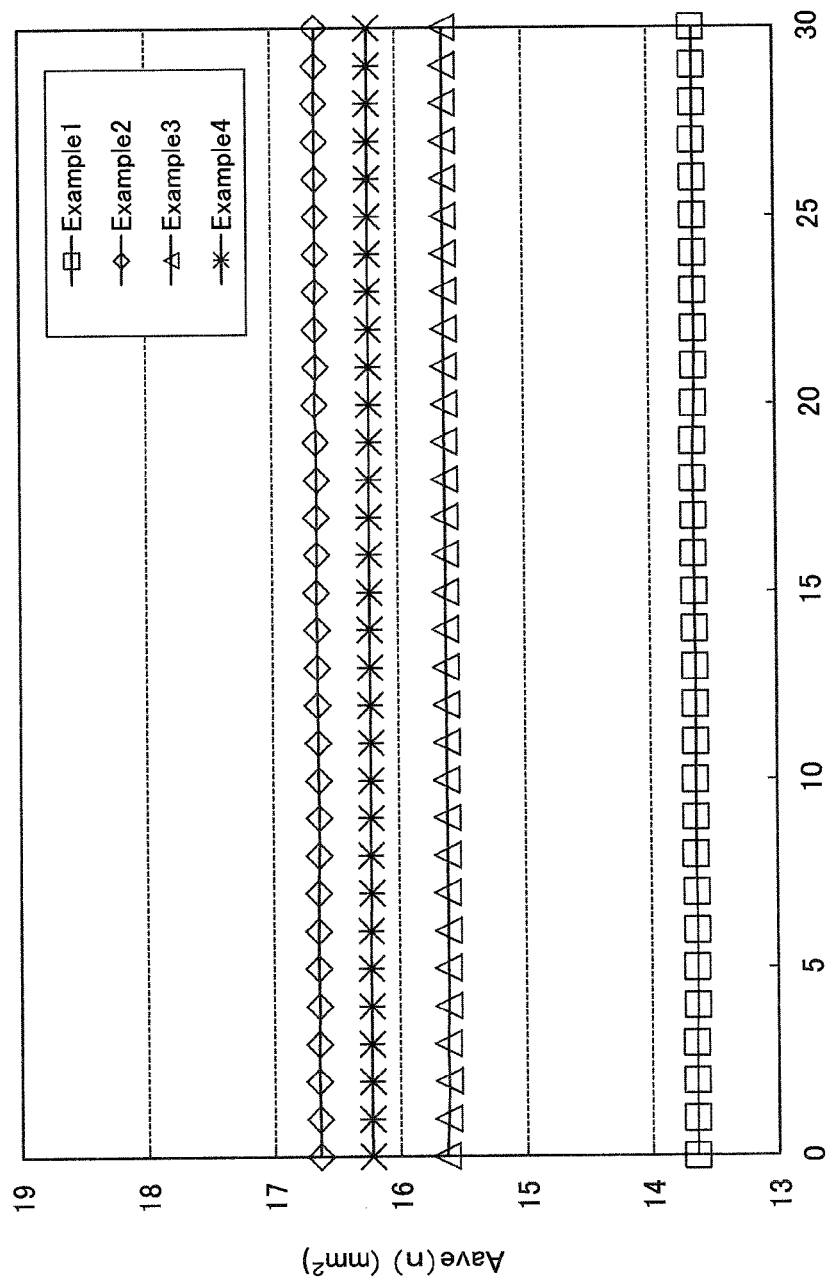
FIG. 25 is a graph showing the average Aave(n) of the areas of all Voronoi regions.

FIG. 25 is a graph showing the average Aave(n) of the areas A(n) of all Voronoi regions. In the graph, the vertical axis indicates the average Aave(n), and the horizontal axis indicates the number of times n of the repetition. In the graph, the averages Aave(n) of the golf balls of Examples 1 to 4 described in detail later are plotted. As is obvious from this graph, the average Aave(n) almost does not change even by the repetition.

Figure 26:
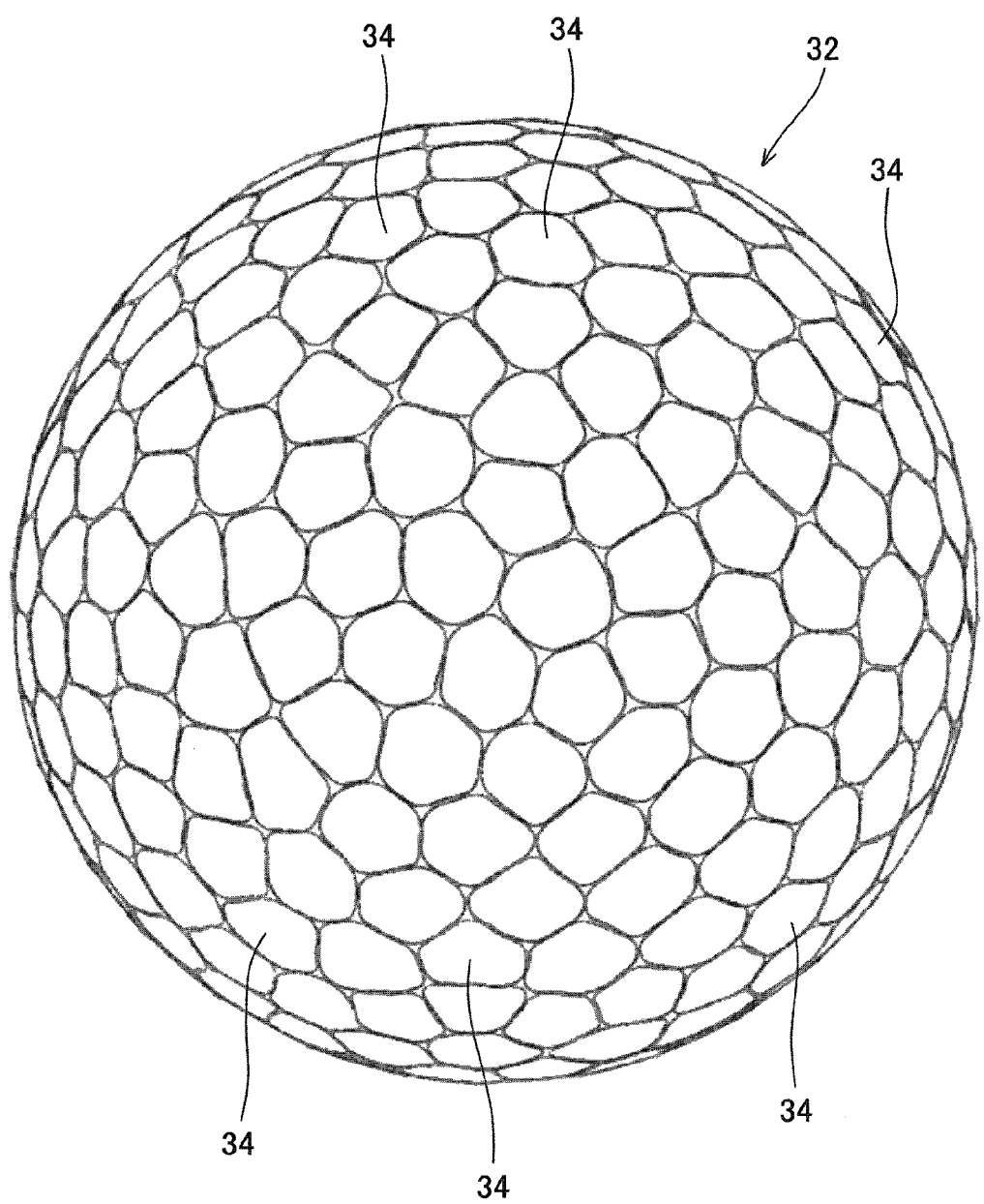
FIG. 26 is a front view of a golf ball obtained by a designing process according to another embodiment of the present invention.
Figure 27:
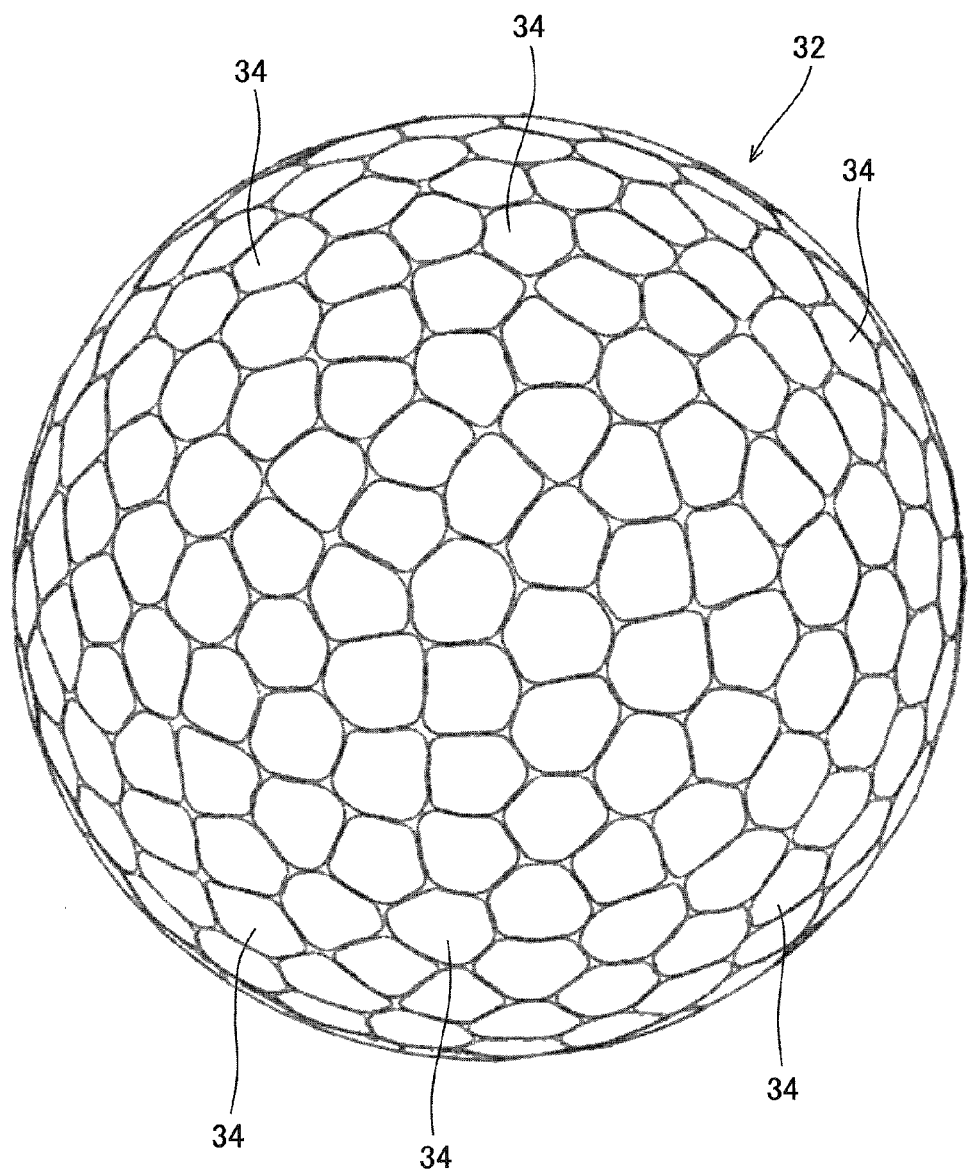
FIG. 27 is a plan view of the golf ball in FIG. 26.

FIG. 26 is a front view of a golf ball 32 obtained by a designing process according to another embodiment of the present invention, and FIG. 27 is a plan view of the golf ball 32 in FIG. 26. The golf ball 32 has a large number of dimples 34 on a surface thereof.

Figure 28:
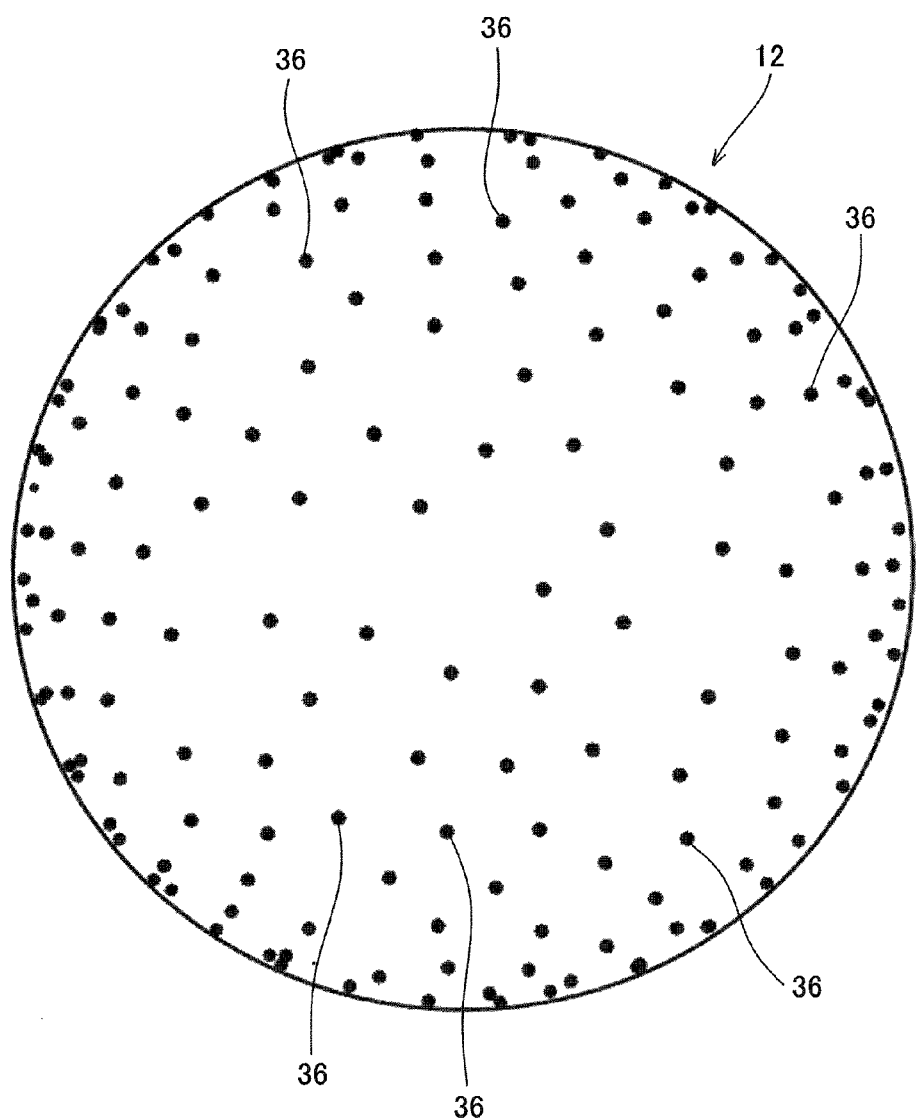
FIG. 28 is a front view showing generating points for a dimple pattern of the golf ball in FIG. 26.
Figure 29:
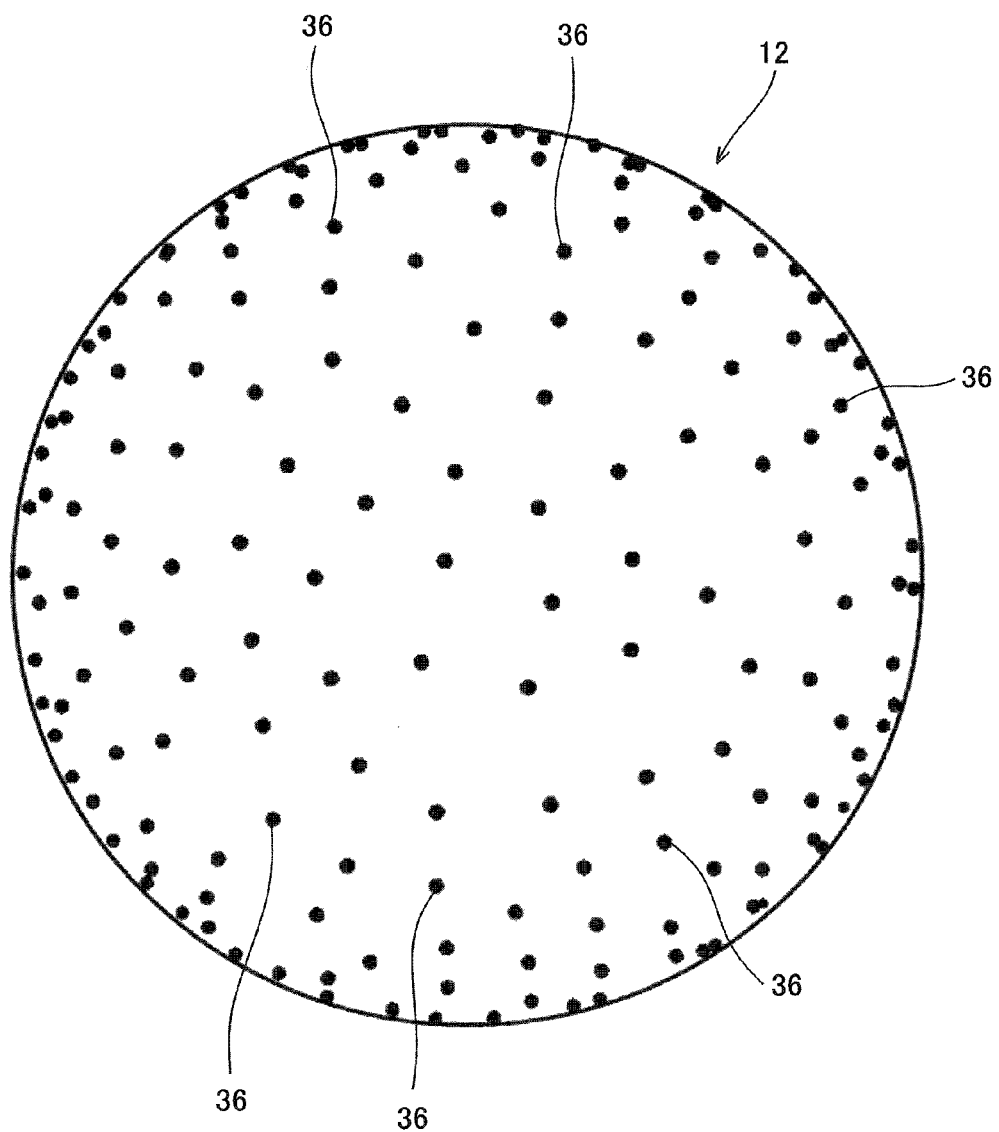
FIG. 29 is a plan view showing generating points for the dimple pattern of the golf ball in FIG. 27.
Figure 30:
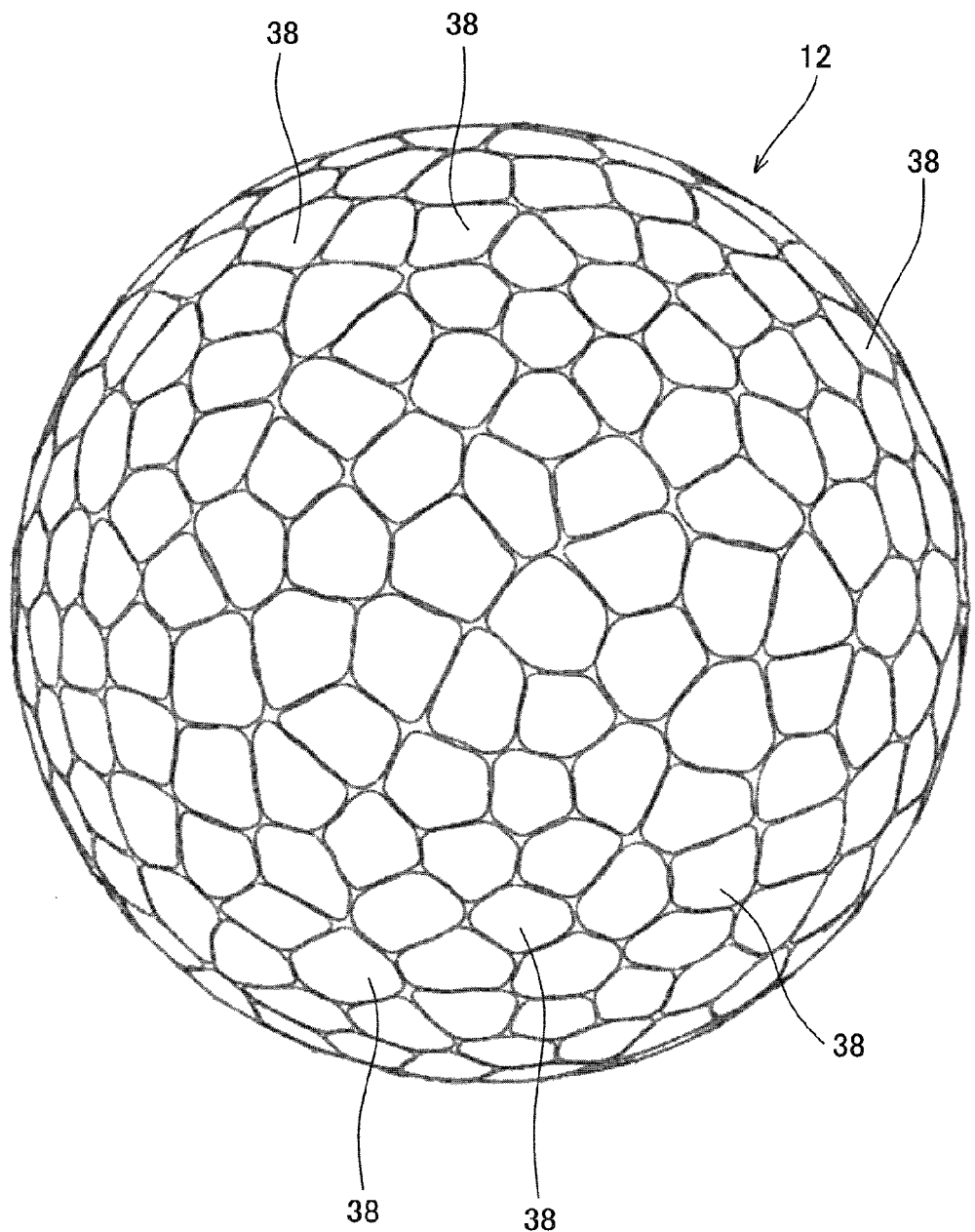
FIG. 30 is a front view of a pattern of Voronoi regions obtained based on the generating points in FIG. 28.
Figure 31:
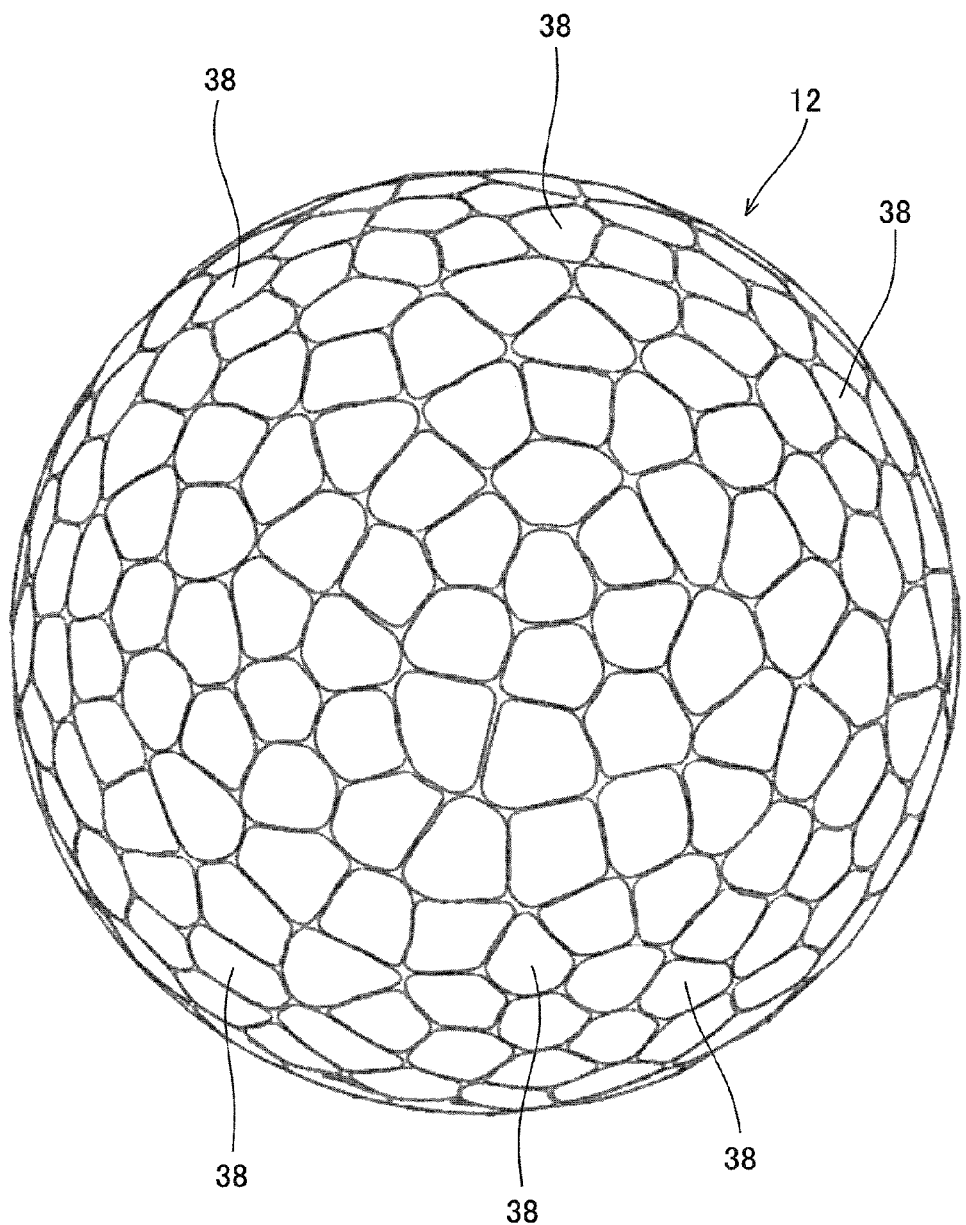
FIG. 31 is a plan view of the pattern in FIG. 30.
Figure 32:
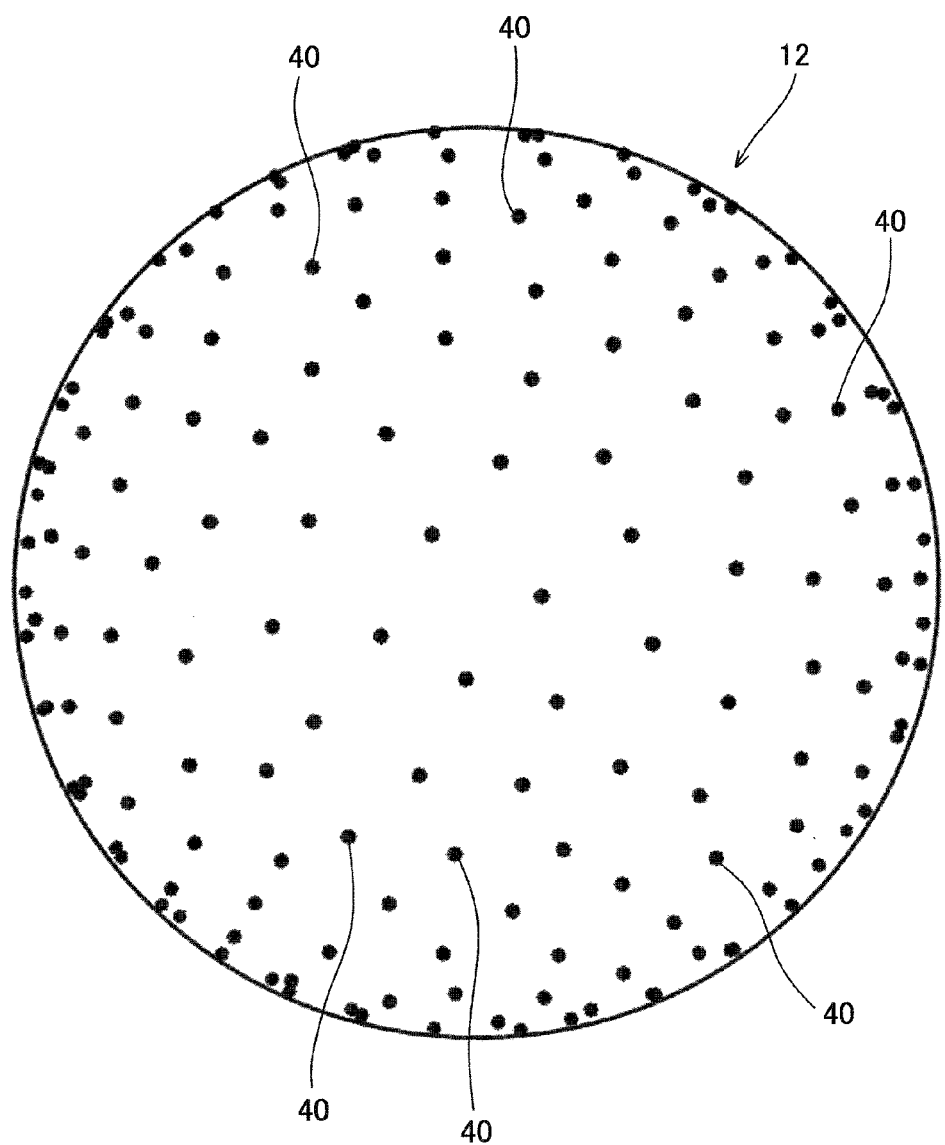
FIG. 32 is a front view showing generating points of the Voronoi regions in FIG. 30.
Figure 33:
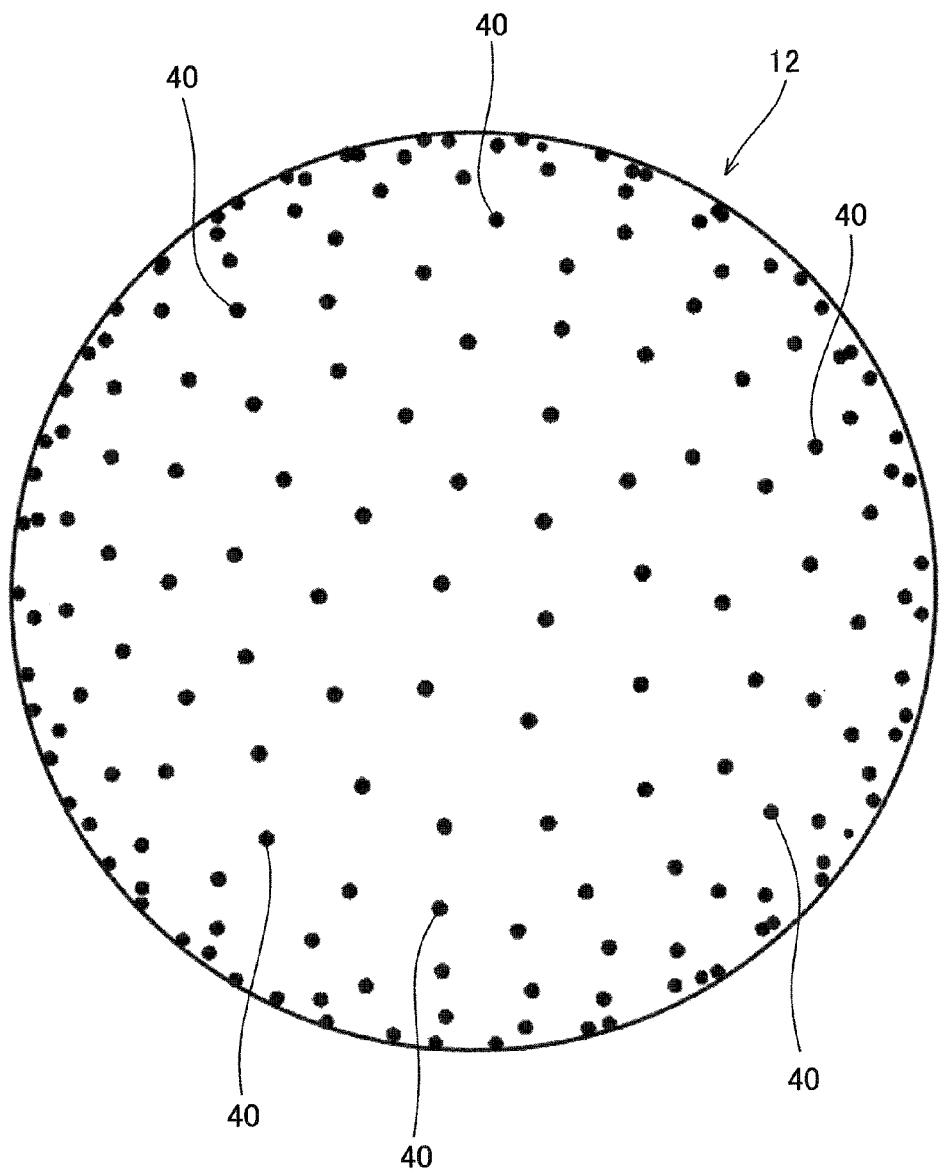
FIG. 33 is a plan view showing generating points of the Voronoi regions in FIG. 31.
Figure 34:
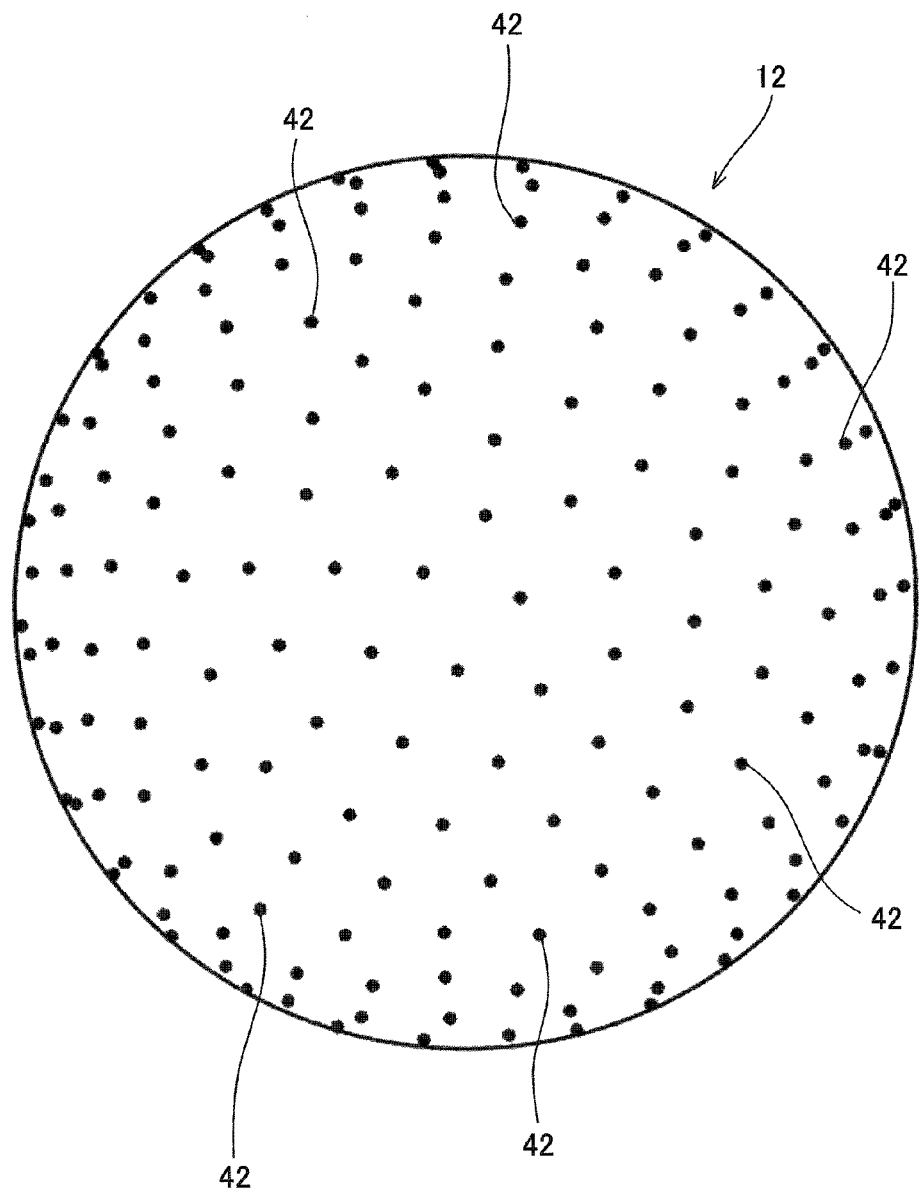
FIG. 34 is a front view showing generating points of dimples of the golf ball in FIG. 26.
Figure 35:
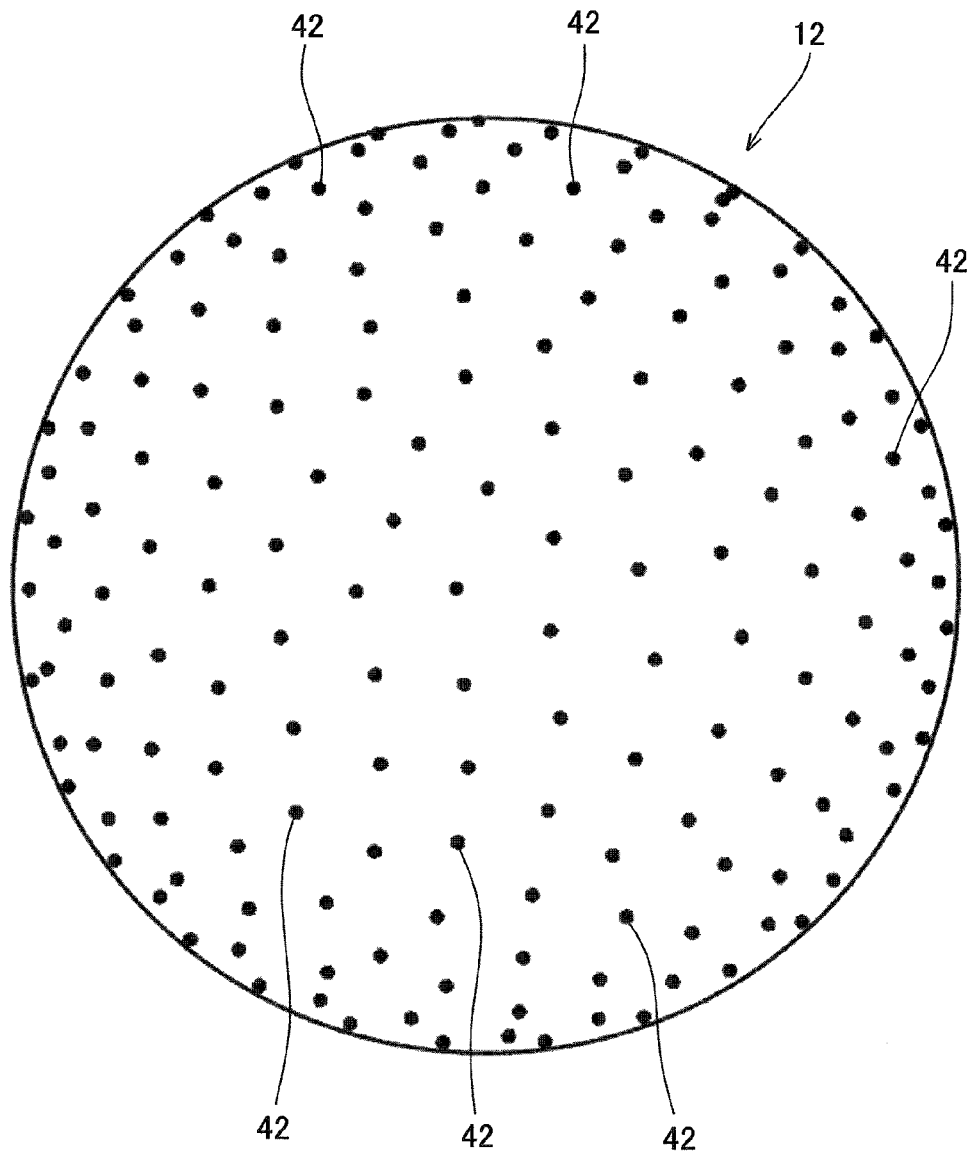
FIG. 35 is a plan view showing generating points of dimples of the golf ball in FIG. 27.

In order to obtain the dimples 34, as shown in FIGS. 28 and 29, a large number of generating points 36 are arranged on the surface of the phantom sphere 12. Random numbers are used for this arrangement. A latitude and a longitude of each generating point 36 are decided based on the random numbers. As shown in FIGS. 30 and 31, a large number of Voronoi regions 38 are assumed on the phantom sphere 12 by a Voronoi tessellation based on these generating points 36. As shown in FIGS. 32 and 33, the centers of gravity 40 of these Voronoi regions 38 are calculated. These centers of gravity are new generating points. A large number of new Voronoi regions are assumed on the phantom sphere 12 by a Voronoi tessellation based on a large number of the new generating points. Decision of generating points and assumption of Voronoi regions are repeated. In the present embodiment, the contours of Voronoi regions obtained when the number of times n of the repetition is 30 are subjected to a process such as smoothing or the like according to need. The dimples 34 and a land are assigned to the surface of the phantom sphere 12 based on the contours after the process. A dimple pattern shown in FIGS. 26 and 27 is obtained by this assignment. The centers of gravity 42 of the dimples 34 in the pattern are shown in FIGS. 34 and 35. In the dimple pattern shown in FIGS. 26 and 27, the occupation ratio is high. In the dimple pattern, variations of the sizes of the dimples 34 are small. In the dimple pattern, the variation of the radius R of each dimple 34 is not periodic.

In the present embodiment as well, similarly to the process for designing the dimple pattern shown in FIGS. 2 and 3, the repetition of the decision of generating points and the assumption of Voronoi regions can be stopped when a predetermined condition is met.

Figure 36:
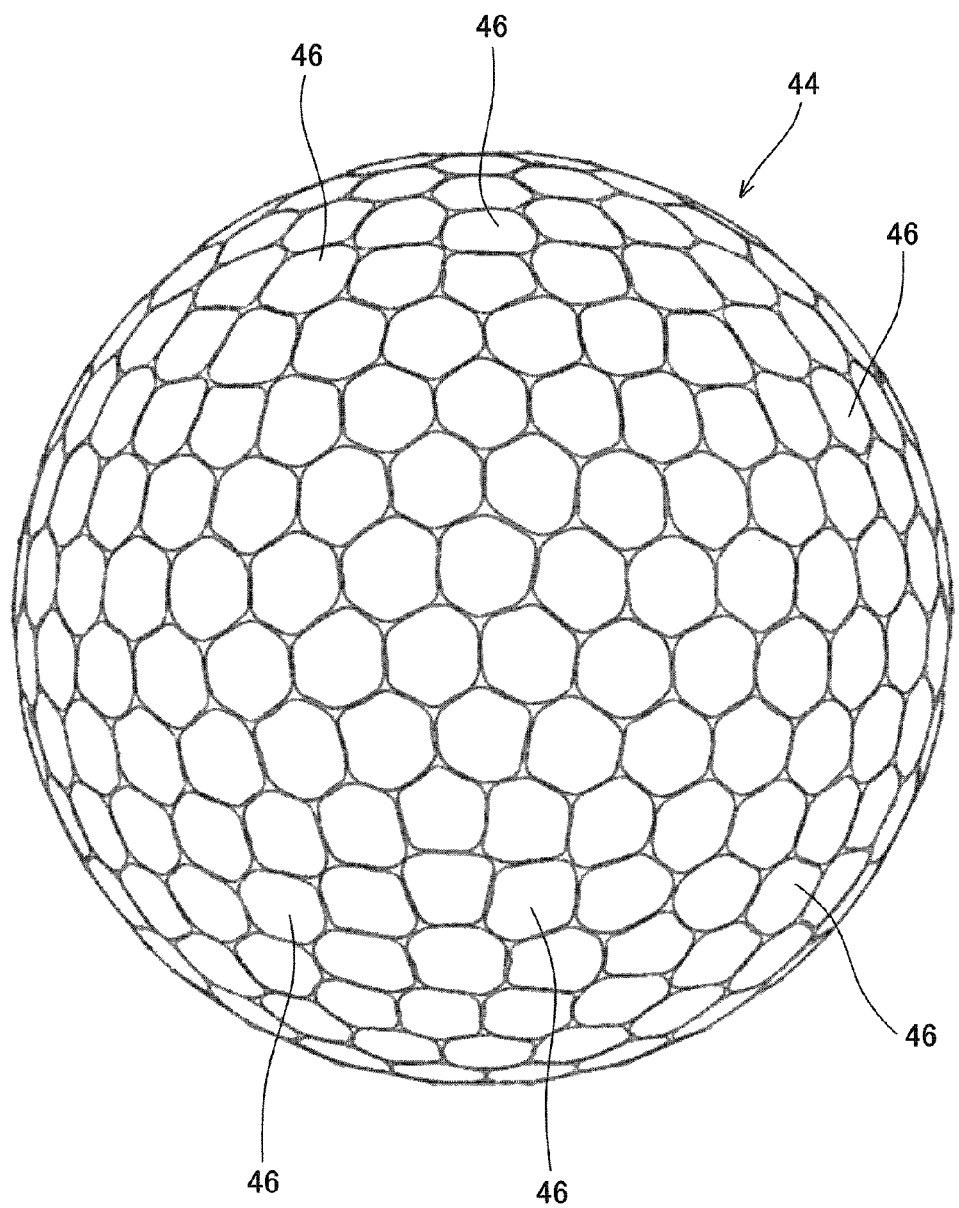
FIG. 36 is a front view of a golf ball obtained by a designing process according to still another embodiment of the present invention.
Figure 37:
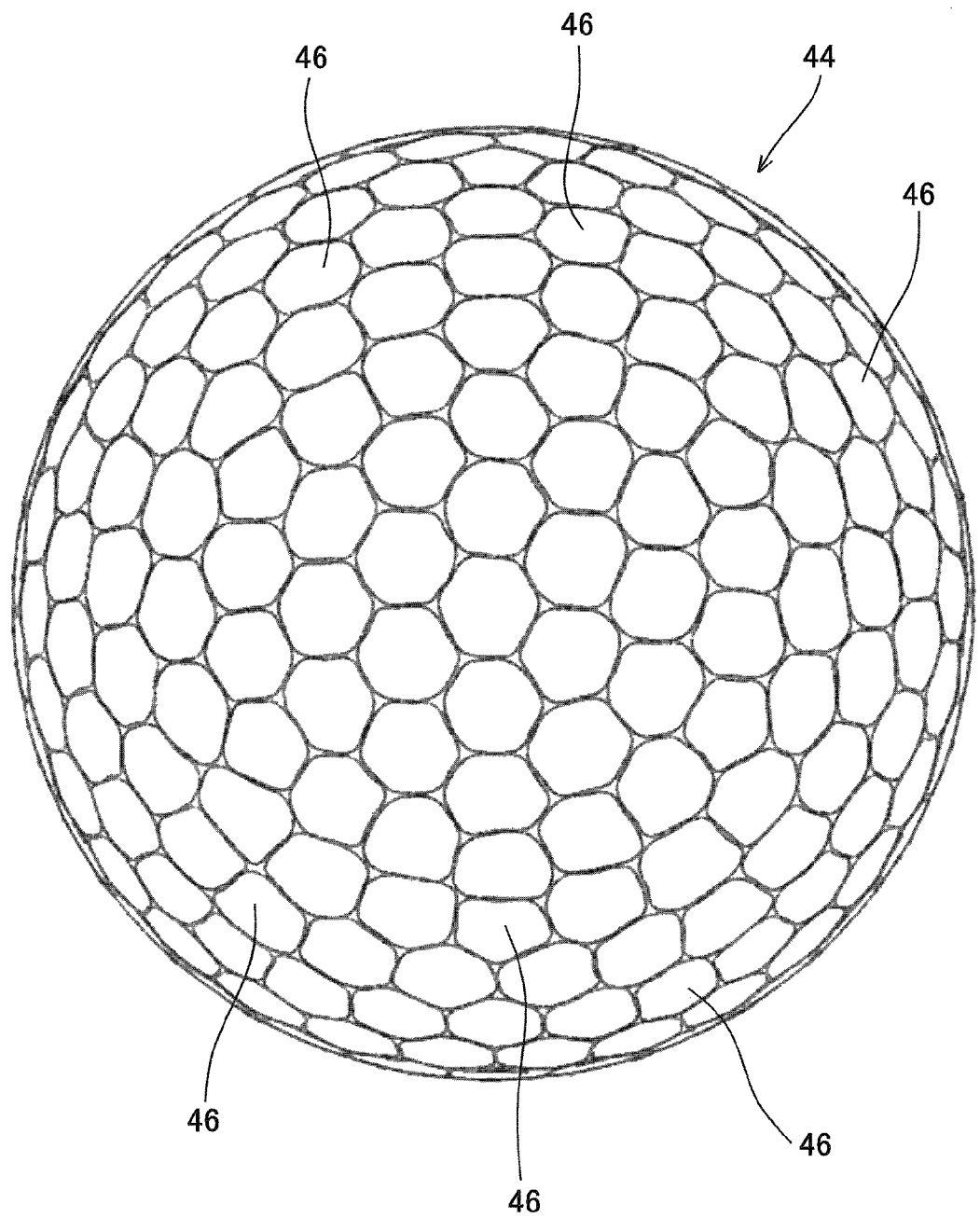
FIG. 37 is a plan view of the golf ball in FIG. 36.

FIG. 36 is a front view of a golf ball 44 obtained by a designing process according to still another embodiment of the present invention, and FIG. 37 is a plan view of the golf ball 44 in FIG. 36. The golf ball 44 has a large number of dimples 46 on a surface thereof.

Figure 38:
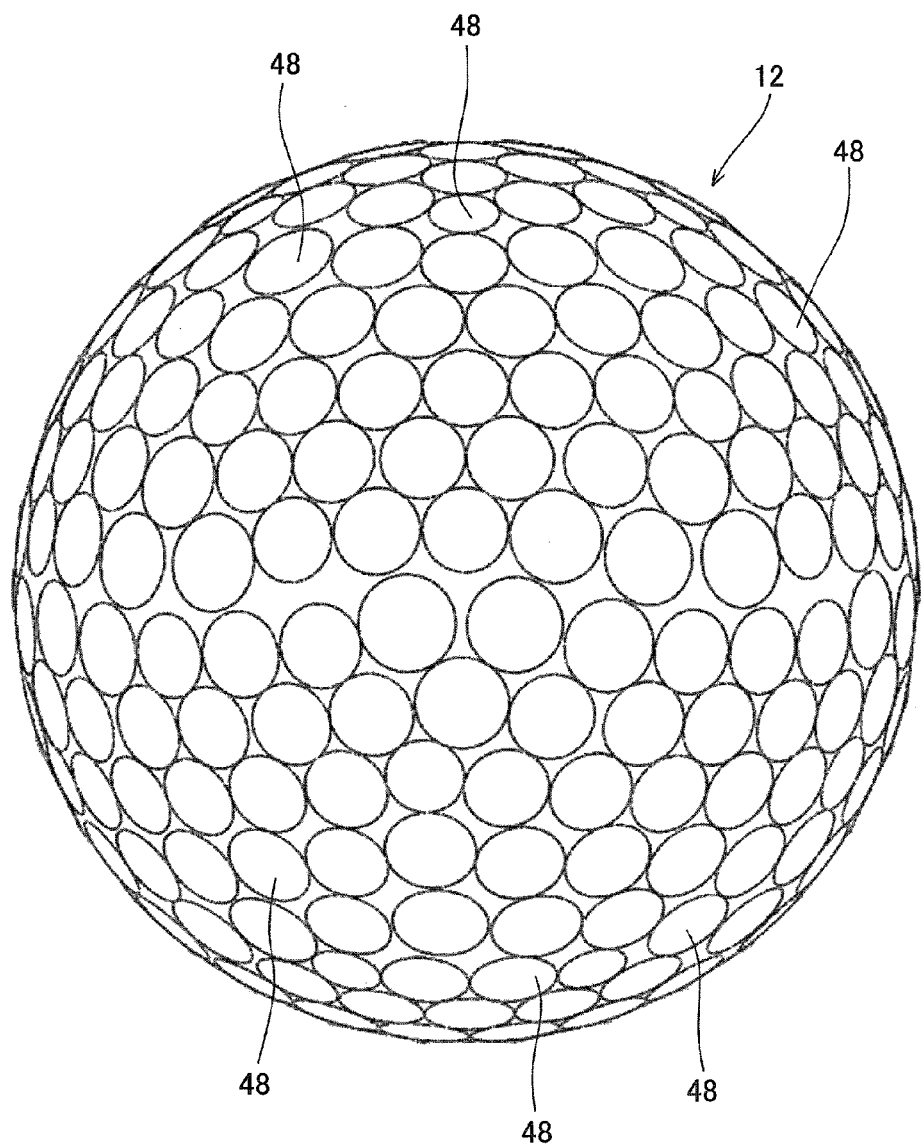
FIG. 38 is a front view of a pattern of circles for a dimple pattern of the golf ball in FIG. 36.
Figure 39:
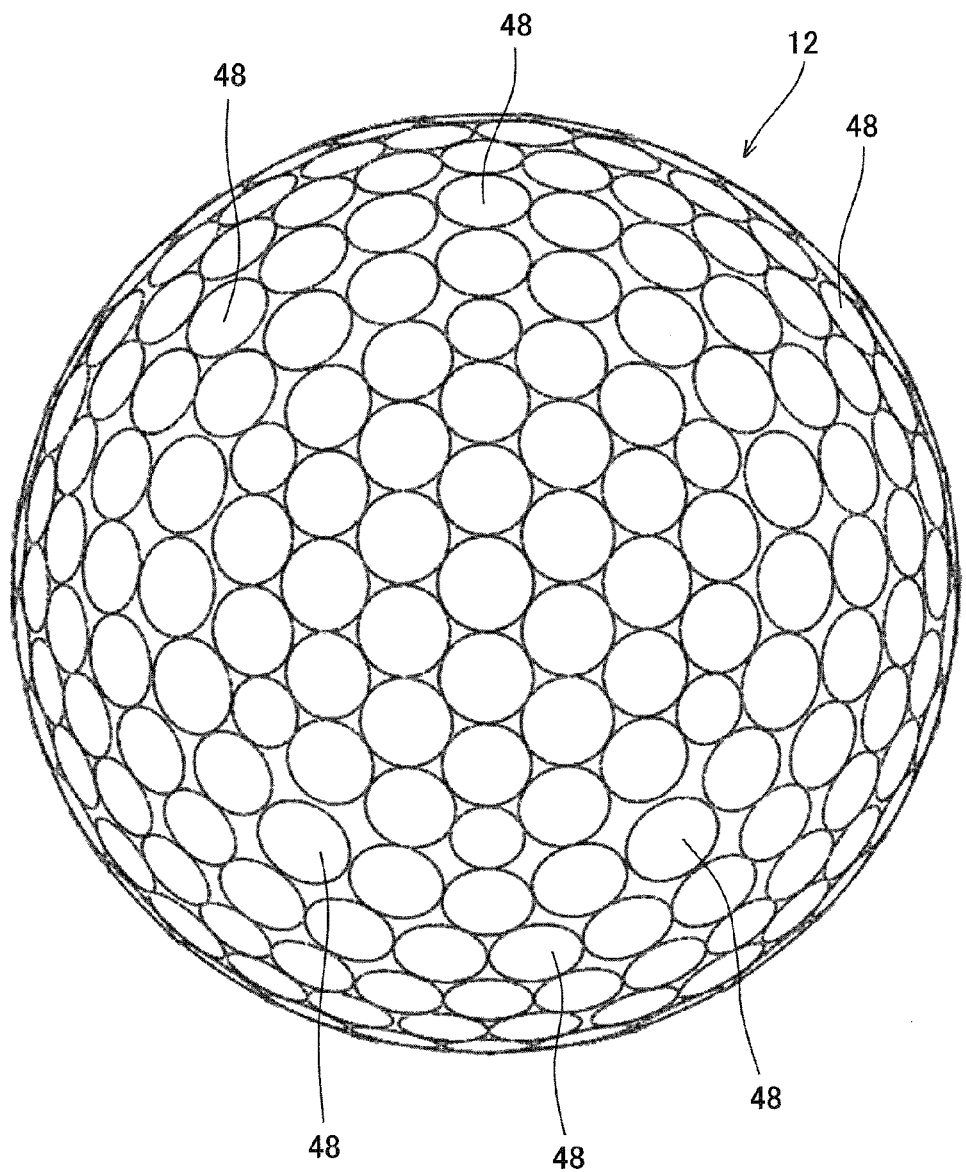
FIG. 39 is a plan view of the pattern of the circles in FIG. 38.
Figure 40:
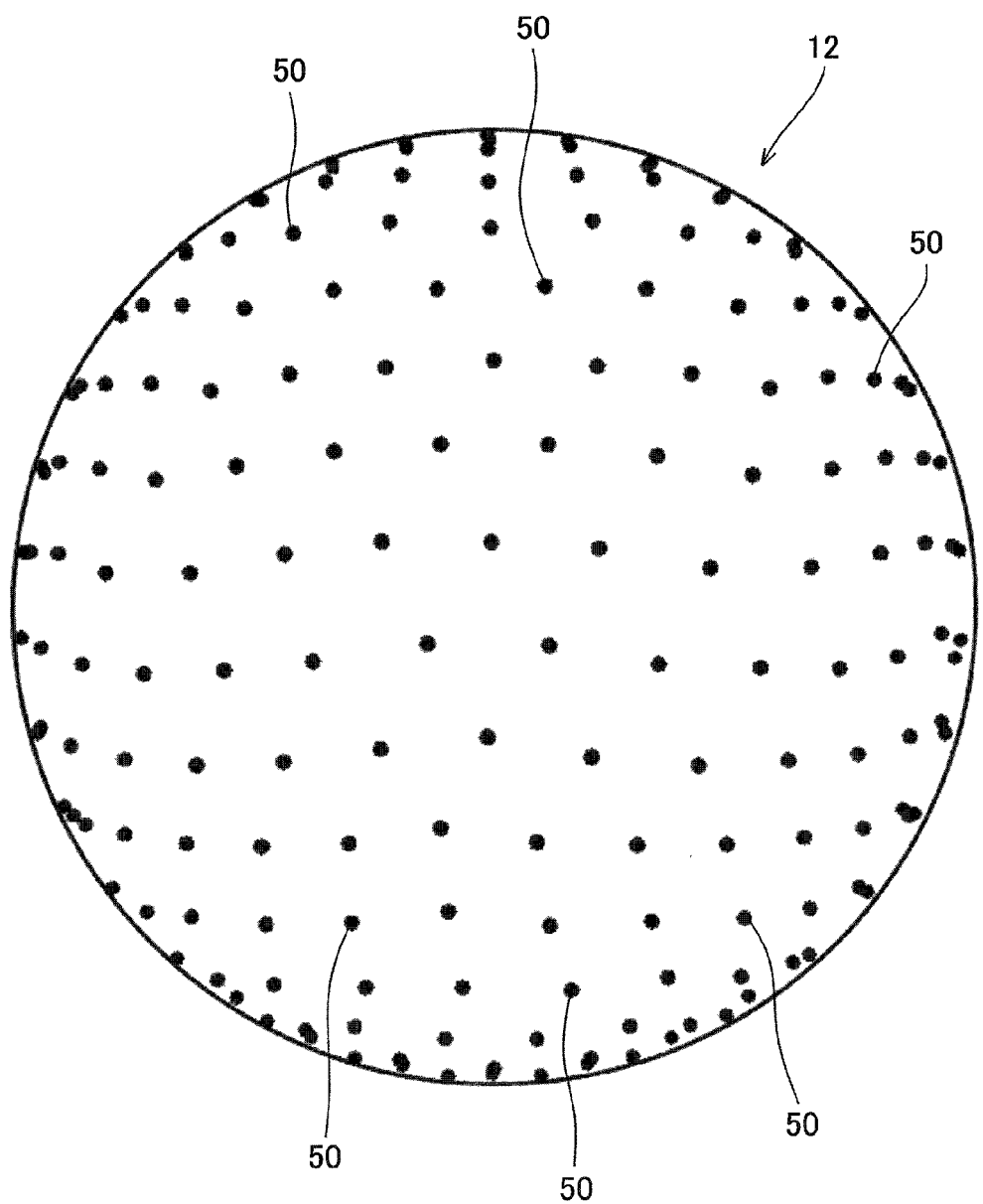
FIG. 40 is a front view showing generating points calculated from the circles in FIG. 38.
Figure 41:
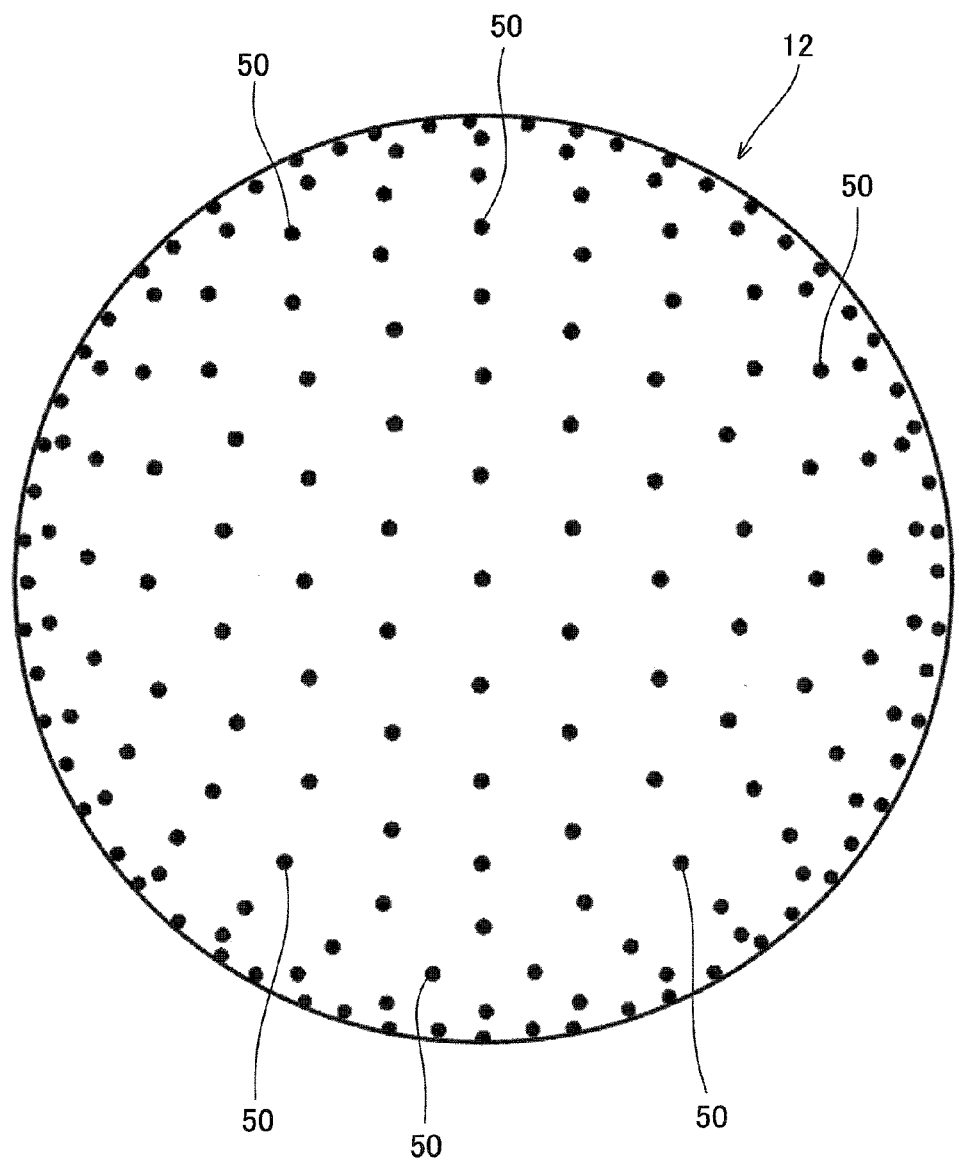
FIG. 41 is a plan view showing generating points calculated from the circles in FIG. 39.
Figure 42:
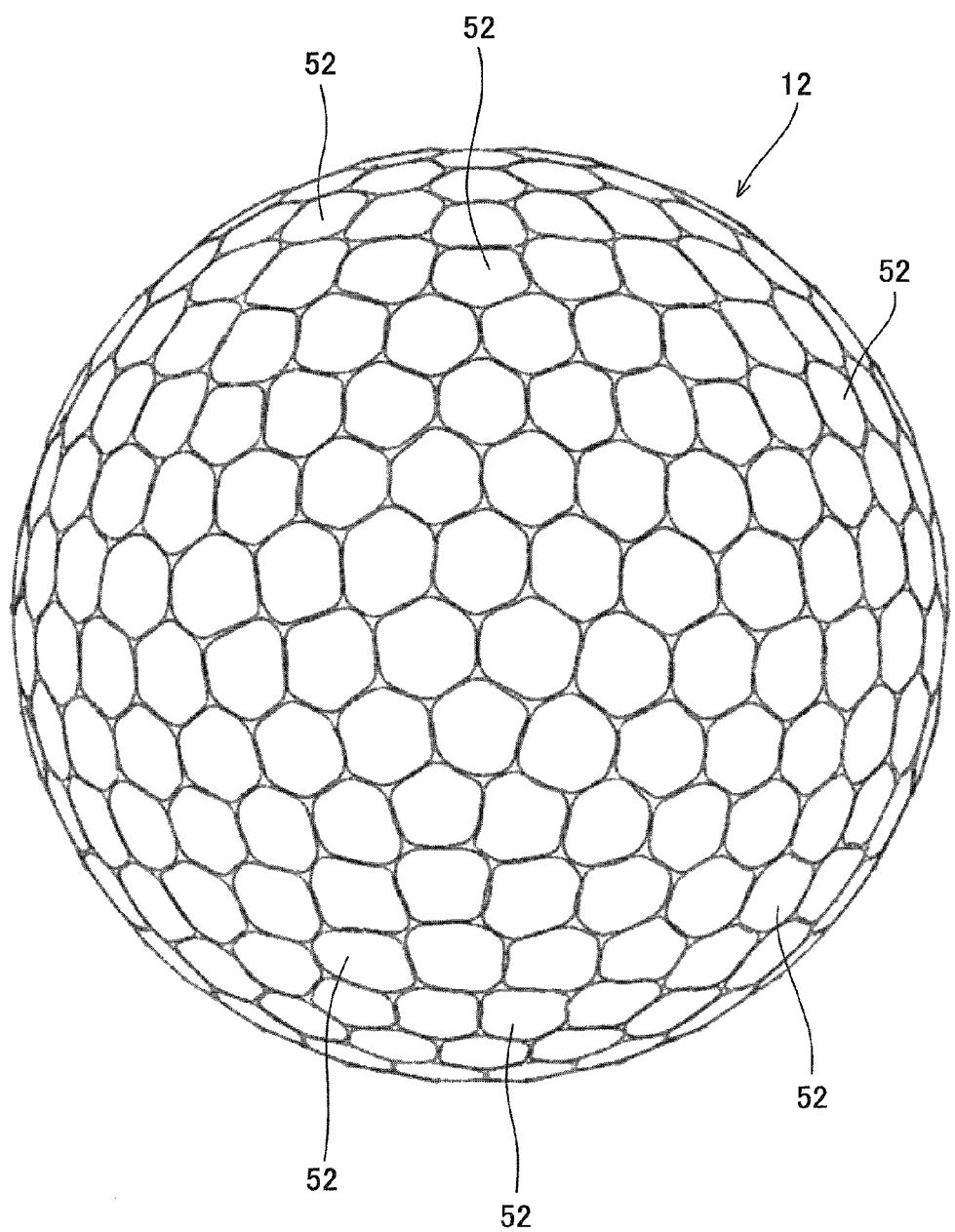
FIG. 42 is a front view of a pattern of Voronoi regions obtained based on the generating points in FIG. 40.
Figure 43:
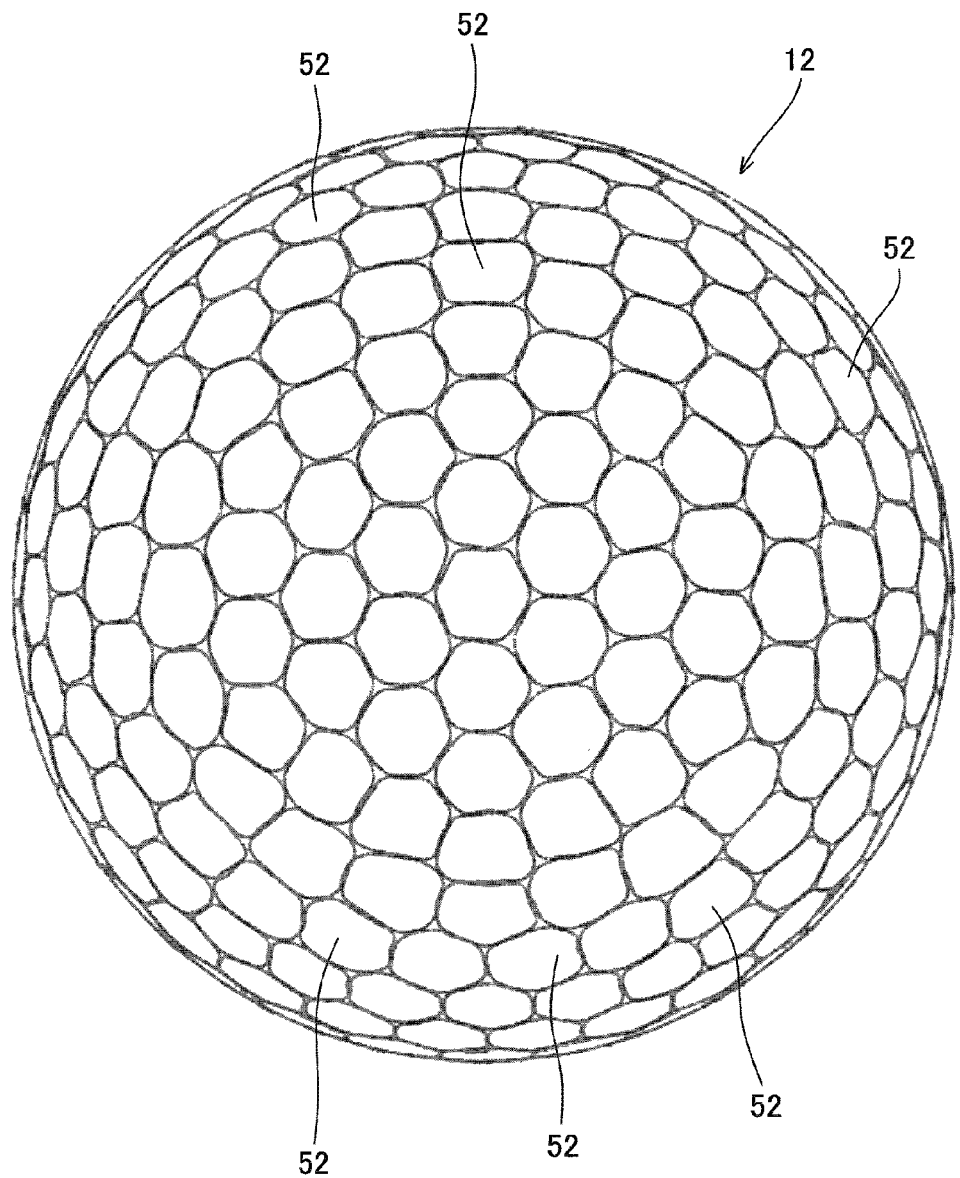
FIG. 43 is a plan view of the pattern in FIG. 42.
Figure 44:
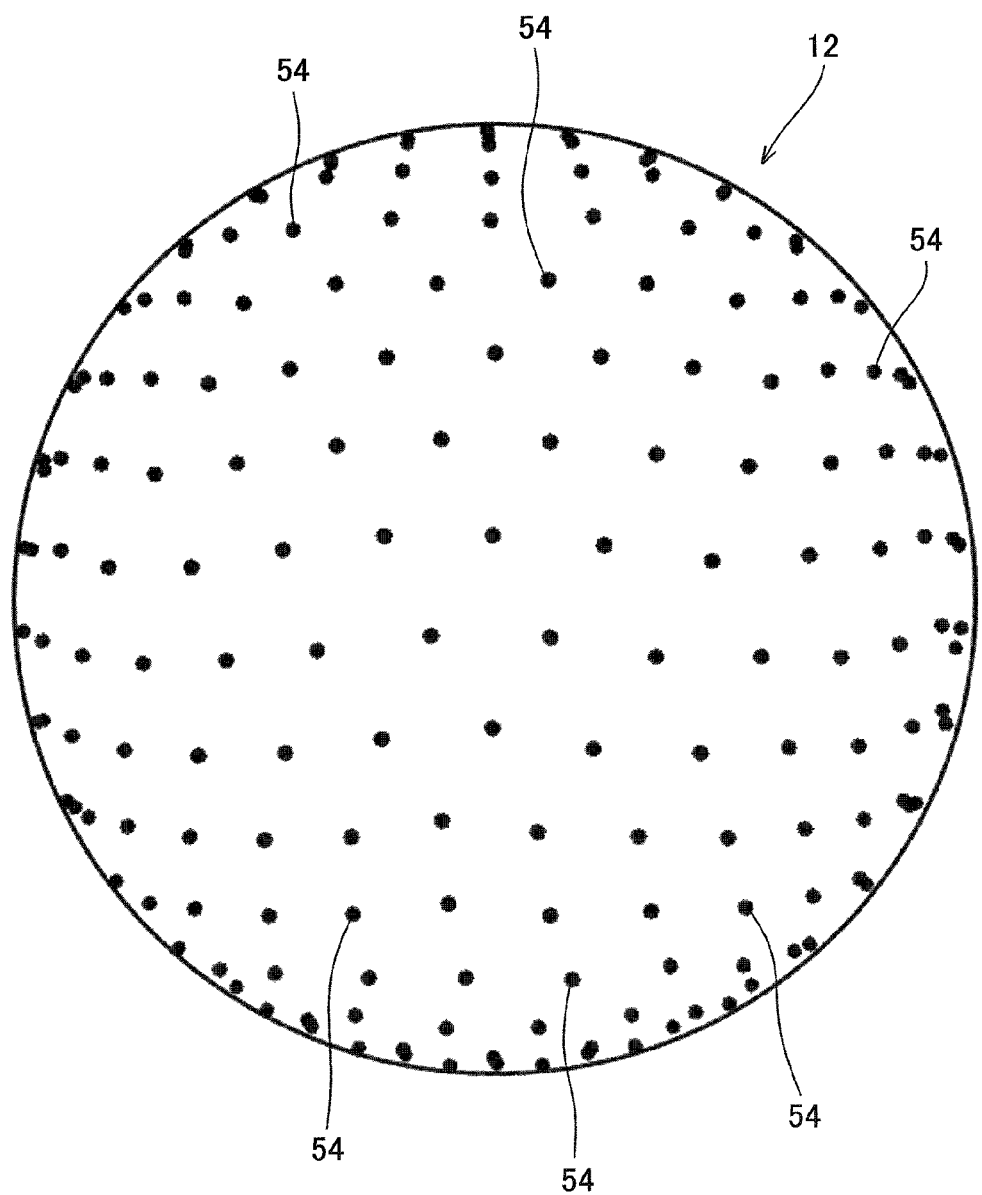
FIG. 44 is a front view showing generating points of the Voronoi regions in FIG. 42.
Figure 45:
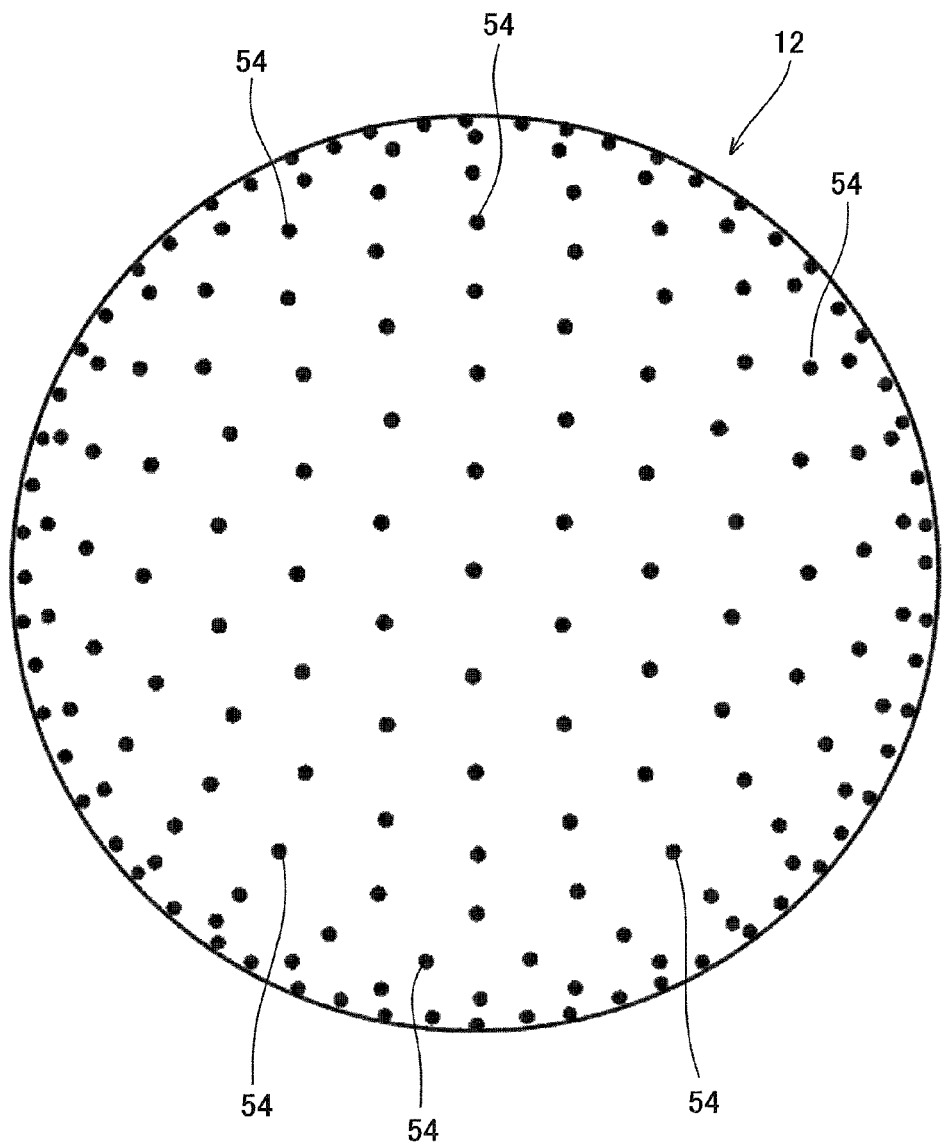
FIG. 45 is a plan view showing generating points of the Voronoi regions in FIG. 43.
Figure 46:
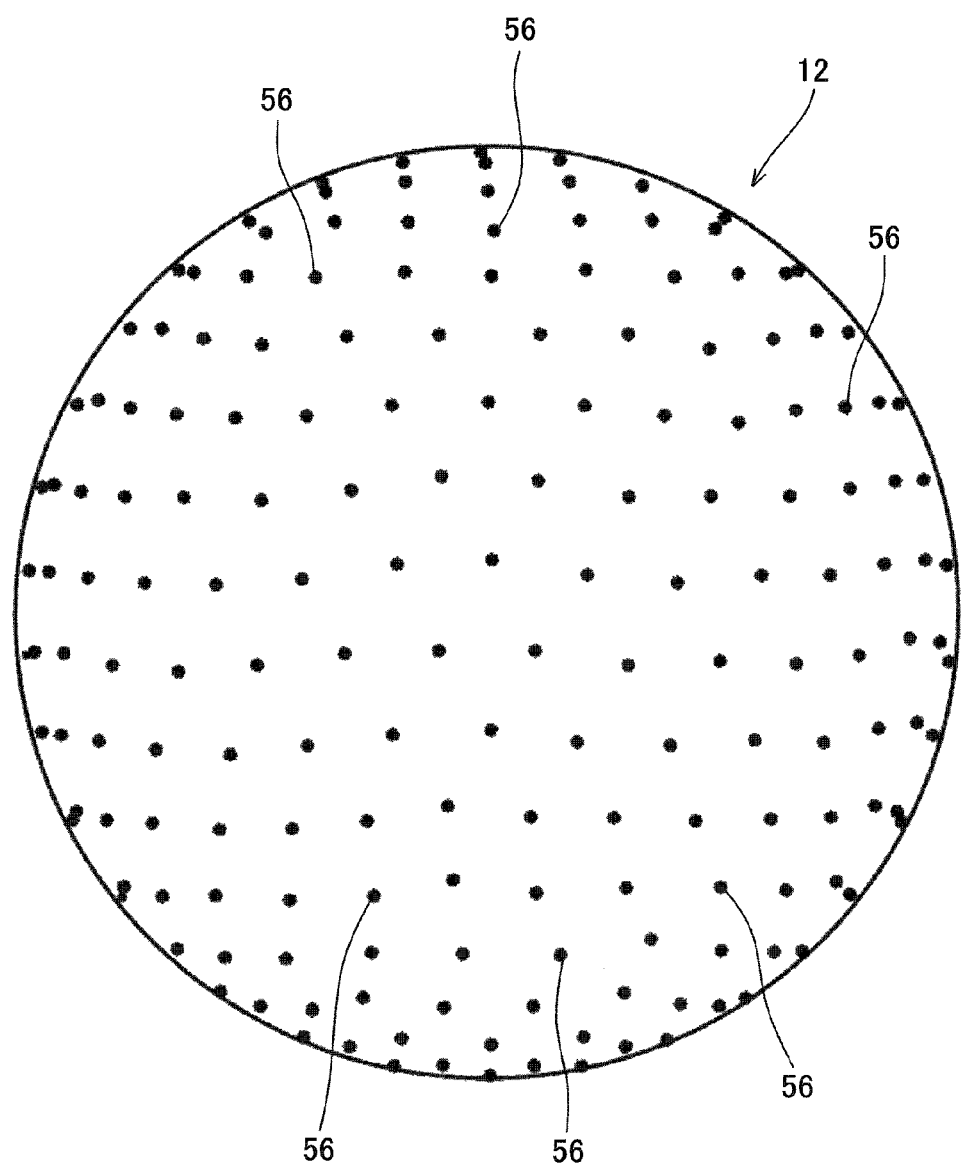
FIG. 46 is a front view of generating points of dimples of the golf ball in FIG. 36.
Figure 47:
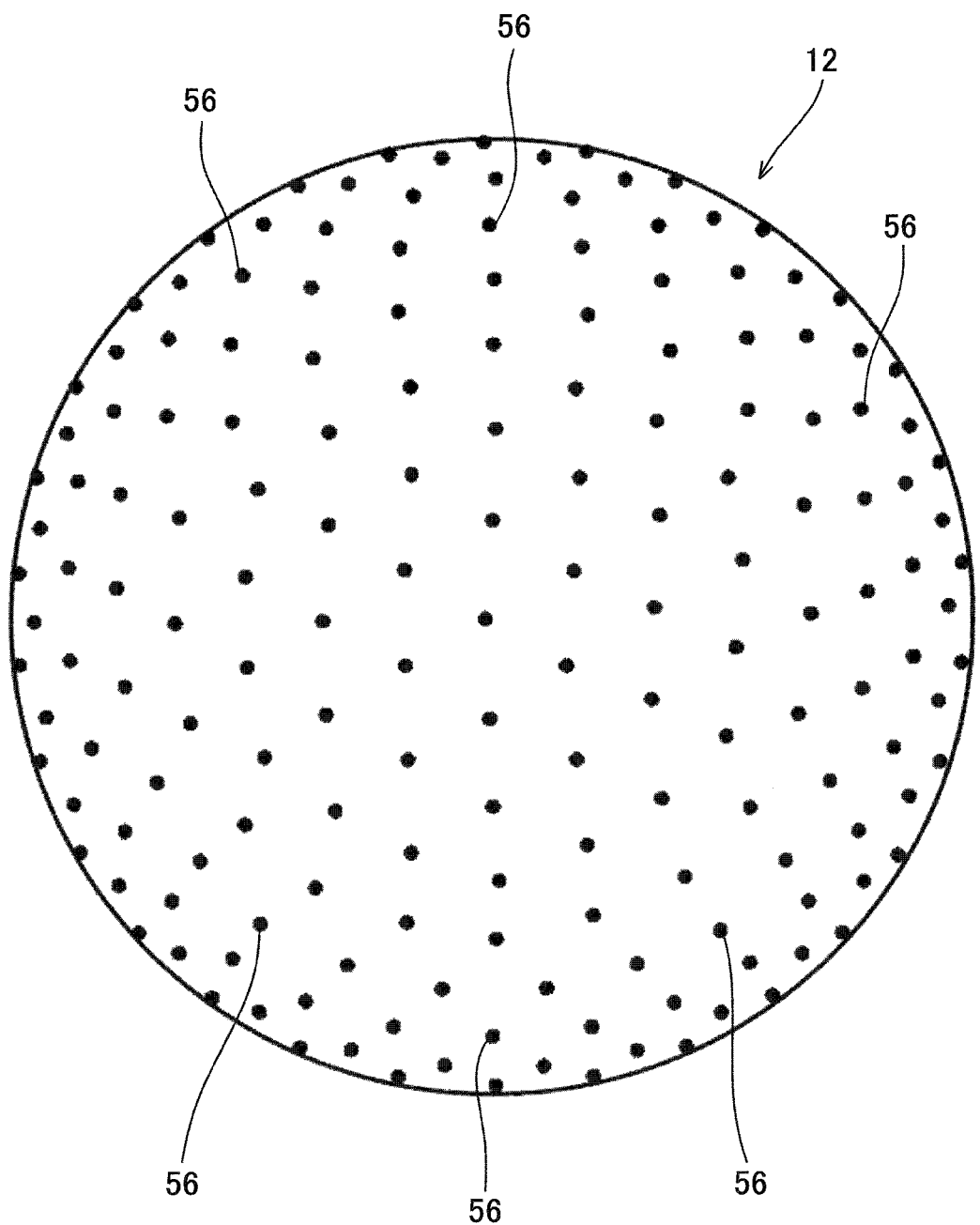
FIG. 47 is a plan view showing generating points of dimples of the golf ball in FIG. 37.

In order to obtain the dimples 46, as shown in FIGS. 38 and 39, a large number of circles 48 are arranged on the surface of the phantom sphere 12. A known method for arranging circular dimples can be used for this arrangement. As shown in FIGS. 40 and 41, the centers 50 of these circles 48 are calculated. As shown in FIGS. 42 and 43, a large number of Voronoi regions 52 are assumed on the phantom sphere 12 by a Voronoi tessellation with the centers 50 as generating points. As shown in FIGS. 44 and 45, the centers of gravity 54 of these Voronoi regions 52 are calculated. These centers of gravity 54 are new generating points. A large number of new Voronoi regions are assumed on the phantom sphere 12 by a Voronoi tessellation based on a large number of the new generating points. Decision of generating points and assumption of Voronoi regions are repeated. In the present embodiment, the contours of Voronoi regions obtained when the number of times n of the repetition is 30 are subjected to a process such as smoothing or the like according to need. The dimples 46 and a land are assigned to the surface of the phantom sphere 12 based on the contours after the process. A dimple pattern shown in FIGS. 36 and 37 is obtained by this assignment. The centers of gravity 56 of the dimples 46 in the pattern are shown in FIGS. 46 and 47. In the dimple pattern shown in FIGS. 36 and 37, the occupation ratio is high. In the dimple pattern, variations of the sizes of the dimples 46 are small. In the dimple pattern, the variation of the radius R of each dimple 46 is not periodic.

In the present embodiment as well, similarly to the process for designing the dimple pattern shown in FIGS. 2 and 3, the repetition of the decision of generating points and the assumption of Voronoi regions can be stopped when a predetermined condition is met.

Figure 48:
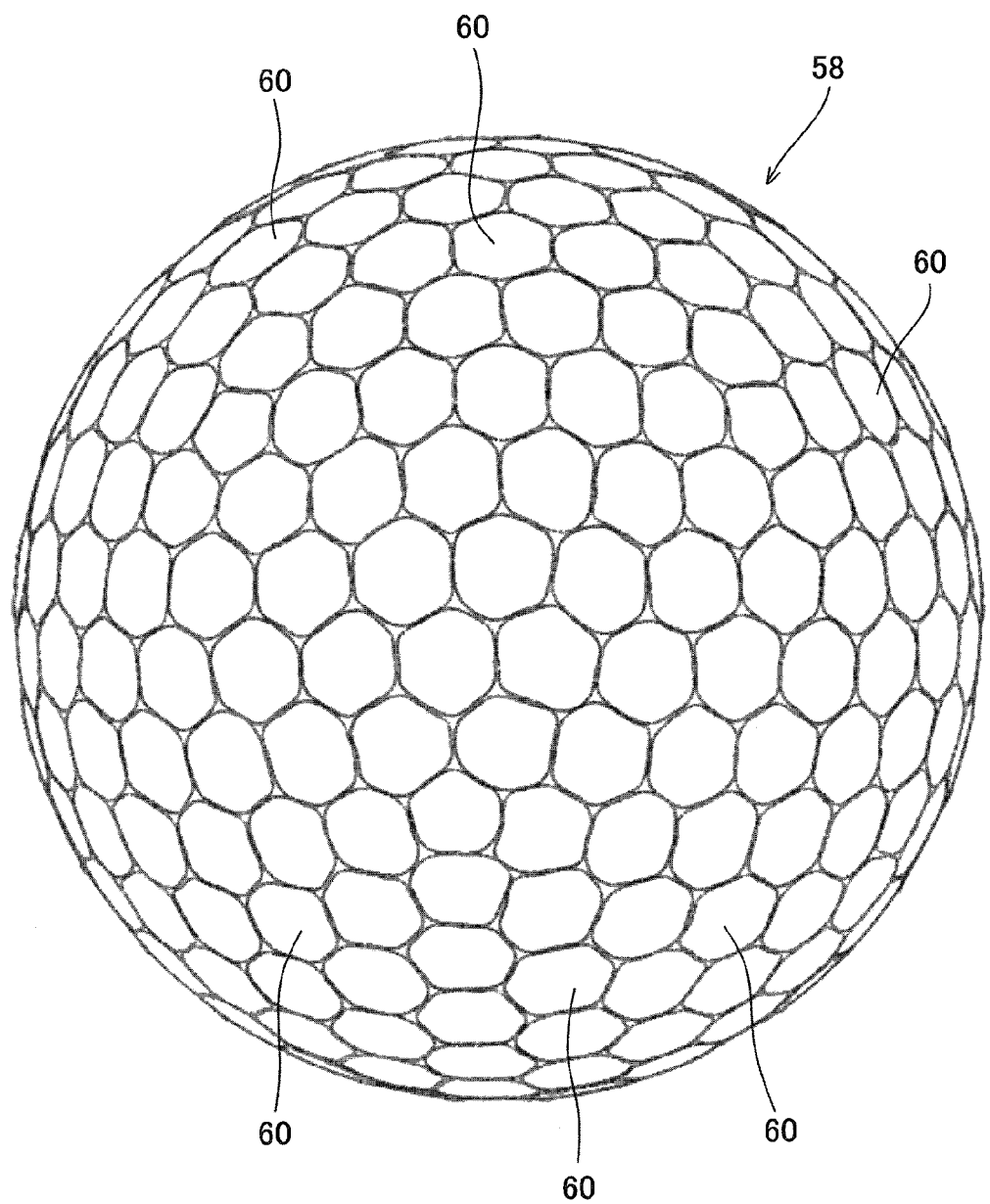
FIG. 48 is a front view of a golf ball obtained by a designing process according to still another embodiment of the present invention.
Figure 49:
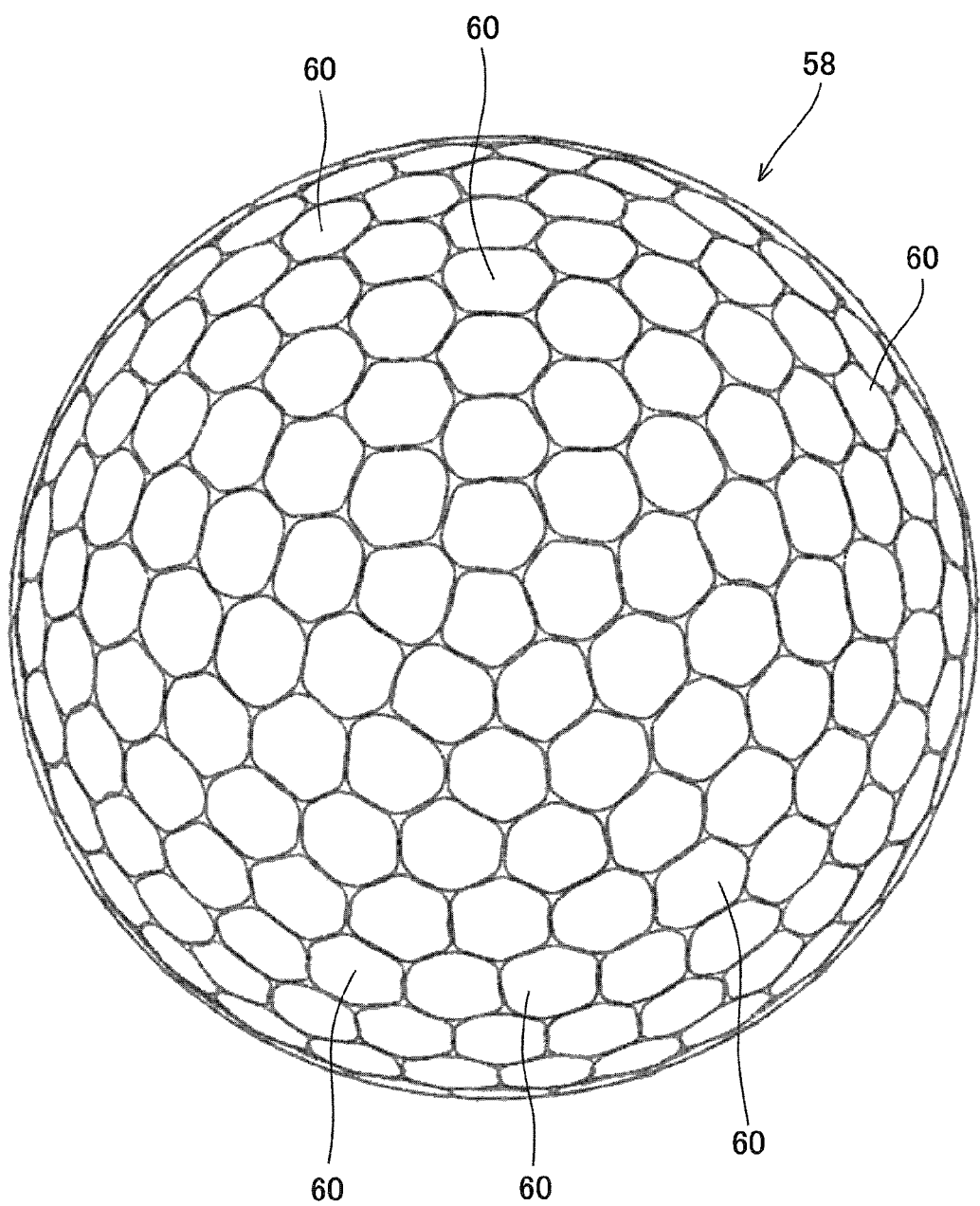
FIG. 49 is a plan view of the golf ball in FIG. 48.

FIG. 48 is a front view of a golf ball 58 obtained by a designing process according to still another embodiment of the present invention, and FIG. 49 is a plan view of the golf ball 58 in FIG. 48. The golf ball 58 has a large number of dimples 60 on a surface thereof.

Figure 50:
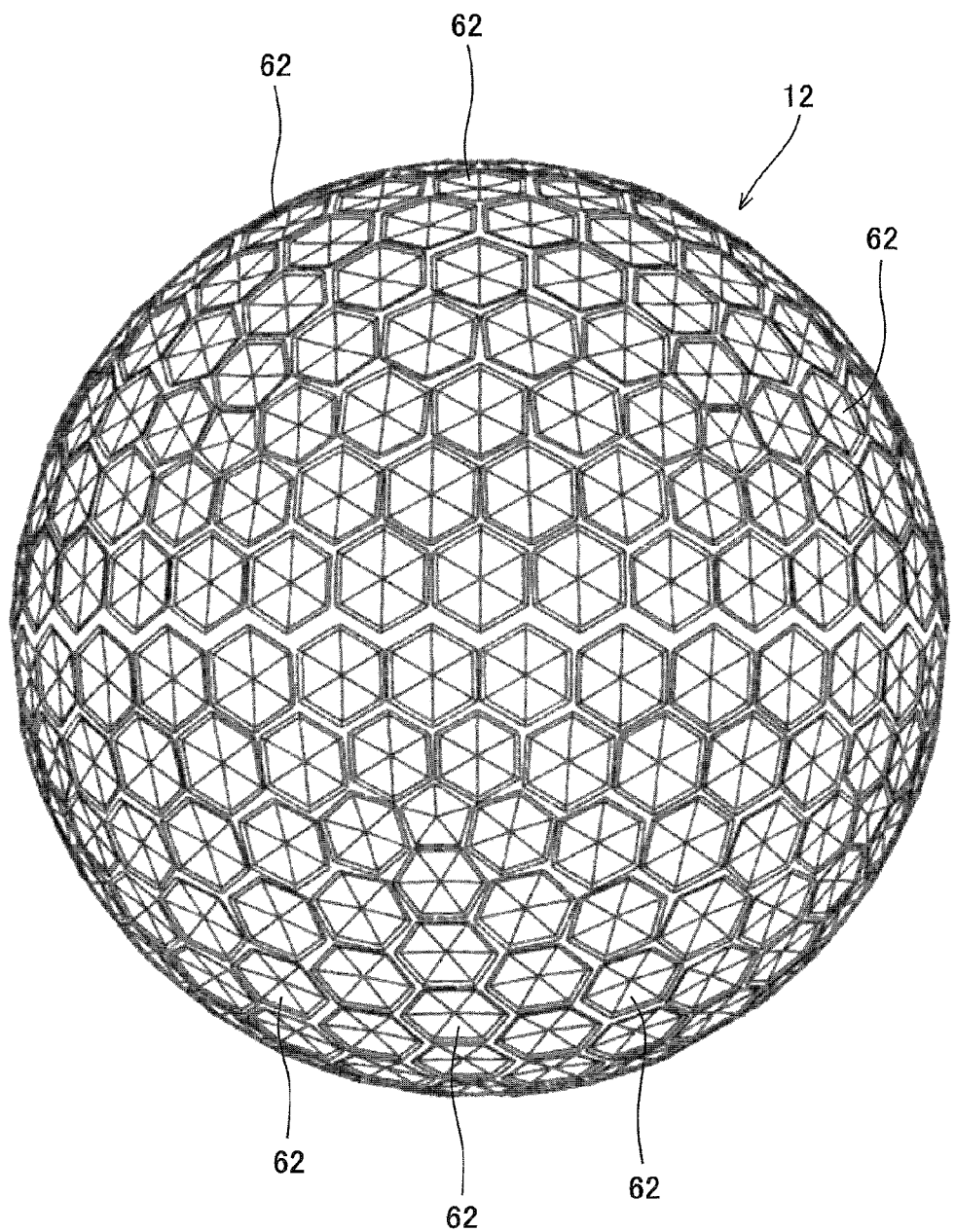
FIG. 50 is a front view of a pattern of polygons for a dimple pattern of the golf ball in FIG. 48.
Figure 51:
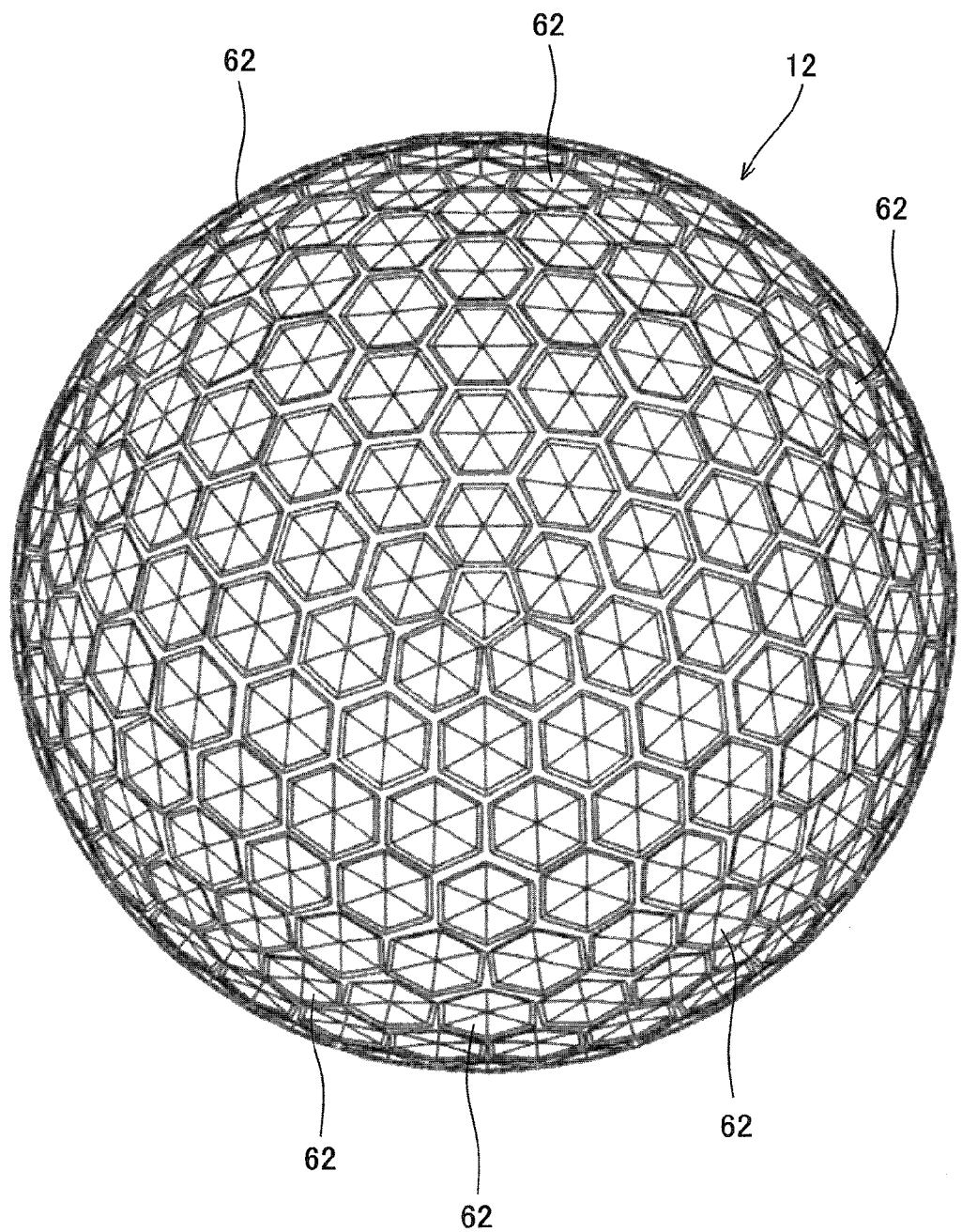
FIG. 51 is a plan view of the pattern of the polygons in FIG. 50.
Figure 52:
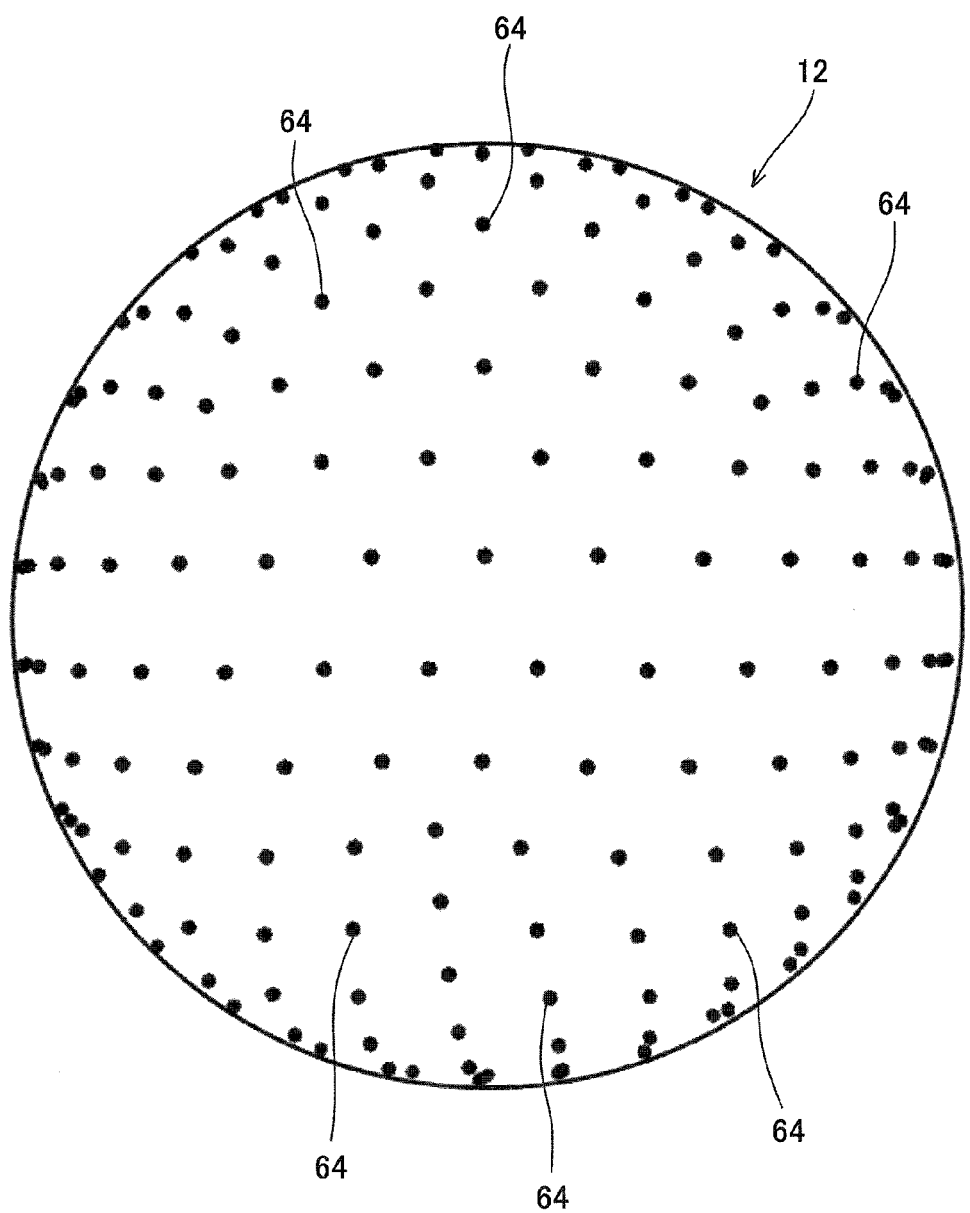
FIG. 52 is a front view showing generating points calculated from the polygons in FIG. 50.
Figure 53:
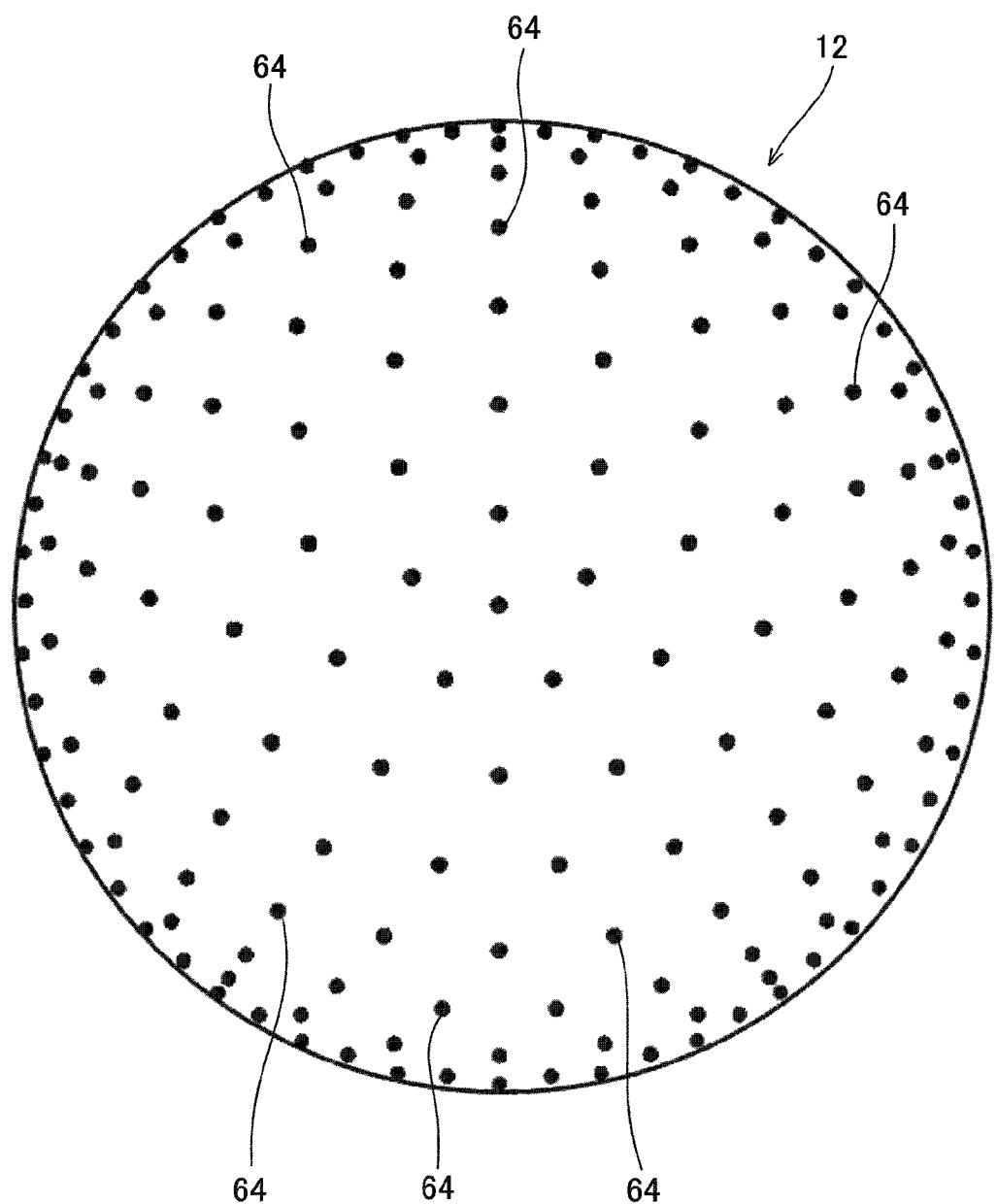
FIG. 53 is a plan view of generating points calculated from the polygons in FIG. 51.
Figure 54:
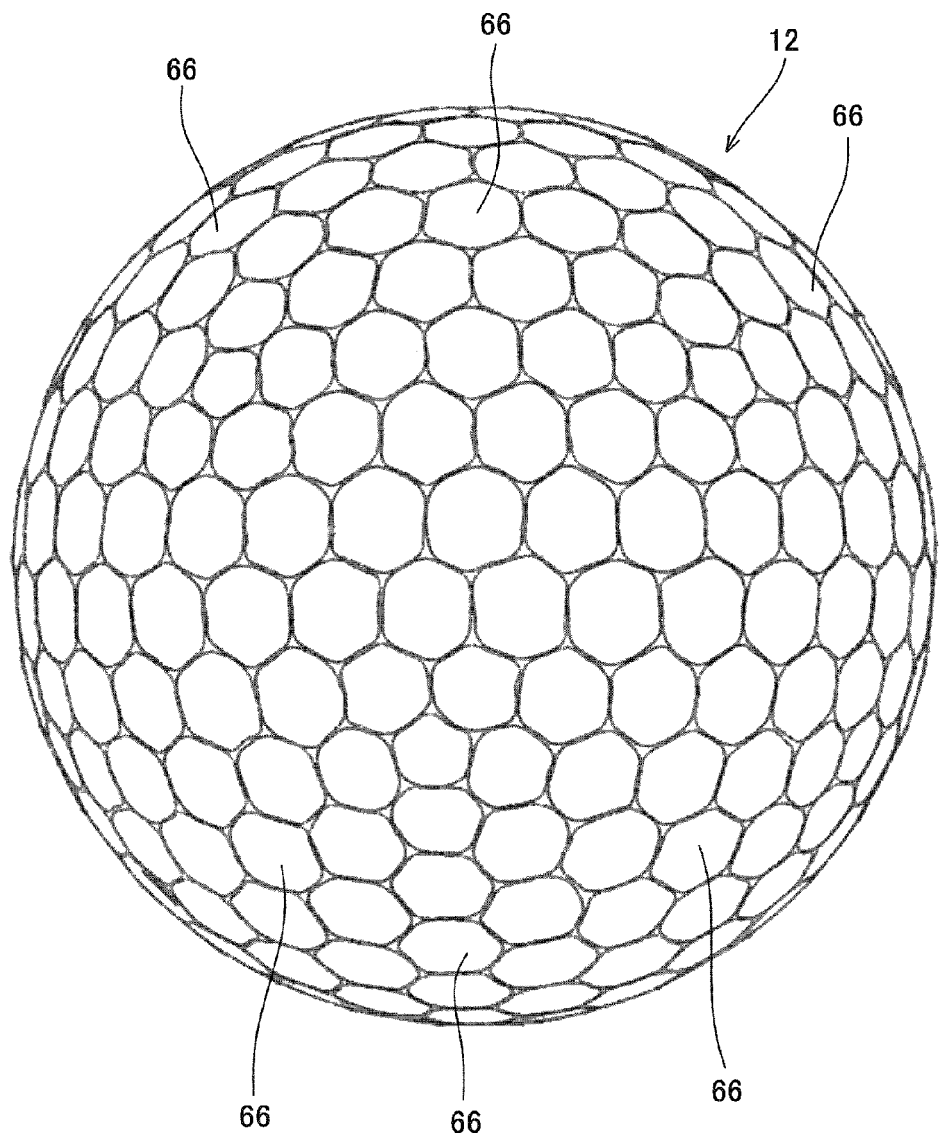
FIG. 54 is a front view of a pattern of Voronoi regions obtained based on the generating points in FIG. 52.
Figure 55:
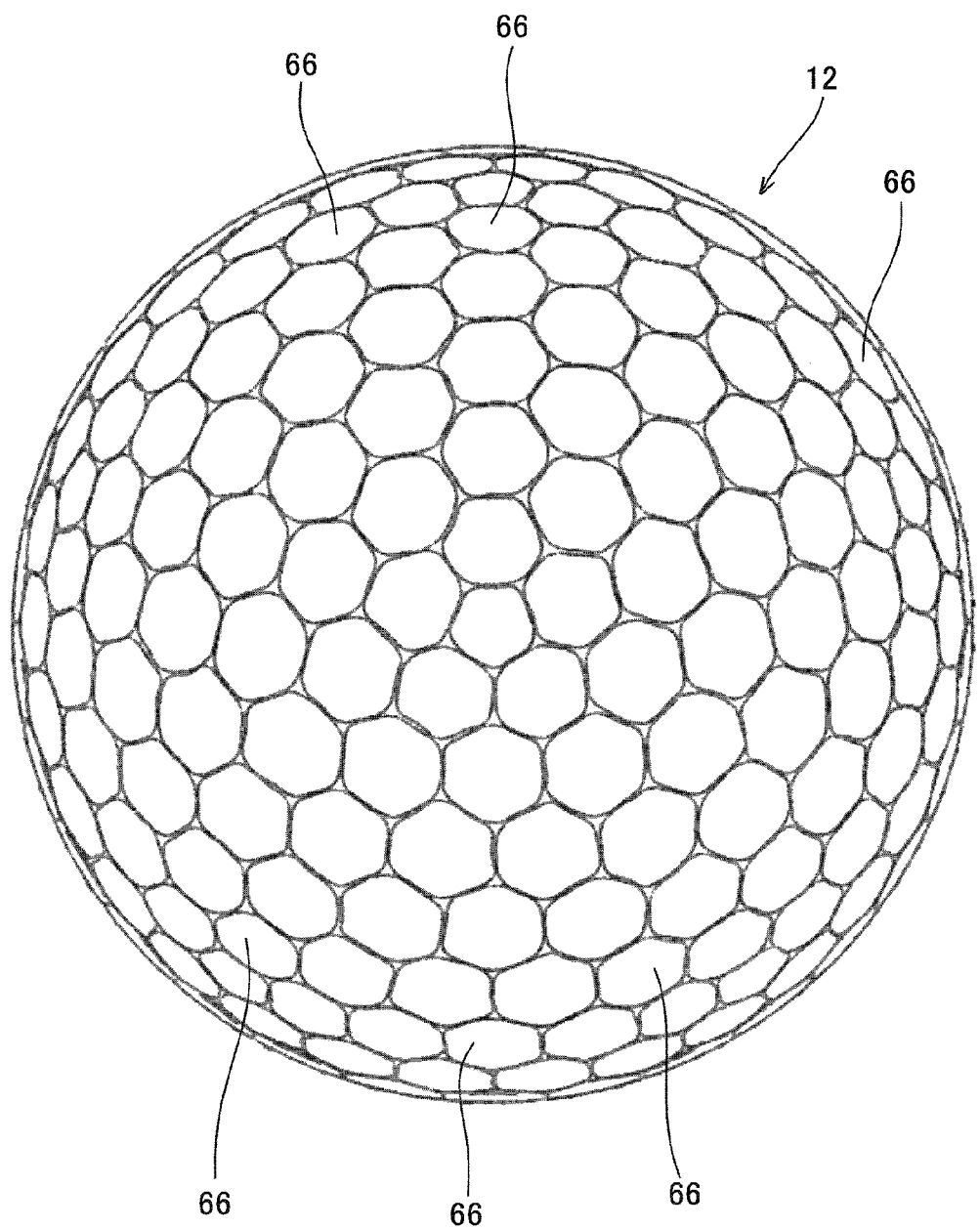
FIG. 55 is a plan view of the pattern in FIG. 54.
Figure 56:
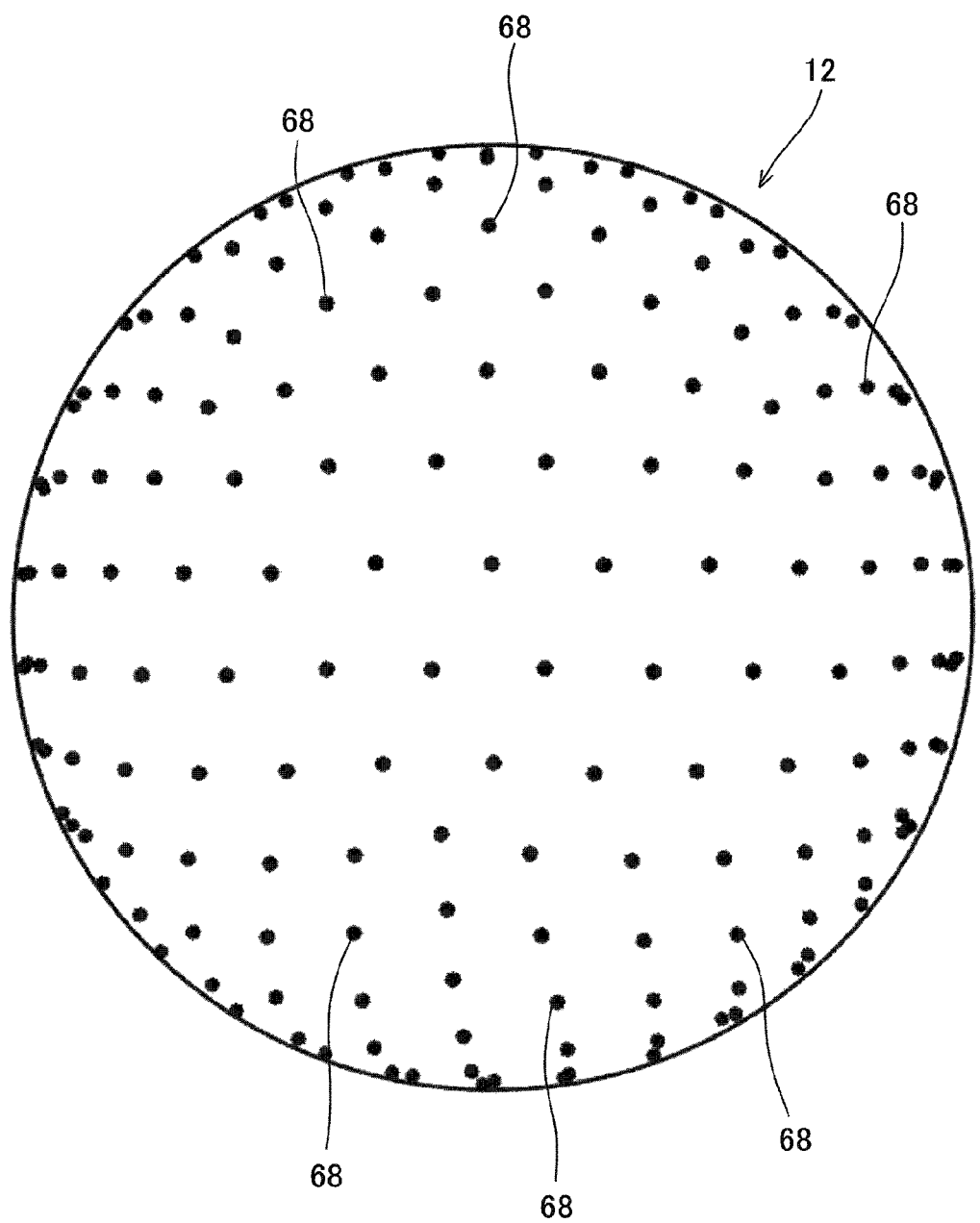
FIG. 56 is a front view showing generating points of the Voronoi regions in FIG. 54.
Figure 57:
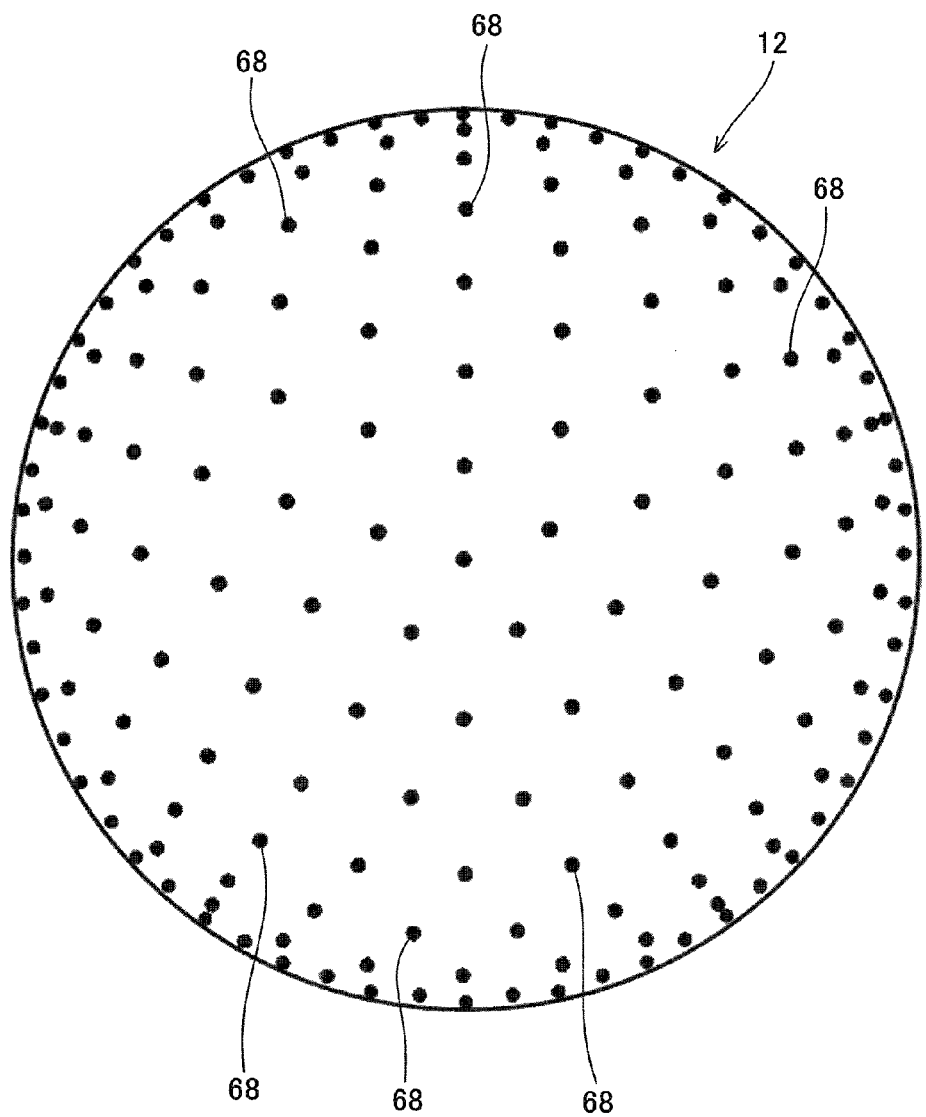
FIG. 57 is a plan view showing generating points of the Voronoi regions in FIG. 55.
Figure 58:
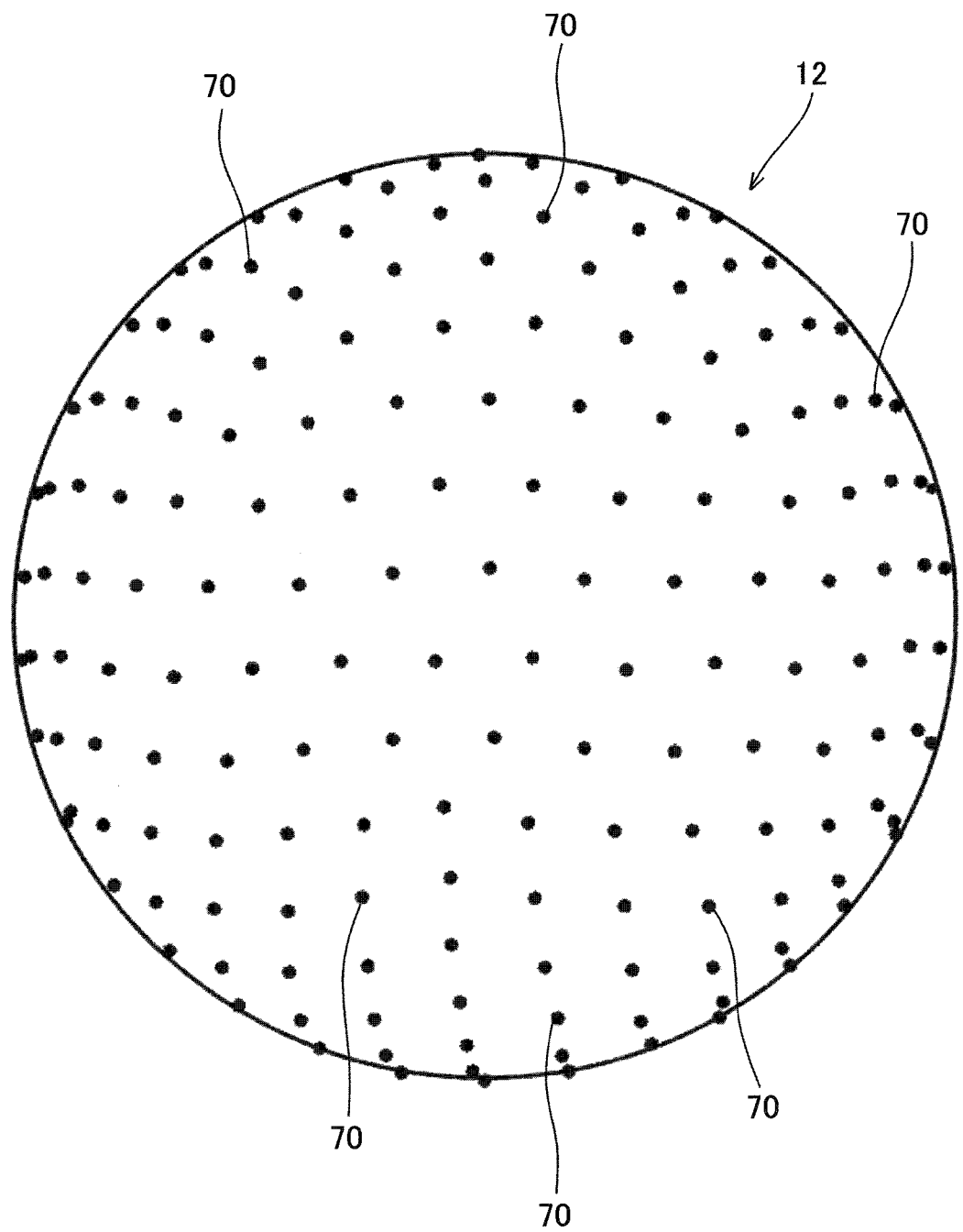
FIG. 58 is a front view showing generating points of dimples of the golf ball in FIG. 48.
Figure 59:
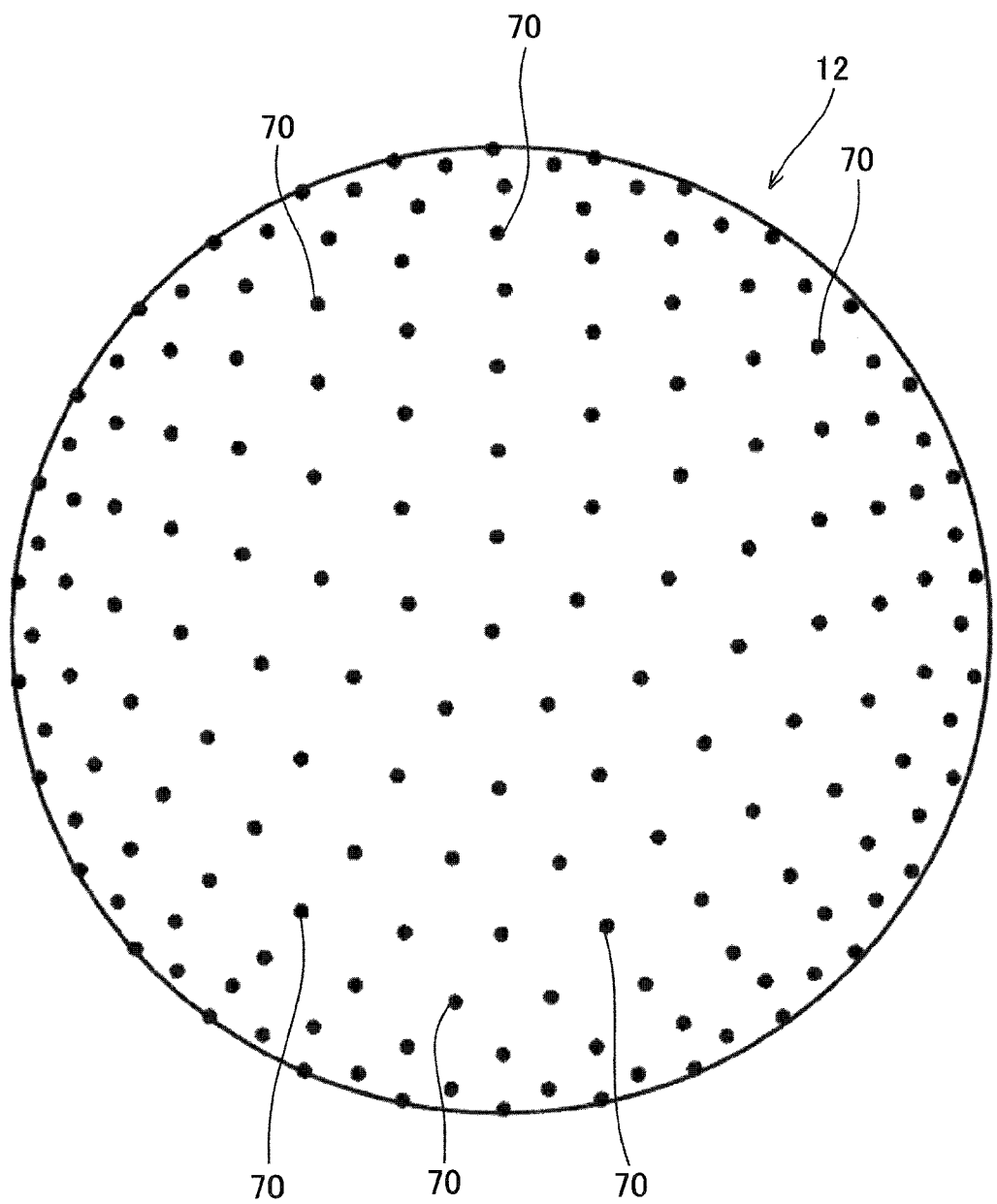
FIG. 59 is a plan view showing the generating points of the dimples of the golf ball in FIG. 49.

In order to obtain the dimples 60, as shown in FIGS. 50 and 51, a large number of polygons 62 are arranged on the surface of the phantom sphere 12. Specifically, a large number of pentagons and a large number of hexagons are arranged on the surface of the phantom sphere 12. A method for this arrangement is known. As shown in FIGS. 52 and 53, the centers of gravity 64 of these polygons 62 are calculated. As shown in FIGS. 54 and 55, a large number of Voronoi regions 66 are assumed on the phantom sphere 12 by a Voronoi tessellation with the centers of gravity 64 as generating points. As shown in FIGS. 56 and 57, the centers of gravity 68 of these Voronoi regions 66 are calculated. These centers of gravity 68 are new generating points. A large number of new Voronoi regions are assumed on the phantom sphere 12 by a Voronoi tessellation based on a large number of the new generating points. Decision of generating points and assumption of Voronoi regions are repeated. In the present embodiment, the contours of Voronoi regions obtained when the number of times n of the repetition is 30 are subjected to a process such as smoothing or the like according to need. The dimples 60 and a land are assigned to the surface of the phantom sphere 12 based on the contours after the process. A dimple pattern shown in FIGS. 48 and 49 is obtained by this assignment. The centers of gravity 70 of the dimples 60 in the pattern are shown in FIGS. 58 and 59. In the dimple pattern shown in FIGS. 48 and 49, the occupation ratio is high. In the dimple pattern, variations of the sizes of the dimples 60 are small. In the dimple pattern, the variation of the radius R of each dimple 60 is not periodic.

In the present embodiment as well, similarly to the process for designing the dimple pattern shown in FIGS. 2 and 3, the repetition of the decision of generating points and the assumption of Voronoi regions can be stopped when a predetermined condition is met.

EXAMPLES

Example 1

A rubber composition was obtained by kneading 100 parts by weight of a polybutadiene, 30 parts by weight of zinc diacrylate, 6 parts by weight of zinc oxide, 10 parts by weight of barium sulfate, 0.5 parts by weight of diphenyl disulfide, and 0.5 parts by weight of dicumyl peroxide. This rubber composition was placed into a mold including upper and lower mold halves each having a hemispherical cavity, and heated at 170° C. for 18 minutes to obtain a core with a diameter of 39.7 mm. Meanwhile, a resin composition was obtained by kneading 50 parts by weight of an ionomer resin, 50 parts by weight of another ionomer resin, and 3 parts by weight of titanium dioxide. The above core was placed into a final mold having a large number of pimples on its inside face, and the above resin composition was injected around the core by injection molding to form a cover with a thickness of 1.5 mm. A large number of dimples having a shape that is the inverted shape of the pimples were formed on the cover. A clear paint including a two-component curing type polyurethane as a base material was applied to this cover to obtain the golf ball of Example 1 with a diameter of 42.7 mm and a weight of about 45.4 g. The golf ball has a PGA compression of about 85. The golf ball has the dimple pattern shown in FIGS. 2 and 3. The specifications of the dimples are shown in Table 9 below. The dimple pattern is obtained by repeating decision of new generating points and assumption of new Voronoi regions 30 times. Changes in the specifications in the process of the repetition are shown in Tables 1 and 2 below.

Comparative Example 1

A golf ball of Comparative Example 1 was obtained in the same manner as Example 1, except the final mold was changed. The specifications of the dimples of the golf ball are shown in Table 9 below.

Example 2

The golf ball of Example 2 was obtained in the same manner as Example 1, except the final mold was changed. The specifications of the dimples of the golf ball are shown in Table 9 below. The dimple pattern is obtained by repeating decision of new generating points and assumption of new Voronoi regions 30 times. Changes in the specifications in the process of the repetition are shown in Tables 3 and 4 below.

Comparative Example 2

A golf ball of Comparative Example 2 was obtained in the same manner as Example 1, except the final mold was changed. The specifications of the dimples of the golf ball are shown in Table 9 below.

Example 3

The golf ball of Example 3 was obtained in the same manner as Example 1, except the final mold was changed. The specifications of the dimples of the golf ball are shown in Table 10 below. The dimple pattern is obtained by repeating decision of new generating points and assumption of new Voronoi regions 30 times. Changes in the specifications in the process of the repetition are shown in Tables 5 and 6 below.

Comparative Example 3

A golf ball of Comparative Example 3 was obtained in the same manner as Example 1, except the final mold was changed. The specifications of the dimples of the golf ball are shown in Table 10 below.

Example 4

The golf ball of Example 4 was obtained in the same manner as Example 1, except the final mold was changed. The specifications of the dimples of the golf ball are shown in Table 10 below. The dimple pattern is obtained by repeating decision of new generating points and assumption of new Voronoi regions 30 times. Changes in the specifications in the process of the repetition are shown in Tables 7 and 8 below.

Comparative Example 4

A golf ball of Comparative Example 4 was obtained in the same manner as Example 1, except the final mold was changed. The specifications of the dimples of the golf ball are shown in Table 10 below.

Comparative Example 5

A golf ball of Comparative Example 5 was obtained in the same manner as Example 1, except the final mold was changed. The specifications of the dimples of the golf ball are shown in Table 11 below. The shapes of the dimples of the golf ball are circles.

Comparative Example 6

A golf ball of Comparative Example 6 was obtained in the same manner as Example 1, except the final mold was changed. The specifications of the dimples of the golf ball are shown in Table 11 below. The shapes of the dimples of the golf ball are circles.

Comparative Example 7

A golf ball of Comparative Example 7 was obtained in the same manner as Example 1, except the final mold was changed. The specifications of the dimples of the golf ball are shown in Table 11 below. The shapes of the dimples of the golf ball are polygons.

In the tables below, Dif.1 represents Lmax(n)−Lmax(n−1), and Dif.2 represents Lave(n)−Lave(n−1). In the tables below, the units are as follows.

Lmax: mm
Dif.1: mm
Lave: mm
Dif.2: mm
$\sigma A$: mm$^2$
$\sigma A$/Aave: %
$\sigma D$: mm $\sigma D$/AveRave: %
Amax: mm$^2$
Aave: mm$^2$
Rhmax: mm
Rhmax/AveRave: %
R1: mm
Rhmin: mm
R2: mm
AveRave: mm

TABLE 1

Example 1/Comparative Example 1

| n | Lmax | Dif. 1 | Lave | Dif. 2 | σA | σA/Aave | σD | σD/AveRave |
|---|---|---|---|---|---|---|---|---|
| 0 |  |  |  |  | 2.147 | 15.7 | 0.333 | 15.876 |
| 1 | 0.9605 |  | 0.2377 |  | 1.798 | 13.2 | 0.273 | 13.036 |
| 2 | 0.4387 | 0.522 | 0.1204 | 0.1173 | 1.615 | 11.8 | 0.245 | 11.692 |
| 3 | 0.2931 | 0.146 | 0.0937 | 0.0267 | 1.500 | 11.0 | 0.227 | 10.809 |
| 4 | 0.2494 | 0.044 | 0.0749 | 0.0188 | 1.431 | 10.5 | 0.216 | 10.292 |
| 5 | 0.2770 | −0.028 | 0.0617 | 0.0132 | 1.384 | 10.1 | 0.210 | 10.013 |
| 6 | 0.2256 | 0.051 | 0.0540 | 0.0077 | 1.352 | 9.9 | 0.206 | 9.832 |
| 7 | 0.2420 | −0.016 | 0.0471 | 0.0069 | 1.316 | 9.6 | 0.200 | 9.524 |
| 8 | 0.1969 | 0.045 | 0.0429 | 0.0041 | 1.297 | 9.5 | 0.198 | 9.423 |
| 9 | 0.1601 | 0.037 | 0.0388 | 0.0042 | 1.266 | 9.3 | 0.192 | 9.155 |
| 10 | 0.1729 | −0.013 | 0.0379 | 0.0008 | 1.250 | 9.2 | 0.190 | 9.049 |
| 11 | 0.2644 | −0.091 | 0.0353 | 0.0026 | 1.234 | 9.0 | 0.187 | 8.918 |
| 12 | 0.1779 | 0.086 | 0.0332 | 0.0022 | 1.225 | 9.0 | 0.185 | 8.838 |
| 13 | 0.2290 | −0.051 | 0.0320 | 0.0011 | 1.223 | 9.0 | 0.186 | 8.871 |
| 14 | 0.1574 | 0.072 | 0.0309 | 0.0012 | 1.205 | 8.8 | 0.183 | 8.710 |
| 15 | 0.1900 | −0.033 | 0.0283 | 0.0026 | 1.190 | 8.7 | 0.182 | 8.665 |
| 16 | 0.1873 | 0.003 | 0.0263 | 0.0020 | 1.172 | 8.6 | 0.178 | 8.514 |
| 17 | 0.1505 | 0.037 | 0.0250 | 0.0014 | 1.157 | 8.5 | 0.176 | 8.378 |
| 18 | 0.1416 | 0.009 | 0.0230 | 0.0019 | 1.150 | 8.4 | 0.175 | 8.341 |
| 19 | 0.1250 | 0.017 | 0.0226 | 0.0005 | 1.136 | 8.3 | 0.173 | 8.271 |
| 20 | 0.1188 | 0.006 | 0.0230 | −0.0004 | 1.128 | 8.3 | 0.171 | 8.181 |
| 21 | 0.1272 | −0.008 | 0.0211 | 0.0019 | 1.123 | 8.2 | 0.171 | 8.148 |
| 22 | 0.1280 | −0.001 | 0.0210 | 0.0001 | 1.113 | 8.2 | 0.169 | 8.073 |
| 23 | 0.1110 | 0.017 | 0.0194 | 0.0016 | 1.111 | 8.1 | 0.168 | 8.016 |
| 24 | 0.1577 | −0.047 | 0.0197 | −0.0003 | 1.110 | 8.1 | 0.168 | 8.042 |
| 25 | 0.1371 | 0.021 | 0.0193 | 0.0004 | 1.111 | 8.1 | 0.169 | 8.062 |
| 26 | 0.0911 | 0.046 | 0.0169 | 0.0025 | 1.108 | 8.1 | 0.169 | 8.046 |
| 27 | 0.1343 | −0.043 | 0.0171 | −0.0002 | 1.109 | 8.1 | 0.168 | 8.006 |
| 28 | 0.1161 | 0.018 | 0.0174 | −0.0004 | 1.101 | 8.1 | 0.167 | 7.964 |
| 29 | 0.0968 | 0.019 | 0.0168 | 0.0006 | 1.102 | 8.1 | 0.167 | 7.991 |
| 30 | 0.1200 | −0.023 | 0.0156 | 0.0012 | 1.103 | 8.1 | 0.168 | 8.003 |

TABLE 2

Example 1/Comparative Example 1

| n | Amax | Aave | Rhmax | Rhmax/AveRave | R1 | Rhmin | R2 | AveRave |
|---|---|---|---|---|---|---|---|---|
| 0 | 21.108 | 13.644 | 1.9275 | 91.8133 | 2.4078 | 0.3775 | 2.1456 | 2.0993 |
| 1 | 20.133 | 13.644 | 1.7489 | 83.3754 | 2.3977 | 0.2924 | 2.2773 | 2.0977 |
| 2 | 19.667 | 13.644 | 1.6228 | 77.3869 | 2.3234 | 0.3262 | 2.0845 | 2.0970 |
| 3 | 19.217 | 13.646 | 1.5882 | 75.7367 | 2.2529 | 0.3262 | 2.0929 | 2.0970 |
| 4 | 18.963 | 13.636 | 1.4475 | 69.0586 | 2.0460 | 0.2860 | 2.0522 | 2.0960 |
| 5 | 18.890 | 13.639 | 1.3732 | 65.5334 | 2.0404 | 0.3570 | 2.1216 | 2.0954 |
| 6 | 18.858 | 13.636 | 1.3855 | 66.1243 | 2.0371 | 0.3094 | 2.0455 | 2.0953 |
| 7 | 18.627 | 13.640 | 1.3199 | 62.9767 | 2.0170 | 0.2728 | 2.1706 | 2.0958 |
| 8 | 18.535 | 13.647 | 1.2647 | 60.3318 | 2.0853 | 0.2820 | 2.0799 | 2.0963 |
| 9 | 18.140 | 13.645 | 1.3913 | 66.3657 | 2.0402 | 0.3288 | 2.2296 | 2.0964 |
| 10 | 18.217 | 13.648 | 1.2669 | 60.4173 | 2.0744 | 0.3351 | 2.1523 | 2.0969 |
| 11 | 18.089 | 13.642 | 1.2508 | 59.6863 | 2.0926 | 0.3489 | 2.2490 | 2.0957 |
| 12 | 18.063 | 13.644 | 1.2482 | 59.5331 | 2.0994 | 0.2898 | 2.1500 | 2.0967 |
| 13 | 17.935 | 13.644 | 1.2836 | 61.2439 | 2.1177 | 0.2919 | 2.1649 | 2.0958 |
| 14 | 17.778 | 13.647 | 1.3676 | 65.2578 | 2.1322 | 0.2693 | 2.1548 | 2.0957 |

TABLE 2-continued

Example 1/Comparative Example 1

| n | Amax | Aave | Rhmax | Rhmax/AveRave | R1 | Rhmin | R2 | AveRave |
|---|---|---|---|---|---|---|---|---|
| 15 | 17.638 | 13.648 | 1.3643 | 65.0913 | 2.1364 | 0.3014 | 2.1518 | 2.0960 |
| 16 | 17.505 | 13.652 | 1.3901 | 66.3105 | 2.1430 | 0.2599 | 2.1409 | 2.0963 |
| 17 | 17.470 | 13.650 | 1.3402 | 63.9462 | 2.1202 | 0.3089 | 1.8698 | 2.0958 |
| 18 | 17.504 | 13.655 | 1.2368 | 58.9952 | 2.1772 | 0.2673 | 2.0115 | 2.0964 |
| 19 | 17.504 | 13.655 | 1.1401 | 54.3876 | 2.1796 | 0.2706 | 2.0729 | 2.0962 |
| 20 | 17.504 | 13.647 | 1.1408 | 54.4597 | 2.1864 | 0.2558 | 2.1456 | 2.0947 |
| 21 | 17.504 | 13.643 | 1.1395 | 54.3894 | 2.1838 | 0.2791 | 2.0462 | 2.0950 |
| 22 | 17.390 | 13.641 | 1.2807 | 61.1445 | 2.1145 | 0.2855 | 2.0827 | 2.0945 |
| 23 | 17.372 | 13.646 | 1.2788 | 61.0471 | 2.1125 | 0.2854 | 2.0728 | 2.0947 |
| 24 | 17.369 | 13.642 | 1.2728 | 60.7669 | 2.1073 | 0.2972 | 2.1347 | 2.0946 |
| 25 | 17.410 | 13.643 | 1.2728 | 60.7621 | 2.1073 | 0.2951 | 2.1378 | 2.0948 |
| 26 | 17.454 | 13.642 | 1.2712 | 60.7011 | 2.1056 | 0.2850 | 2.0763 | 2.0942 |
| 27 | 17.423 | 13.646 | 1.2093 | 57.7230 | 2.1091 | 0.2951 | 2.1378 | 2.0950 |
| 28 | 17.320 | 13.643 | 1.2029 | 57.4345 | 2.1068 | 0.2616 | 2.0512 | 2.0943 |
| 29 | 17.198 | 13.643 | 1.2040 | 57.4816 | 2.1077 | 0.2859 | 2.1542 | 2.0946 |
| 30 | 17.298 | 13.646 | 1.2386 | 59.1234 | 2.1381 | 0.2991 | 2.0566 | 2.0950 |

TABLE 3

Example 2/Comparative Example 2

| n | Lmax | Dif. 1 | Lave | Dif. 2 | σA | σA/Aave | σD | σD/AveRave |
|---|---|---|---|---|---|---|---|---|
| 0 |  |  |  |  | 2.276 | 13.7 | 0.318 | 13.691 |
| 1 | 0.7703 |  | 0.3125 |  | 1.831 | 11.0 | 0.251 | 10.848 |
| 2 | 0.3942 | 0.376 | 0.1296 | 0.1829 | 1.642 | 9.9 | 0.225 | 9.691 |
| 3 | 0.3053 | 0.089 | 0.0928 | 0.0368 | 1.546 | 9.3 | 0.212 | 9.135 |
| 4 | 0.2575 | 0.048 | 0.0742 | 0.0186 | 1.499 | 9.0 | 0.204 | 8.807 |
| 5 | 0.2362 | 0.021 | 0.0636 | 0.0106 | 1.462 | 8.8 | 0.199 | 8.596 |
| 6 | 0.2163 | 0.020 | 0.0571 | 0.0065 | 1.432 | 8.6 | 0.195 | 8.437 |
| 7 | 0.1794 | 0.037 | 0.0505 | 0.0067 | 1.419 | 8.5 | 0.193 | 8.342 |
| 8 | 0.4710 | −0.292 | 0.0465 | 0.0040 | 1.387 | 8.3 | 0.190 | 8.222 |
| 9 | 0.1502 | 0.321 | 0.0432 | 0.0033 | 1.379 | 8.3 | 0.188 | 8.111 |
| 10 | 0.1704 | −0.020 | 0.0381 | 0.0051 | 1.365 | 8.2 | 0.186 | 8.057 |
| 11 | 0.1631 | 0.007 | 0.0343 | 0.0038 | 1.353 | 8.1 | 0.185 | 8.005 |
| 12 | 0.1487 | 0.014 | 0.0331 | 0.0012 | 1.353 | 8.1 | 0.186 | 8.030 |
| 13 | 0.1268 | 0.022 | 0.0304 | 0.0027 | 1.340 | 8.1 | 0.183 | 7.902 |
| 14 | 0.1229 | 0.004 | 0.0284 | 0.0020 | 1.336 | 8.0 | 0.184 | 7.953 |
| 15 | 0.1239 | −0.001 | 0.0270 | 0.0014 | 1.326 | 8.0 | 0.182 | 7.842 |
| 16 | 0.1147 | 0.009 | 0.0271 | −0.0001 | 1.317 | 7.9 | 0.180 | 7.779 |
| 17 | 0.1153 | −0.001 | 0.0245 | 0.0025 | 1.316 | 7.9 | 0.181 | 7.804 |
| 18 | 0.1378 | −0.022 | 0.0243 | 0.0002 | 1.325 | 8.0 | 0.182 | 7.857 |
| 19 | 0.1282 | 0.010 | 0.0229 | 0.0014 | 1.320 | 7.9 | 0.181 | 7.817 |
| 20 | 0.1077 | 0.020 | 0.0206 | 0.0023 | 1.318 | 7.9 | 0.180 | 7.793 |
| 21 | 0.1290 | −0.021 | 0.0184 | 0.0022 | 1.310 | 7.9 | 0.179 | 7.753 |
| 22 | 0.0980 | 0.031 | 0.0171 | 0.0013 | 1.306 | 7.9 | 0.179 | 7.731 |
| 23 | 0.1270 | −0.029 | 0.0169 | 0.0002 | 1.306 | 7.8 | 0.179 | 7.722 |
| 24 | 0.1215 | 0.005 | 0.0156 | 0.0014 | 1.307 | 7.8 | 0.179 | 7.753 |
| 25 | 0.1147 | 0.007 | 0.0157 | −0.0001 | 1.304 | 7.8 | 0.179 | 7.718 |
| 26 | 0.1156 | −0.001 | 0.0148 | 0.0009 | 1.293 | 7.8 | 0.178 | 7.677 |
| 27 | 0.1068 | 0.009 | 0.0146 | 0.0002 | 1.298 | 7.8 | 0.177 | 7.665 |
| 28 | 0.1029 | 0.004 | 0.0144 | 0.0002 | 1.289 | 7.7 | 0.177 | 7.642 |
| 29 | 0.0992 | 0.004 | 0.0152 | −0.0008 | 1.275 | 7.7 | 0.175 | 7.578 |
| 30 | 0.0972 | 0.002 | 0.0155 | −0.0003 | 1.275 | 7.7 | 0.175 | 7.578 |

TABLE 4

Example 2/Comparative Example 2

| n | Amax | Aave | Rhmax | Rhmax/AveRave | R1 | Rhmin | R2 | AveRave |
|---|---|---|---|---|---|---|---|---|
| 0 | 23.444 | 16.632 | 1.9168 | 82.5966 | 2.5076 | 0.4171 | 1.9787 | 2.3207 |
| 1 | 21.185 | 16.636 | 1.5252 | 65.7947 | 2.5111 | 0.3620 | 2.2238 | 2.3181 |
| 2 | 20.827 | 16.641 | 1.5383 | 66.3656 | 2.3110 | 0.3391 | 2.4840 | 2.3179 |
| 3 | 20.732 | 16.640 | 1.4048 | 60.6310 | 2.3035 | 0.3804 | 2.4354 | 2.3169 |
| 4 | 20.491 | 16.636 | 1.4048 | 60.6679 | 2.3020 | 0.3154 | 2.4545 | 2.3156 |
| 5 | 20.221 | 16.642 | 1.3605 | 58.7352 | 2.3121 | 0.3123 | 2.1820 | 2.3163 |
| 6 | 20.316 | 16.641 | 1.3038 | 56.2957 | 2.3052 | 0.4112 | 2.4286 | 2.3160 |
| 7 | 20.220 | 16.638 | 1.3909 | 60.0575 | 2.1874 | 0.3777 | 2.1918 | 2.3159 |
| 8 | 20.254 | 16.633 | 1.3595 | 58.7020 | 2.3015 | 0.3790 | 2.1991 | 2.3159 |
| 9 | 20.276 | 16.631 | 1.2656 | 54.6611 | 2.3034 | 0.3986 | 2.2041 | 2.3154 |
| 10 | 20.089 | 16.635 | 1.3497 | 58.3171 | 2.2976 | 0.3844 | 2.3828 | 2.3145 |
| 11 | 20.085 | 16.636 | 1.3675 | 59.0652 | 2.2950 | 0.3389 | 2.3600 | 2.3153 |
| 12 | 20.288 | 16.641 | 1.2676 | 54.7492 | 2.2953 | 0.3458 | 2.3711 | 2.3152 |
| 13 | 20.244 | 16.641 | 1.2787 | 55.2354 | 2.2717 | 0.3893 | 2.4026 | 2.3149 |
| 14 | 20.302 | 16.642 | 1.1869 | 51.2646 | 2.3399 | 0.3893 | 2.4026 | 2.3152 |
| 15 | 20.098 | 16.647 | 1.1987 | 51.7607 | 2.4104 | 0.4189 | 2.3688 | 2.3159 |
| 16 | 20.009 | 16.641 | 1.1844 | 51.1692 | 2.3857 | 0.4016 | 2.1865 | 2.3146 |
| 17 | 20.314 | 16.644 | 1.2162 | 52.5479 | 2.4136 | 0.3834 | 2.4012 | 2.3145 |
| 18 | 20.252 | 16.640 | 1.2072 | 52.1670 | 2.4119 | 0.4134 | 2.3933 | 2.3142 |
| 19 | 20.151 | 16.646 | 1.1392 | 49.2138 | 2.3554 | 0.3293 | 2.5090 | 2.3148 |
| 20 | 20.142 | 16.656 | 1.1601 | 50.0987 | 2.3554 | 0.3275 | 2.5072 | 2.3157 |
| 21 | 20.065 | 16.646 | 1.1686 | 50.4820 | 2.2542 | 0.3253 | 2.4953 | 2.3148 |
| 22 | 20.006 | 16.651 | 1.1255 | 48.6127 | 2.3650 | 0.3987 | 2.3509 | 2.3152 |

TABLE 4-continued

Example 2/Comparative Example 2

| n | Amax | Aave | Rhmax | Rhmax/AveRave | R1 | Rhmin | R2 | AveRave |
|---|---|---|---|---|---|---|---|---|
| 23 | 19.956 | 16.648 | 1.2513 | 54.0588 | 2.3798 | 0.3299 | 2.5056 | 2.3146 |
| 24 | 19.983 | 16.644 | 1.1863 | 51.2538 | 2.2669 | 0.3700 | 2.5182 | 2.3145 |
| 25 | 19.983 | 16.644 | 1.2718 | 54.9514 | 2.3804 | 0.3635 | 2.5218 | 2.3145 |
| 26 | 20.017 | 16.645 | 1.1453 | 49.4772 | 2.3985 | 0.3540 | 2.1664 | 2.3147 |
| 27 | 20.119 | 16.646 | 1.2079 | 52.1949 | 2.3880 | 0.2989 | 2.1813 | 2.3143 |
| 28 | 20.149 | 16.649 | 1.2219 | 52.8013 | 2.3738 | 0.2906 | 2.1850 | 2.3142 |
| 29 | 20.149 | 16.644 | 1.1651 | 50.3484 | 2.3803 | 0.3007 | 2.1840 | 2.3141 |
| 30 | 20.149 | 16.644 | 1.1651 | 50.3484 | 2.3803 | 0.3007 | 2.1840 | 2.3141 |

TABLE 5

Example 3/Comparative Example 3

| n | Lmax | Dif. 1 | Lave | Dif. 2 | σA | σA/Aave | σD | σD/AveRave |
|---|---|---|---|---|---|---|---|---|
| 0 |  |  |  |  | 1.192 | 7.6 | 0.171 | 7.650 |
| 1 | 0.2359 |  | 0.1098 |  | 1.061 | 6.8 | 0.154 | 6.856 |
| 2 | 0.1531 | 0.083 | 0.0442 | 0.0656 | 0.992 | 6.4 | 0.143 | 6.398 |
| 3 | 0.1269 | 0.026 | 0.0331 | 0.0111 | 0.952 | 6.1 | 0.137 | 6.128 |
| 4 | 0.1185 | 0.008 | 0.0292 | 0.0039 | 0.931 | 6.0 | 0.134 | 5.994 |
| 5 | 0.1747 | −0.056 | 0.0240 | 0.0052 | 0.915 | 5.9 | 0.132 | 5.905 |
| 6 | 0.0831 | 0.092 | 0.0206 | 0.0034 | 0.915 | 5.9 | 0.133 | 5.924 |
| 7 | 0.0881 | −0.005 | 0.0159 | 0.0047 | 0.904 | 5.8 | 0.131 | 5.835 |
| 8 | 0.0988 | −0.011 | 0.0145 | 0.0014 | 0.887 | 5.7 | 0.129 | 5.747 |
| 9 | 0.1264 | −0.028 | 0.0140 | 0.0004 | 0.879 | 5.6 | 0.127 | 5.680 |
| 10 | 0.0898 | 0.037 | 0.0126 | 0.0015 | 0.880 | 5.6 | 0.127 | 5.670 |
| 11 | 0.0805 | 0.009 | 0.0122 | 0.0004 | 0.870 | 5.6 | 0.125 | 5.600 |
| 12 | 0.0709 | 0.010 | 0.0110 | 0.0012 | 0.875 | 5.6 | 0.127 | 5.648 |
| 13 | 0.092 | −0.021 | 0.0097 | 0.0013 | 0.873 | 5.6 | 0.126 | 5.627 |
| 14 | 0.0812 | 0.011 | 0.0084 | 0.0013 | 0.872 | 5.6 | 0.125 | 5.583 |
| 15 | 0.0653 | 0.016 | 0.0083 | 0.0001 | 0.873 | 5.6 | 0.126 | 5.610 |
| 16 | 0.0746 | −0.009 | 0.0083 | 0.0001 | 0.867 | 5.5 | 0.125 | 5.561 |
| 17 | 0.0827 | −0.008 | 0.0084 | −0.0002 | 0.867 | 5.5 | 0.125 | 5.563 |
| 18 | 0.0805 | 0.002 | 0.0071 | 0.0014 | 0.871 | 5.6 | 0.125 | 5.567 |
| 19 | 0.0752 | 0.005 | 0.0068 | 0.0003 | 0.862 | 5.5 | 0.124 | 5.533 |
| 20 | 0.0761 | −0.001 | 0.0069 | −0.0001 | 0.858 | 5.5 | 0.124 | 5.517 |
| 21 | 0.0732 | 0.003 | 0.0064 | 0.0004 | 0.855 | 5.5 | 0.123 | 5.499 |
| 22 | 0.0735 | 0.000 | 0.0062 | 0.0003 | 0.859 | 5.5 | 0.123 | 5.510 |
| 23 | 0.0841 | −0.011 | 0.0053 | 0.0008 | 0.860 | 5.5 | 0.123 | 5.506 |
| 24 | 0.0602 | 0.024 | 0.0052 | 0.0001 | 0.861 | 5.5 | 0.123 | 5.503 |
| 25 | 0.0714 | −0.011 | 0.0050 | 0.0002 | 0.861 | 5.5 | 0.124 | 5.516 |
| 26 | 0.0964 | −0.025 | 0.0046 | 0.0004 | 0.862 | 5.5 | 0.124 | 5.527 |
| 27 | 0.0702 | 0.026 | 0.0041 | 0.0005 | 0.864 | 5.5 | 0.124 | 5.556 |
| 28 | 0.0714 | −0.001 | 0.0041 | 0.0001 | 0.867 | 5.5 | 0.125 | 5.559 |
| 29 | 0.0661 | 0.005 | 0.0047 | −0.0006 | 0.867 | 5.5 | 0.125 | 5.585 |
| 30 | 0.0621 | 0.004 | 0.0043 | 0.0004 | 0.871 | 5.6 | 0.125 | 5.594 |

TABLE 6

Example 3/Comparative Example 3

| n | Amax | Aave | Rhmax | Rhmax/AveRave | R1 | Rhmin | R2 | AveRave |
|---|---|---|---|---|---|---|---|---|
| 0 | 18.601 | 15.637 | 0.9734 | 43.4285 | 2.2657 | 0.2407 | 2.1636 | 2.2413 |
| 1 | 18.462 | 15.623 | 1.0649 | 47.5301 | 2.2254 | 0.2248 | 2.1915 | 2.2404 |
| 2 | 18.239 | 15.616 | 0.9678 | 43.2148 | 2.2100 | 0.2557 | 2.2064 | 2.2396 |
| 3 | 18.233 | 15.623 | 0.9973 | 44.5155 | 2.2250 | 0.2716 | 2.1422 | 2.2403 |
| 4 | 18.416 | 15.615 | 1.0263 | 45.8258 | 2.2273 | 0.2682 | 2.2177 | 2.2395 |
| 5 | 18.370 | 15.618 | 0.9222 | 41.1768 | 2.2390 | 0.2316 | 2.1433 | 2.2397 |
| 6 | 18.356 | 15.617 | 0.9708 | 43.3485 | 2.2338 | 0.2775 | 2.1539 | 2.2395 |
| 7 | 18.356 | 15.619 | 0.9708 | 43.3364 | 2.2338 | 0.2665 | 2.2660 | 2.2402 |
| 8 | 18.399 | 15.619 | 1.0302 | 45.9809 | 2.2329 | 0.2752 | 2.2236 | 2.2404 |
| 9 | 18.429 | 15.620 | 1.0550 | 47.0928 | 2.2282 | 0.2525 | 2.1213 | 2.2402 |
| 10 | 18.347 | 15.625 | 0.9389 | 41.9024 | 2.2338 | 0.2647 | 2.3029 | 2.2406 |
| 11 | 18.274 | 15.622 | 1.0123 | 45.1850 | 2.2000 | 0.2705 | 2.1638 | 2.2403 |
| 12 | 18.155 | 15.623 | 1.0018 | 44.7142 | 2.1944 | 0.2812 | 2.2189 | 2.2404 |
| 13 | 18.183 | 15.624 | 1.0011 | 44.6855 | 2.1925 | 0.2938 | 2.2214 | 2.2404 |
| 14 | 18.141 | 15.627 | 0.9955 | 44.4250 | 2.2140 | 0.2361 | 2.2785 | 2.2408 |
| 15 | 18.141 | 15.626 | 0.9955 | 44.4306 | 2.2140 | 0.2187 | 2.2746 | 2.2405 |
| 16 | 18.111 | 15.625 | 1.0573 | 47.1882 | 2.2467 | 0.2435 | 2.1803 | 2.2405 |
| 17 | 18.180 | 15.626 | 0.9972 | 44.5100 | 2.1606 | 0.2711 | 2.2832 | 2.2404 |
| 18 | 18.180 | 15.627 | 1.0308 | 46.0104 | 2.1903 | 0.2267 | 2.2894 | 2.2404 |
| 19 | 18.099 | 15.629 | 1.0286 | 45.9089 | 2.1901 | 0.2429 | 2.2860 | 2.2406 |
| 20 | 18.092 | 15.628 | 1.0270 | 45.8409 | 2.1930 | 0.2429 | 2.2860 | 2.2404 |
| 21 | 17.964 | 15.629 | 1.0239 | 45.6969 | 2.1951 | 0.2654 | 2.2811 | 2.2407 |
| 22 | 17.964 | 15.629 | 1.0239 | 45.6989 | 2.1951 | 0.2644 | 2.2811 | 2.2406 |
| 23 | 17.994 | 15.628 | 1.0239 | 45.6953 | 2.1951 | 0.2619 | 2.2094 | 2.2408 |
| 24 | 17.994 | 15.630 | 1.0239 | 45.6903 | 2.1951 | 0.2510 | 2.2197 | 2.2411 |
| 25 | 17.994 | 15.630 | 1.0239 | 45.6933 | 2.1951 | 0.2544 | 2.1791 | 2.2409 |
| 26 | 17.994 | 15.631 | 1.0239 | 45.6900 | 2.1951 | 0.2604 | 2.1809 | 2.2411 |
| 27 | 17.994 | 15.630 | 1.0239 | 45.6988 | 2.1951 | 0.2618 | 2.1790 | 2.2406 |

TABLE 6-continued

Example 3/Comparative Example 3

| n | Amax | Aave | Rhmax | Rhmax/AveRave | R1 | Rhmin | R2 | AveRave |
|---|---|---|---|---|---|---|---|---|
| 28 | 17.994 | 15.629 | 1.0239 | 45.6949 | 2.1951 | 0.2930 | 2.1686 | 2.2408 |
| 29 | 17.994 | 15.628 | 1.0239 | 45.7038 | 2.1951 | 0.2930 | 2.1686 | 2.2404 |
| 30 | 18.024 | 15.627 | 1.0239 | 45.7015 | 2.1951 | 0.2858 | 2.2303 | 2.2405 |

TABLE 7

Example 4/Comparative Example 4

| n | Lmax | Dif. 1 | Lave | Dif. 2 | $\sigma A$ | $\sigma A$/Aave | $\sigma D$ | $\sigma D$/AveRave |
|---|---|---|---|---|---|---|---|---|
| 0 |  |  |  |  | 1.946 | 12.0 | 0.287 | 12.613 |
| 1 | 0.2825 |  | 0.1696 |  | 1.602 | 9.9 | 0.234 | 10.255 |
| 2 | 0.1889 | 0.094 | 0.0657 | 0.1039 | 1.404 | 8.7 | 0.203 | 8.924 |
| 3 | 0.1484 | 0.041 | 0.0469 | 0.0188 | 1.267 | 7.8 | 0.183 | 8.011 |
| 4 | 0.1118 | 0.037 | 0.0366 | 0.0103 | 1.172 | 7.2 | 0.169 | 7.403 |
| 5 | 0.1086 | 0.003 | 0.0286 | 0.0080 | 1.108 | 6.8 | 0.159 | 6.973 |
| 6 | 0.1248 | −0.016 | 0.0230 | 0.0056 | 1.062 | 6.5 | 0.151 | 6.631 |
| 7 | 0.117 | 0.008 | 0.0194 | 0.0036 | 1.037 | 6.4 | 0.148 | 6.486 |
| 8 | 0.1218 | −0.005 | 0.0172 | 0.0022 | 1.010 | 6.2 | 0.144 | 6.292 |
| 9 | 0.112 | 0.010 | 0.0146 | 0.0027 | 0.999 | 6.2 | 0.142 | 6.215 |
| 10 | 0.0771 | 0.035 | 0.0125 | 0.0021 | 0.991 | 6.1 | 0.141 | 6.184 |
| 11 | 0.153 | −0.076 | 0.0113 | 0.0012 | 0.986 | 6.1 | 0.140 | 6.142 |
| 12 | 0.0927 | 0.060 | 0.0091 | 0.0022 | 0.978 | 6.0 | 0.139 | 6.108 |
| 13 | 0.0848 | 0.008 | 0.0090 | 0.0001 | 0.976 | 6.0 | 0.139 | 6.091 |
| 14 | 0.1412 | −0.056 | 0.0086 | 0.0005 | 0.972 | 6.0 | 0.138 | 6.065 |
| 15 | 0.0901 | 0.051 | 0.0076 | 0.0010 | 0.967 | 6.0 | 0.137 | 6.018 |
| 16 | 0.0758 | 0.014 | 0.0070 | 0.0006 | 0.961 | 5.9 | 0.136 | 5.955 |
| 17 | 0.0788 | −0.003 | 0.0068 | 0.0002 | 0.958 | 5.9 | 0.136 | 5.963 |
| 18 | 0.1434 | −0.065 | 0.0065 | 0.0003 | 0.955 | 5.9 | 0.136 | 5.966 |
| 19 | 0.097 | 0.046 | 0.0059 | 0.0006 | 0.950 | 5.9 | 0.135 | 5.910 |
| 20 | 0.0629 | 0.034 | 0.0061 | −0.0002 | 0.948 | 5.8 | 0.135 | 5.911 |
| 21 | 0.0547 | 0.008 | 0.0055 | 0.0006 | 0.945 | 5.8 | 0.134 | 5.898 |
| 22 | 0.1505 | −0.096 | 0.0064 | −0.0009 | 0.944 | 5.8 | 0.135 | 5.912 |
| 23 | 0.102 | 0.048 | 0.0061 | 0.0004 | 0.941 | 5.8 | 0.135 | 5.900 |
| 24 | 0.0699 | 0.032 | 0.0052 | 0.0009 | 0.936 | 5.8 | 0.134 | 5.858 |
| 25 | 0.0603 | 0.010 | 0.0049 | 0.0002 | 0.935 | 5.8 | 0.134 | 5.862 |
| 26 | 0.135 | −0.075 | 0.0055 | −0.0005 | 0.934 | 5.8 | 0.133 | 5.823 |
| 27 | 0.0741 | 0.061 | 0.0053 | 0.0002 | 0.934 | 5.8 | 0.133 | 5.816 |
| 28 | 0.0568 | 0.017 | 0.0050 | 0.0003 | 0.935 | 5.8 | 0.133 | 5.828 |
| 29 | 0.067 | −0.010 | 0.0054 | −0.0004 | 0.938 | 5.8 | 0.134 | 5.854 |
| 30 | 0.1369 | −0.070 | 0.0057 | −0.0003 | 0.936 | 5.8 | 0.133 | 5.814 |

TABLE 8

Example 4/Comparative Example 4

| n | Amax | Aave | Rhmax | Rhmax/AveRave | R1 | Rhmin | R2 | AveRave |
|---|---|---|---|---|---|---|---|---|
| 0 | 19.002 | 16.221 | 0.7471 | 32.7967 | 2.3583 | 0.2299 | 2.0973 | 2.2780 |
| 1 | 18.599 | 16.224 | 0.7299 | 32.0170 | 2.3983 | 0.2711 | 2.2983 | 2.2796 |
| 2 | 18.411 | 16.221 | 0.7398 | 32.4450 | 2.3966 | 0.2515 | 2.2383 | 2.2802 |
| 3 | 18.512 | 16.223 | 0.7488 | 32.8381 | 2.1562 | 0.2475 | 2.2403 | 2.2802 |
| 4 | 18.324 | 16.222 | 0.7649 | 33.5465 | 2.3283 | 0.2650 | 2.3686 | 2.2802 |
| 5 | 18.170 | 16.226 | 0.8384 | 36.7566 | 2.2192 | 0.2504 | 2.3214 | 2.2810 |
| 6 | 18.214 | 16.225 | 0.7516 | 32.9534 | 2.1971 | 0.2711 | 1.9736 | 2.2809 |
| 7 | 18.181 | 16.220 | 0.7961 | 34.9088 | 2.2528 | 0.2971 | 1.9845 | 2.2806 |
| 8 | 18.223 | 16.223 | 0.7824 | 34.3033 | 2.2615 | 0.2990 | 2.2462 | 2.2808 |
| 9 | 18.139 | 16.221 | 0.7716 | 33.8346 | 2.2956 | 0.2839 | 2.2838 | 2.2806 |
| 10 | 18.142 | 16.221 | 0.8068 | 35.3799 | 2.3558 | 0.2871 | 2.2745 | 2.2804 |
| 11 | 18.112 | 16.219 | 0.8031 | 35.2222 | 2.3591 | 0.2871 | 2.2745 | 2.2801 |
| 12 | 18.112 | 16.222 | 0.8455 | 37.0731 | 2.2771 | 0.2712 | 2.3148 | 2.2805 |
| 13 | 18.112 | 16.224 | 0.7685 | 33.7026 | 2.3004 | 0.2543 | 2.3261 | 2.2804 |
| 14 | 18.027 | 16.225 | 0.7794 | 34.1733 | 2.3607 | 0.2535 | 2.3289 | 2.2808 |
| 15 | 18.027 | 16.226 | 0.7794 | 34.1694 | 2.3607 | 0.2535 | 2.3289 | 2.2811 |
| 16 | 18.036 | 16.228 | 0.7794 | 34.1710 | 2.3607 | 0.2535 | 2.3289 | 2.2810 |
| 17 | 18.027 | 16.228 | 0.8045 | 35.2720 | 2.2507 | 0.2535 | 2.3289 | 2.2807 |
| 18 | 18.027 | 16.227 | 0.9111 | 39.9466 | 2.2713 | 0.2540 | 2.3294 | 2.2809 |
| 19 | 17.984 | 16.224 | 0.9111 | 39.9543 | 2.2713 | 0.2529 | 2.3337 | 2.2805 |
| 20 | 18.076 | 16.225 | 0.7685 | 33.6945 | 2.3004 | 0.2752 | 2.3343 | 2.2809 |
| 21 | 18.063 | 16.225 | 0.9058 | 39.7231 | 2.2623 | 0.2738 | 2.2813 | 2.2803 |
| 22 | 18.066 | 16.226 | 0.9298 | 40.7703 | 2.2584 | 0.2738 | 2.2813 | 2.2805 |
| 23 | 17.914 | 16.230 | 0.9298 | 40.7679 | 2.2584 | 0.2601 | 2.4037 | 2.2807 |
| 24 | 17.975 | 16.227 | 0.9298 | 40.7672 | 2.2584 | 0.2738 | 2.2813 | 2.2807 |
| 25 | 18.032 | 16.227 | 0.9012 | 39.5166 | 2.2770 | 0.2738 | 2.2813 | 2.2807 |
| 26 | 18.106 | 16.227 | 0.9012 | 39.5149 | 2.2770 | 0.2624 | 2.4167 | 2.2808 |
| 27 | 18.106 | 16.229 | 0.9298 | 40.7671 | 2.2584 | 0.2624 | 2.4167 | 2.2807 |
| 28 | 18.106 | 16.227 | 0.9298 | 40.7683 | 2.2584 | 0.2624 | 2.4167 | 2.2806 |
| 29 | 18.147 | 16.225 | 0.9012 | 39.5168 | 2.2770 | 0.2634 | 2.4192 | 2.2807 |
| 30 | 18.068 | 16.225 | 0.9012 | 39.5144 | 2.2770 | 0.2528 | 2.4121 | 2.2808 |

TABLE 9

Specifications of Dimples

|  | Comp. Ex. 1 | Ex. 1 | Comp. Ex. 2 | Ex. 2 |
|---|---|---|---|---|
| Front view | FIG. 12 | FIG. 2 | FIG. 30 | FIG. 26 |
| Plan view | FIG. 13 | FIG. 3 | FIG. 31 | FIG. 27 |
| n | 0 | 30 | 0 | 30 |
| Number of dimples | 391 | 391 | 324 | 324 |
| Lmax(n) (mm) | — | 0.075 | — | 0.097 |
| Lmax(n − 1) − Lmax(n) (mm) | — | 0.045 | — | 0.002 |
| Lave(n) (mm) | — | 0.014 | — | 0.015 |
| Lave(n − 1) − Lave(n) (mm) | — | −0.001 | — | 0.000 |
| σA(n) (mm$^2$) | 2.147 | 1.103 | 2.276 | 1.275 |
| σA(n − 1) − σA(n) (mm$^2$) | — | 0.001 | — | 0.000 |
| σA(n)/Aave(n) (%) | 15.7 | 8.1 | 13.7 | 7.7 |
| Amax(n) (mm$^2$) | 21.108 | 17.298 | 23.444 | 20.149 |
| Amax(n − 1) − Amax(n) (mm$^2$) | — | −0.100 | — | 0.000 |
| Aave(n) (mm$^2$) | 13.644 | 13.646 | 16.632 | 16.644 |
| Y (mm$^2$) | 17.911 | 17.911 | 21.614 | 21.614 |
| σD(n) (mm) | 0.333 | 0.168 | 0.318 | 0.175 |
| σD(n − 1) − σD(n) (mm) | — | −0.001 | — | 0.000 |
| AveRave(n) (mm) | 2.099 | 2.095 | 2.321 | 2.314 |
| σD(n)/AveRave(n) (%) | 15.9 | 8.0 | 13.7 | 7.6 |
| σRh(n) (mm) | 0.287 | 0.150 | 0.275 | 0.154 |
| Rhmax(n) (mm) | 1.927 | 1.239 | 1.917 | 1.165 |
| Rhmax(n − 1) − Rhmax(n) (mm) | — | −0.035 | — | 0.000 |
| Rhmax(n)/AveRave(n) (%) | 91.8 | 59.1 | 82.6 | 50.3 |
| Rhmin(n) (mm) | 0.377 | 0.299 | 0.417 | 0.301 |
| Rhmax(n) − Rhmin(n) (mm) | 1.550 | 0.940 | 1.500 | 0.864 |
| X (mm) | — | −0.021 | — | 0.000 |
| Occupation ratio (%) | 92 | 92 | 92 | 92 |
| Ratio P1 (%) | 99.7 | 96.2 | 100.0 | 97.9 |
| Ratio P2 (%) | 95.9 | 76.0 | 98.1 | 77.5 |

TABLE 10

Specifications of Dimples

|  | Comp. Ex. 3 | Ex. 3 | Comp. Ex. 4 | Ex. 4 |
|---|---|---|---|---|
| Front view | FIG. 42 | FIG. 36 | FIG. 54 | FIG. 48 |
| Plan view | FIG. 43 | FIG. 37 | FIG. 55 | FIG. 49 |
| n | 0 | 30 | 0 | 30 |
| Number of dimples | 344 | 344 | 332 | 332 |
| Lmax(n) (mm) | — | 0.096 | — | 0.062 |
| Lmax(n − 1) − Lmax(n) (mm) | — | −0.034 | — | 0.075 |
| Lave(n) (mm) | — | 0.005 | — | 0.006 |
| Lave(n − 1) − Lave(n) (mm) | — | 0.000 | — | 0.000 |
| σA(n) (mm$^2$) | 1.192 | 0.871 | 1.946 | 0.936 |
| σA(n − 1) − σA(n) (mm$^2$) | — | −0.004 | — | 0.002 |
| σA(n)/Aave(n) (%) | 7.6 | 5.6 | 12.0 | 5.8 |
| Amax(n) (mm$^2$) | 18.601 | 18.024 | 19.002 | 18.068 |
| Amax(n − 1) − Amax(n) (mm$^2$) | — | −0.030 | — | 0.079 |
| Aave(n) (mm$^2$) | 15.637 | 15.627 | 16.221 | 16.225 |
| Y (mm$^2$) | 20.358 | 20.358 | 21.093 | 21.093 |
| σD(n) (mm) | 0.171 | 0.125 | 0.287 | 0.133 |
| σD(n − 1) − σD(n) (mm) | — | 0.000 | — | 0.000 |
| AveRave(n) (mm) | 2.241 | 2.241 | 2.278 | 2.281 |
| σD(n)/AveRave(n) (%) | 7.6 | 5.6 | 12.6 | 5.8 |
| σRh(n) (mm) | 0.127 | 0.128 | 0.086 | 0.105 |
| Rhmax(n) (mm) | 0.973 | 1.024 | 0.747 | 0.901 |
| Rhmax(n − 1) − Rhmax(n) (mm) | — | 0.000 | — | 0.000 |
| Rhmax(n)/AveRave(n) (%) | 43.4 | 45.7 | 32.8 | 39.5 |
| Rhmin(n) (mm) | 0.241 | 0.286 | 0.230 | 0.253 |
| Rhmax(n) − Rhmin(n) (mm) | 0.733 | 0.738 | 0.517 | 0.648 |
| X (mm) | — | −0.007 | — | −0.011 |
| Occupation ratio (%) | 92 | 92 | 92 | 92 |
| Ratio P1 (%) | 83.4 | 83.4 | 66.9 | 86.1 |
| Ratio P2 (%) | 37.8 | 37.5 | 8.7 | 25.9 |

TABLE 11

Specifications of Dimples

Figure 60:
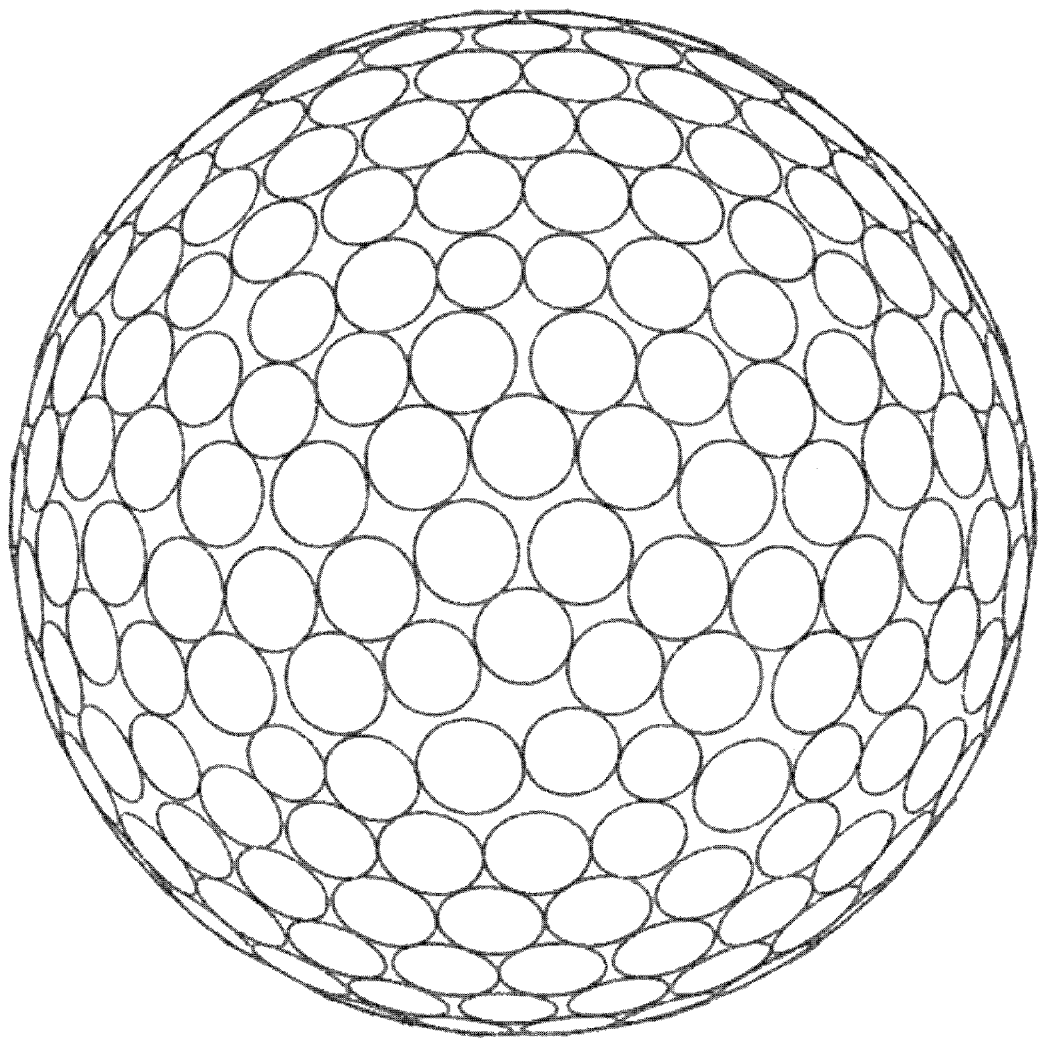
FIG. 60 is a front view of a golf ball according to Comparative Example 6.
Figure 61:
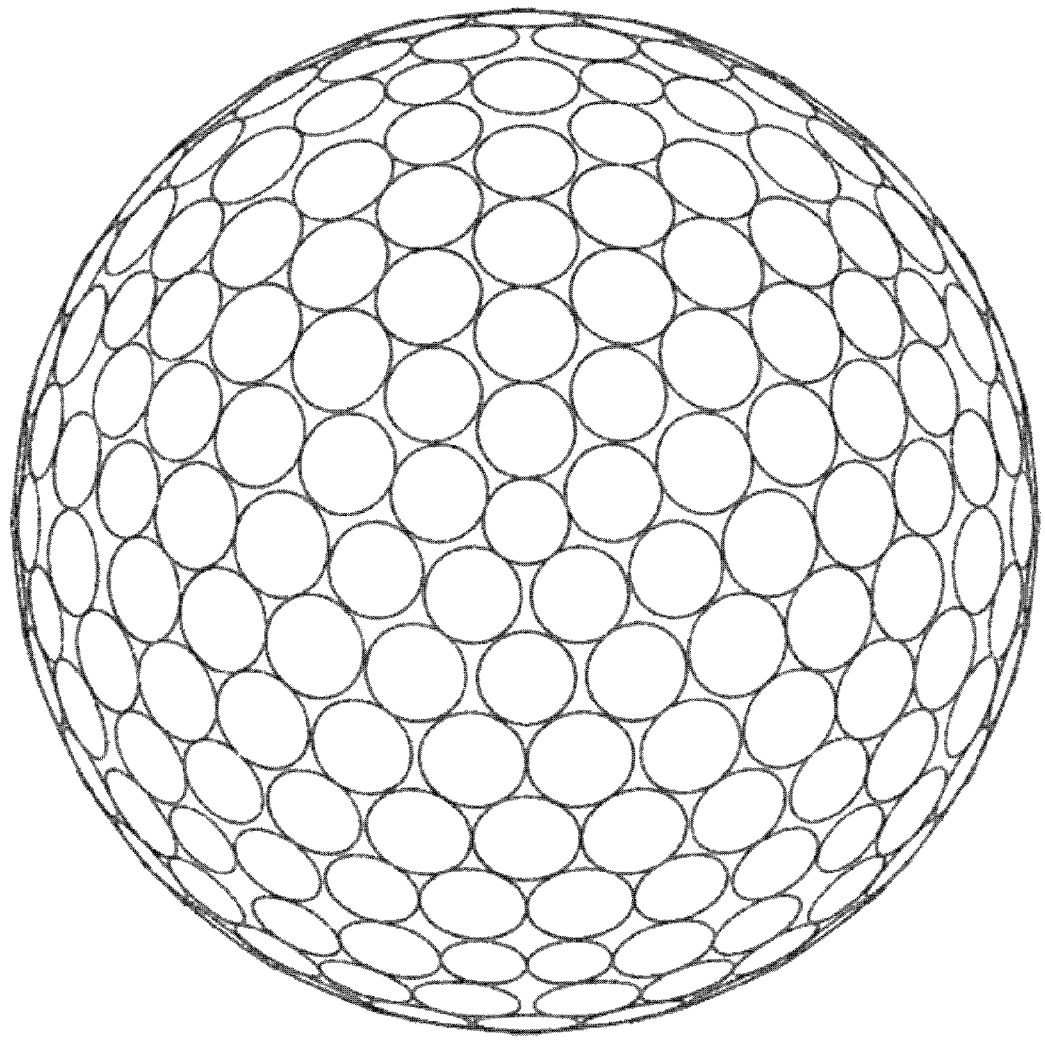
FIG. 61 is a plan view of the golf ball in FIG. 60.

|  | Comp. Ex. 5 | Comp. Ex. 6 | Comp. Ex. 7 |
|---|---|---|---|
| Front view | FIG. 38 | FIG. 60 | FIG. 50 |
| Plan view | FIG. 39 | FIG. 61 | FIG. 51 |
| n | — | — | — |
| Number of dimples | 344 | 324 | 332 |
| Lmax(n) (mm) | — | — | — |
| Lmax(n − 1) − Lmax(n) (mm) | — | — | — |
| Lave(n) (mm) | — | — | — |
| Lave(n − 1) − Lave(n) (mm) | — | — | — |
| σA(n) (mm$^2$) | 1.426 | 1.537 | 2.035 |
| σA(n − 1) − σA(n) (mm$^2$) | — | — | — |
| σA(n)/Aave(n) (%) | 10.0 | 10.6 | 13.7 |
| Amax(n) (mm$^2$) | 16.682 | 15.964 | 16.399 |
| Amax(n − 1) − Amax(n) (mm$^2$) | — | — | — |
| Aave(n) (mm$^2$) | 14.254 | 14.550 | 14.876 |
| Y (mm$^2$) | 20.358 | 21.614 | 21.093 |
| σD(n) (mm) | 0.223 | 0.235 | 0.331 |
| σD(n − 1) − σD(n) (mm) | — | — | — |
| AveRave(n) (mm) | 2.124 | 2.145 | 2.170 |
| σD(n)/AveRave(n) (%) | 10.5 | 11.0 | 15.3 |
| σRh(n) (mm) | — | — | 0.015 |
| Rhmax(n) (mm) | 0.000 | 0.000 | 0.337 |
| Rhmax(n − 1) − Rhmax(n) (mm) | — | — | — |
| Rhmax(n)/AveRave(n) (%) | — | — | 15.5 |
| Rhmin(n) (mm) | 0.000 | 0.000 | 0.296 |
| Rhmax(n) − Rhmin(n) (mm) | 0.000 | 0.000 | 0.041 |
| X (mm) | — | — | — |
| Occupation ratio (%) | 84 | 82 | 86 |
| Ratio P1 (%) | 0.0 | 0.0 | 0.0 |
| Ratio P2 (%) | 0.0 | 0.0 | 0.0 |

Comparative Example 8

A golf ball of Comparative Example 8 was obtained in the same manner as Example 1, except the final mold was changed. The specifications of the dimples of the golf ball are shown in Table 12 below. In designing a dimple pattern of the golf ball, 289 generating points were assumed on a surface of a sphere by using random numbers. On the basis of these generating points, 289 Voronoi regions were assumed. These Voronoi regions were subjected to smoothing.

Example 5

The golf ball of Example 5 was obtained in the same manner as Example 1, except the final mold was changed. The specifications of the dimples of the golf ball are shown in Table 12 below. In designing a dimple pattern of the golf ball, new generating points were decided based on the Voronoi regions of Comparative Example 8. New Voronoi regions were assumed based on the generating points. Voronoi regions obtained by repeating decision of generating points and assumption of Voronoi regions 50 times were subjected to smoothing.

Comparative Example 9

A golf ball of Comparative Example 9 was obtained in the same manner as Example 1, except the final mold was changed. The specifications of the dimples of the golf ball are shown in Table 12 below. In designing a dimple pattern of the golf ball, 337 generating points were assumed on a surface of a sphere by using random numbers. On the basis of these generating points, 337 Voronoi regions were assumed. These Voronoi regions were subjected to smoothing.

Example 6

The golf ball of Example 6 was obtained in the same manner as Example 1, except the final mold was changed. The specifications of the dimples of the golf ball are shown in Table 12 below. In designing a dimple pattern of the golf ball, new generating points were decided based on the Voronoi regions of Comparative Example 9. New Voronoi regions were assumed based on the generating points. Voronoi regions obtained by repeating decision of generating points and assumption of Voronoi regions 50 times were subjected to smoothing.

Comparative Example 10

A golf ball of Comparative Example 10 was obtained in the same manner as Example 1, except the final mold was changed. The specifications of the dimples of the golf ball are shown in Table 13 below. In designing a dimple pattern of the golf ball, 360 generating points were assumed on a surface of a sphere by using random numbers. On the basis of these generating points, 360 Voronoi regions were assumed. These Voronoi regions were subjected to smoothing.

Example 7

The golf ball of Example 7 was obtained in the same manner as Example 1, except the final mold was changed. The specifications of the dimples of the golf ball are shown in Table 13 below. In designing a dimple pattern of the golf ball, new generating points were decided based on the Voronoi regions of Comparative Example 10. New Voronoi regions were assumed based on the generating points. Voronoi regions obtained by repeating decision of generating points and assumption of Voronoi regions 50 times were subjected to smoothing.

Comparative Example 11

A golf ball of Comparative Example 11 was obtained in the same manner as Example 1, except the final mold was changed. The specifications of the dimples of the golf ball are shown in Table 13 below. In designing a dimple pattern of the golf ball, 390 generating points were assumed on a surface of a sphere by using random numbers. On the basis of these generating points, 390 Voronoi regions were assumed. These Voronoi regions were subjected to smoothing.

Example 8

The golf ball of Example 8 was obtained in the same manner as Example 1, except the final mold was changed. The specifications of the dimples of the golf ball are shown in Table 13 below. In designing a dimple pattern of the golf ball, new generating points were decided based on the Voronoi regions of Comparative Example 11. New Voronoi regions were assumed based on the generating points. Voronoi regions obtained by repeating decision of generating points and assumption of Voronoi regions 50 times were subjected to smoothing.

Comparative Example 12

A golf ball of Comparative Example 12 was obtained in the same manner as Example 1, except the final mold was changed. The specifications of the dimples of the golf ball are shown in Table 14 below. In designing a dimple pattern of the golf ball, 344 circular dimples are arranged. By setting the central points of these dimples as generating points, 344 Voronoi regions were assumed. These Voronoi regions were subjected to smoothing.

Comparative Example 13

A golf ball of Comparative Example 13 was obtained in the same manner as Example 1, except the final mold was changed. The specifications of the dimples of the golf ball are shown in Table 14 below. The golf ball has 312 dimples. The shape of each of the dimples is a substantially triangle. These dimples were obtained by Delaunay triangulation. Delaunay triangulation is disclosed in JP2013-9906. The dimple pattern of Comparative Example 13 is the same as the pattern shown in FIGS. 28 and 29 of this Publication.

[Flight Distance]

A driver with a titanium head (trade name "XXIO", manufactured by DUNLOP SPORTS CO. LTD., shaft hardness: X, loft angle: 9°) was attached to a swing machine manufactured by True Temper Co. A golf ball was hit under the condition of a head speed of 49 m/sec. The distance from the launch point to the stop point was measured. The average value of data obtained by 10 measurements is shown in Tables 12 to 14 below.

TABLE 12

Results of Evaluation

Figure 62:
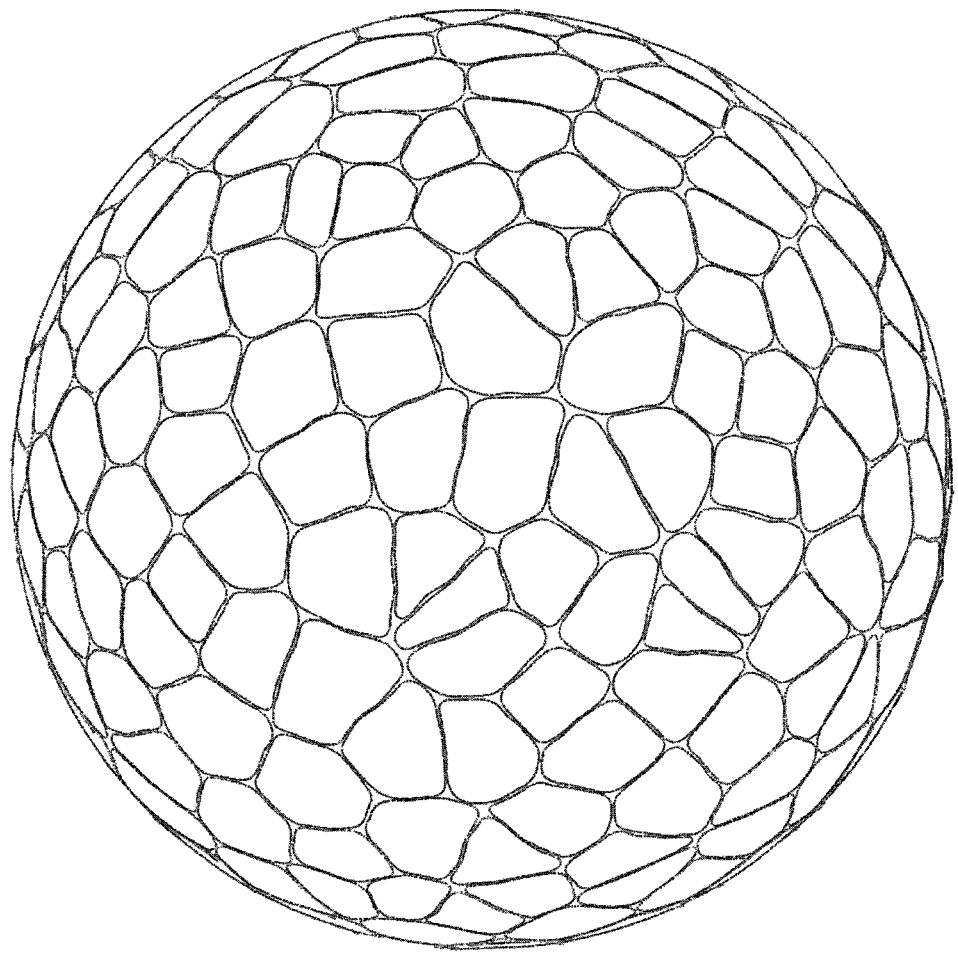
FIG. 62 is a front view of a golf ball according to Comparative Example 8.
Figure 63:
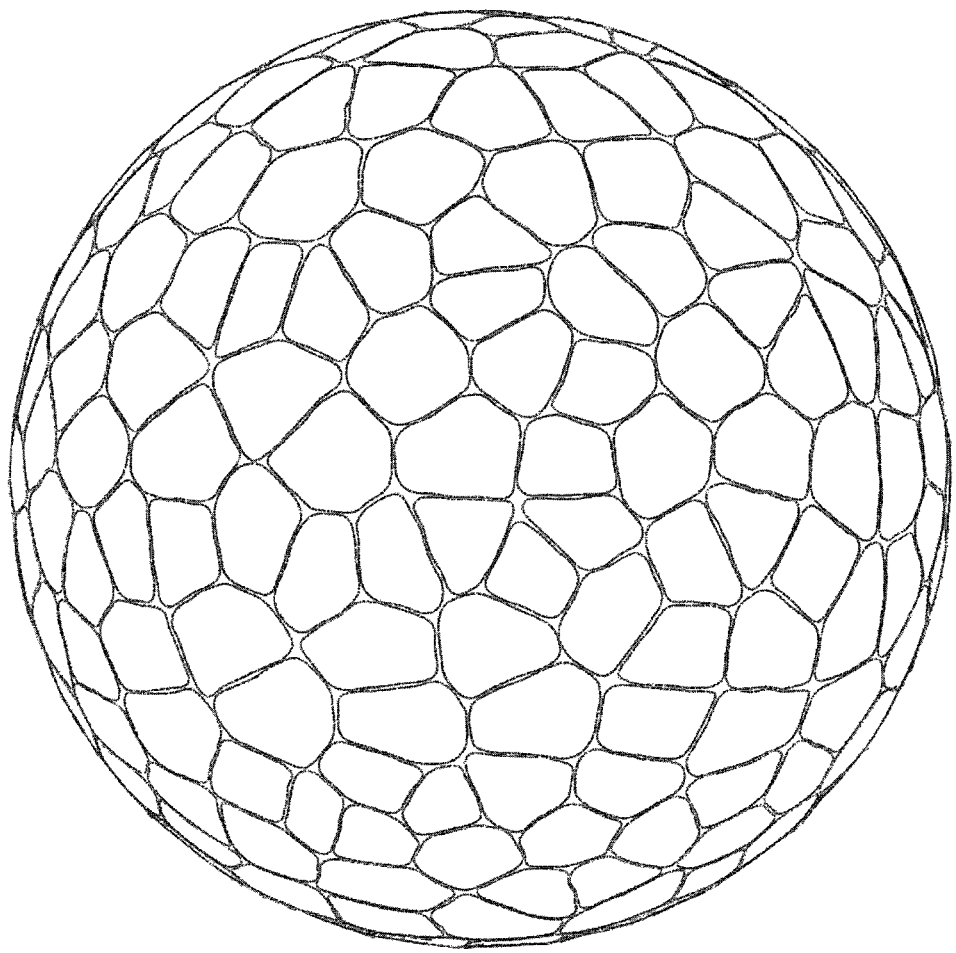
FIG. 63 is a plan view of the golf ball in FIG. 62.
Figure 64:
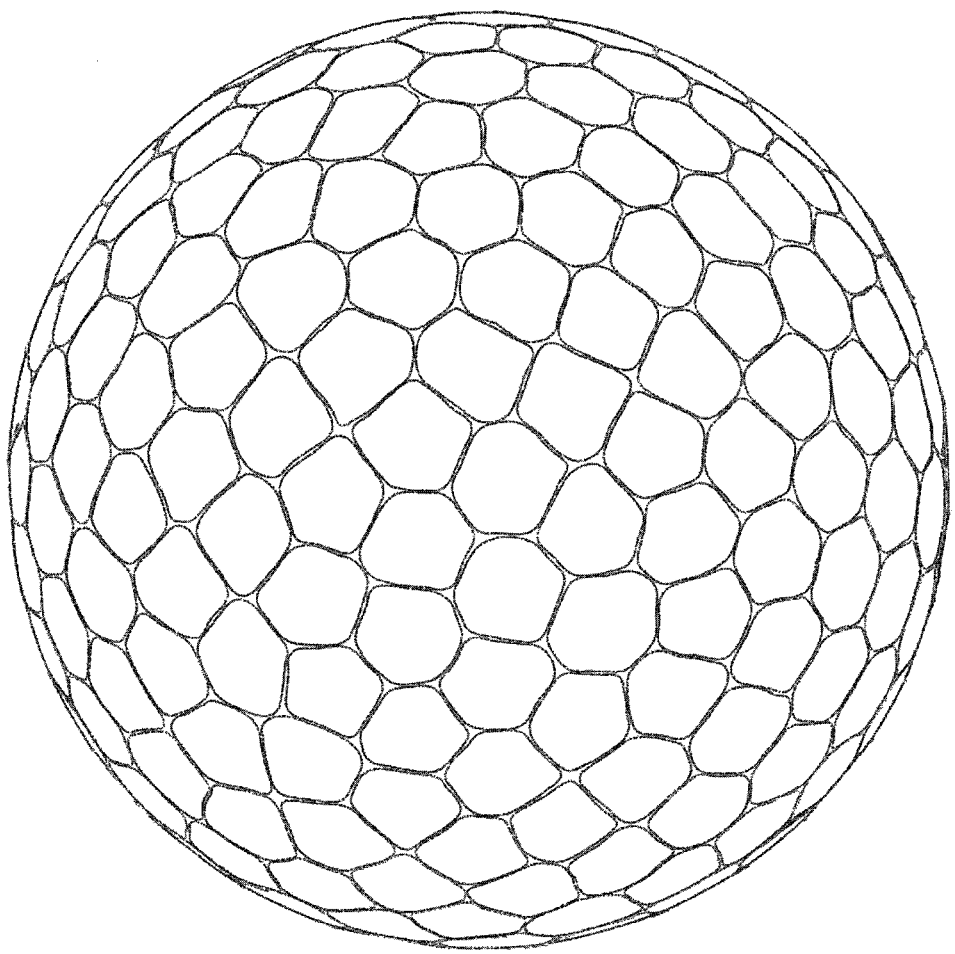
FIG. 64 is a front view of a golf ball according to Example 5 of the present invention.
Figure 65:
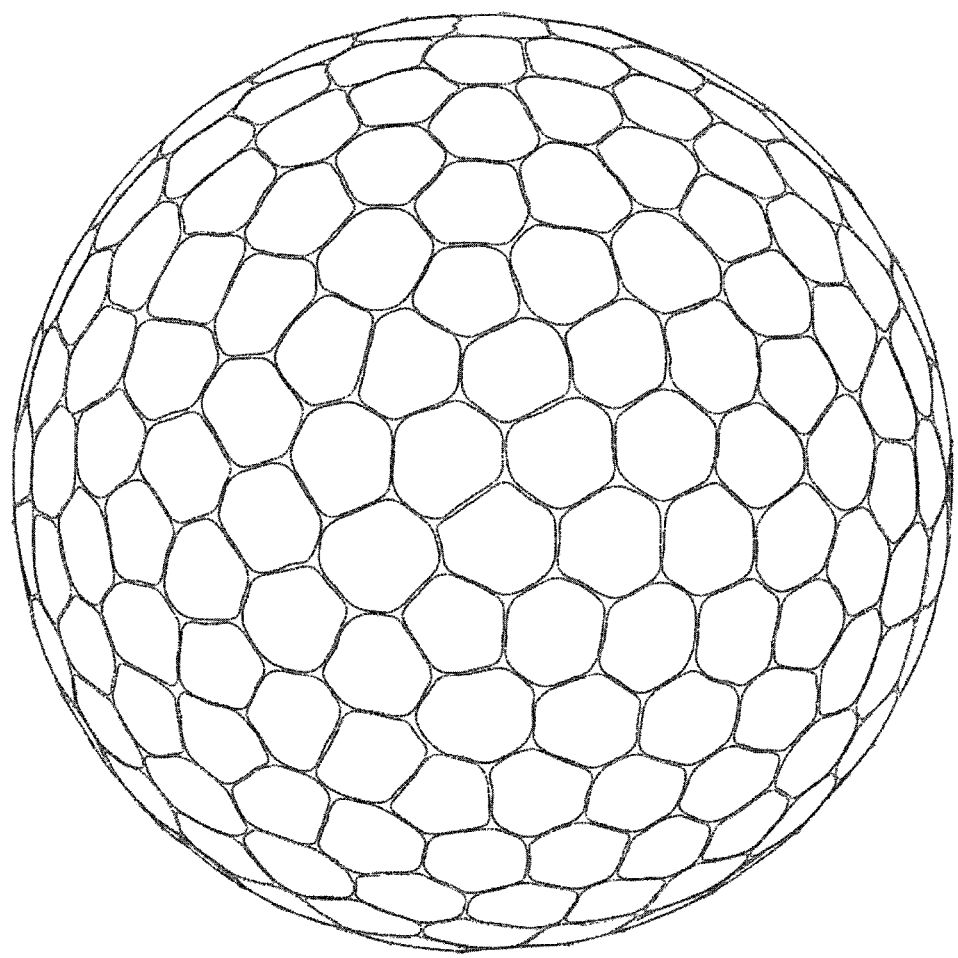
FIG. 65 is a plan view of the golf ball in FIG. 64.
Figure 66:
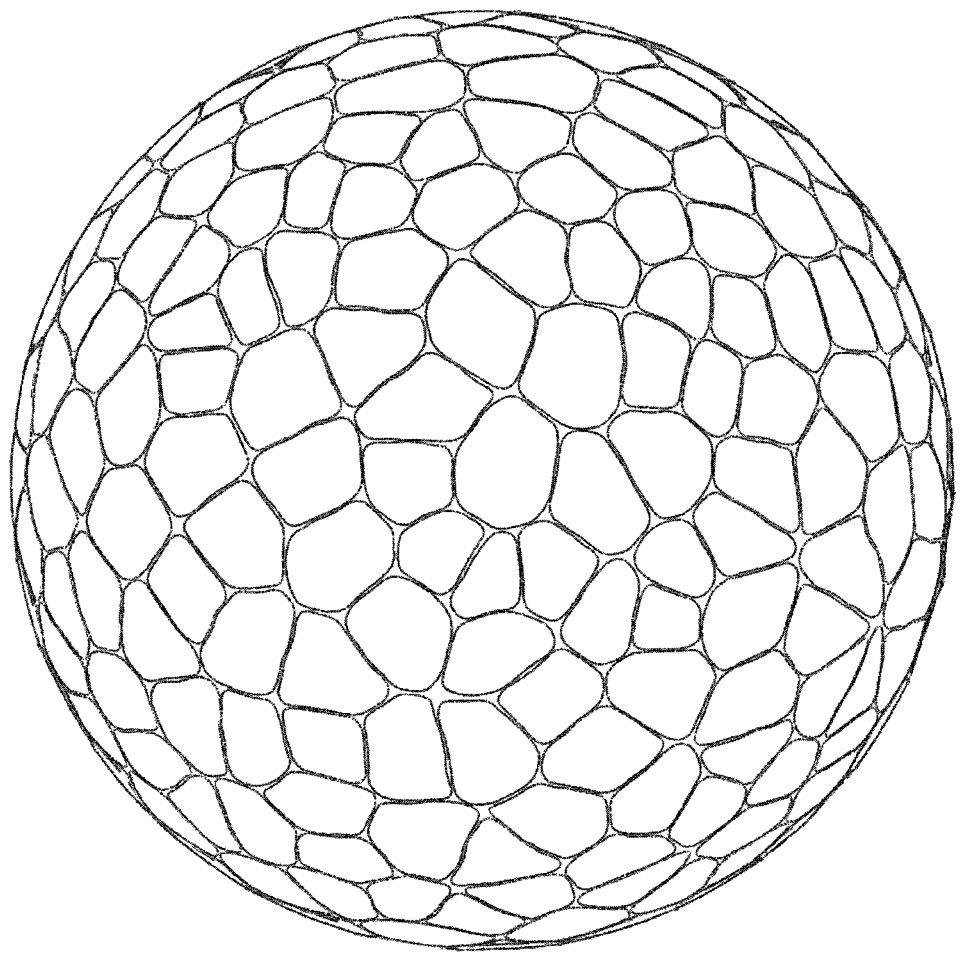
FIG. 66 is a front view of a golf ball according to Comparative Example 9.
Figure 67:
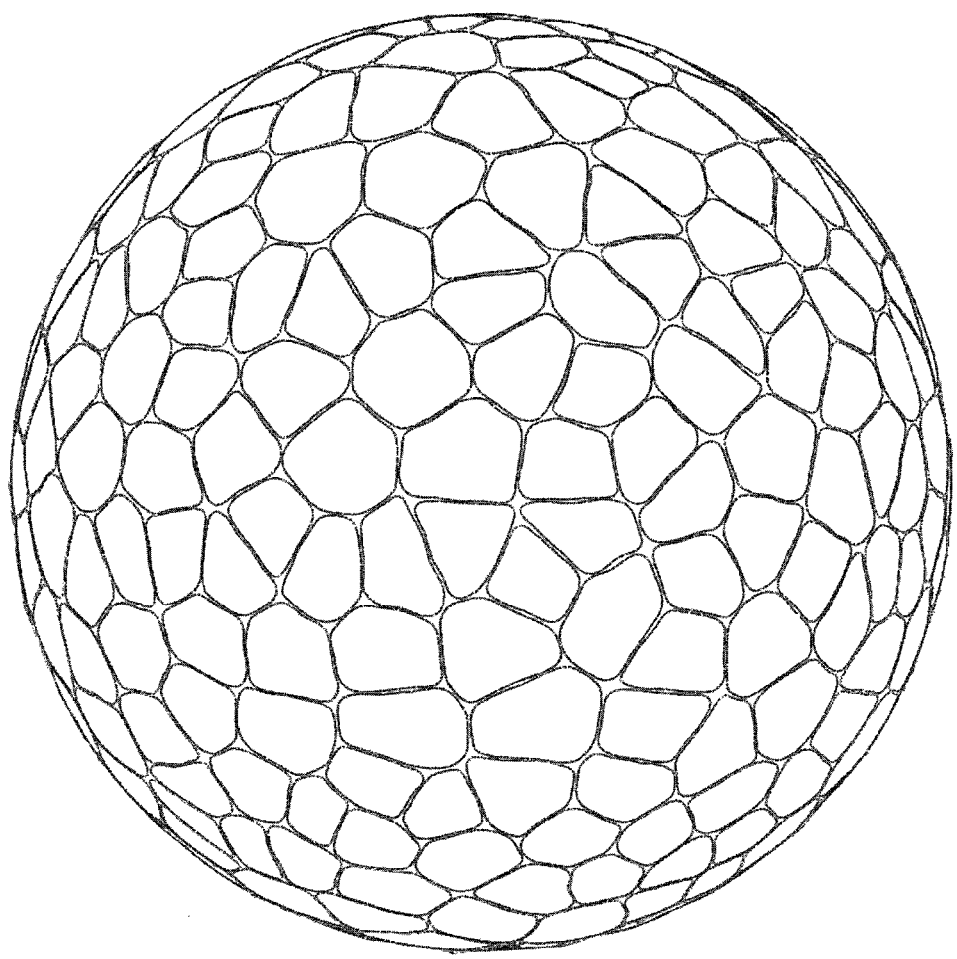
FIG. 67 is a plan view of the golf ball in FIG. 66.
Figure 68:
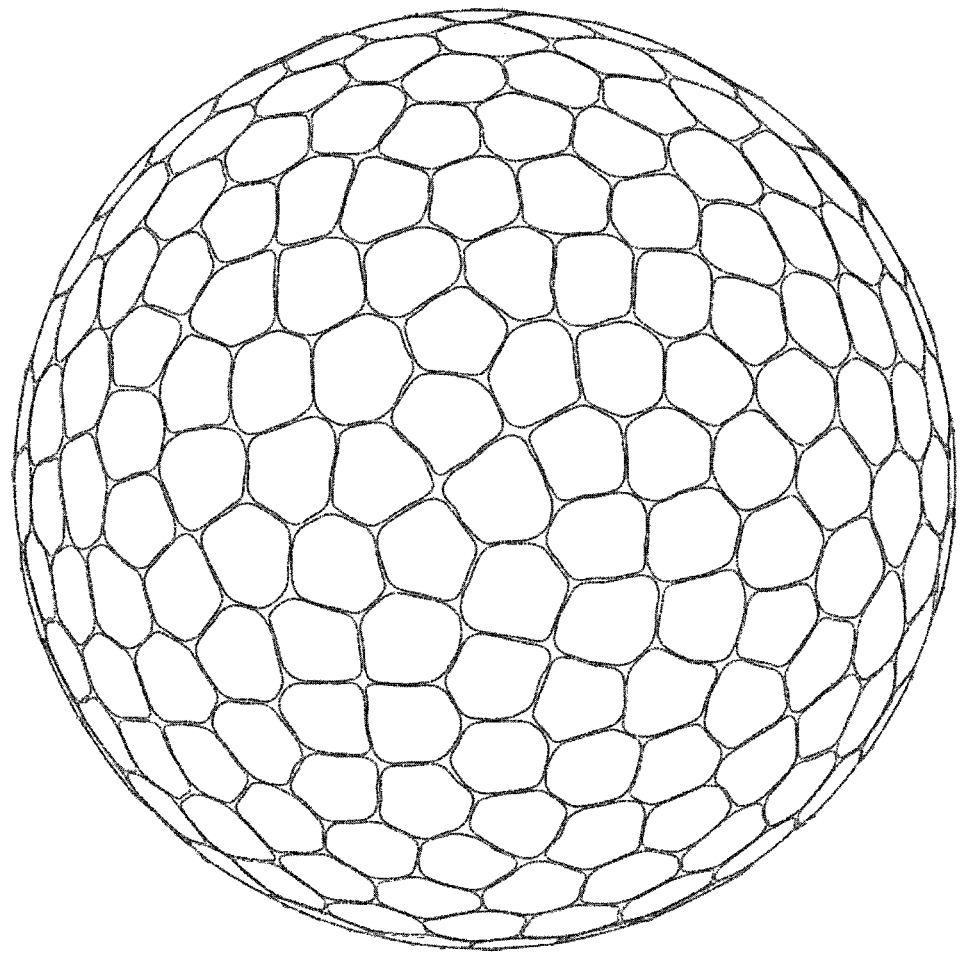
FIG. 68 is a front view of a golf ball according to Example 6 of the present invention.
Figure 69:
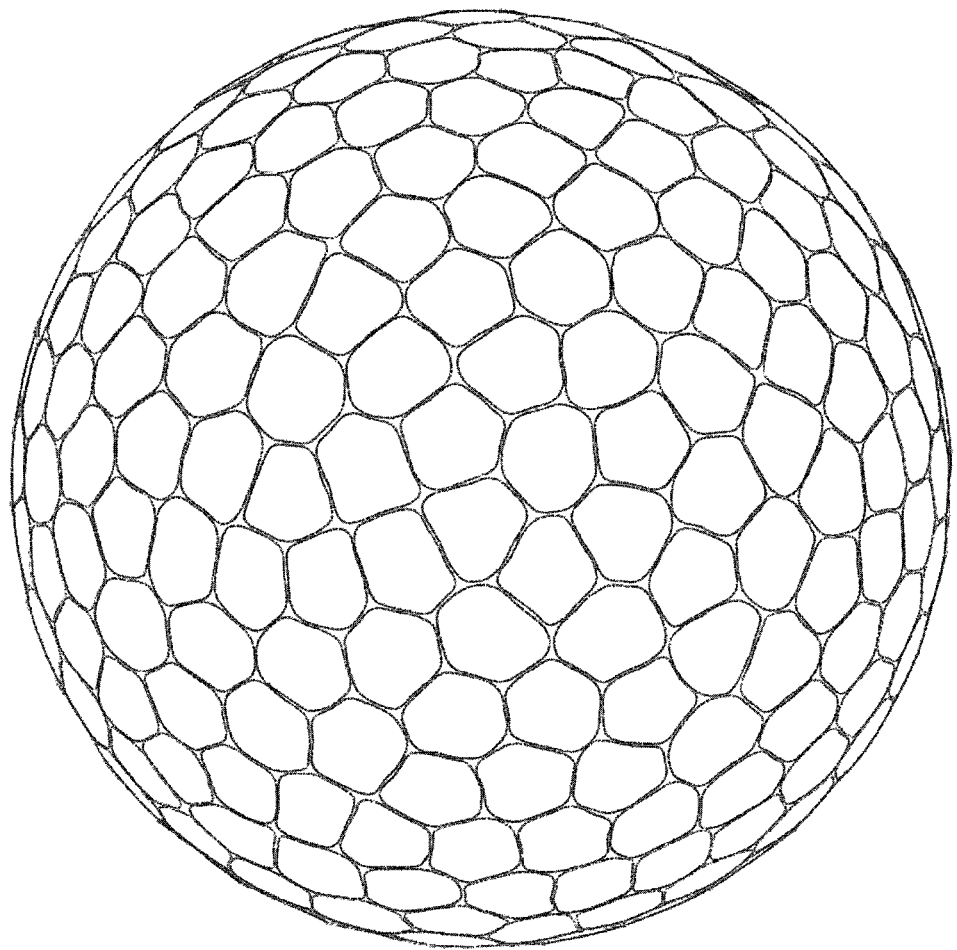
FIG. 69 is a plan view of the golf ball in FIG. 68.

| | Comp. Ex. 8 | Ex. 5 | Comp. Ex. 9 | Ex. 6 |
|---|---|---|---|---|
| Front view | FIG. 62 | FIG. 64 | FIG. 66 | FIG. 68 |
| Plan view | FIG. 63 | FIG. 65 | FIG. 67 | FIG. 69 |
| n | 0 | 50 | 0 | 50 |
| Number of dimples | 289 | 289 | 337 | 337 |
| Lmax(n) (mm) | — | 0.155 | — | 0.077 |
| Lmax(n − 1) − Lmax(n) (mm) | — | −0.048 | — | 0.032 |
| Lave(n) (mm) | — | 0.019 | — | 0.012 |
| Lave(n − 1) − Lave(n) (mm) | — | −0.001 | — | 0.000 |
| σA(n) (mm$^2$) | 5.750 | 1.264 | 5.096 | 1.162 |
| σA(n − 1) − σA(n) (mm$^2$) | — | 0.319 | — | 0.334 |
| σA(n)/Aave(n) (%) | 30.6 | 6.7 | 31.9 | 7.3 |
| Amax(n) (mm$^2$) | 33.729 | 22.151 | 31.151 | 19.561 |
| Amax(n − 1) − Amax(n) (mm$^2$) | — | 1.056 | — | 0.792 |
| Aave(n) (mm$^2$) | 18.766 | 18.784 | 15.968 | 15.972 |
| Y (mm$^2$) | 24.232 | 24.232 | 20.780 | 20.780 |
| σD(n) (mm$^2$) | 0.730 | 0.162 | 0.716 | 0.163 |
| σD(n − 1) − σD(n) (mm$^2$) | — | 0.043 | — | 0.047 |
| AveRave(n) (mm) | 2.489 | 2.458 | 2.294 | 2.267 |
| σD(n)/AveRave(n) (%) | 29.3 | 6.6 | 31.2 | 7.2 |
| σRh(n) (mm) | 0.546 | 0.157 | 0.496 | 0.148 |
| Rhmax(n) (mm) | 3.867 | 1.158 | 3.538 | 1.119 |
| Rhmax(n − 1) − Rhmax(n) (mm) | — | 0.213 | — | 0.390 |
| Rhmax(n)/AveRave(n) (%) | 155.4 | 47.1 | 154.2 | 49.4 |
| Rhmin(n) (mm) | 0.499 | 0.284 | 0.500 | 0.332 |
| Rhmax(n) − Rhmin(n) (mm) | 3.368 | 0.874 | 3.038 | 0.787 |
| X (mm$^2$) | — | 0.053 | — | 0.328 |
| Occupation ratio (%) | 92 | 92 | 92 | 92 |
| Ratio P1 (%) | 100.0 | 98.3 | 100.0 | 96.7 |
| Ratio P2 (%) | 98.6 | 74.0 | 99.4 | 78.9 |
| Flight Distance (yard) | 265.6 | 271.1 | 266.8 | 273.1 |

TABLE 13

Results of Evaluation

Figure 70:
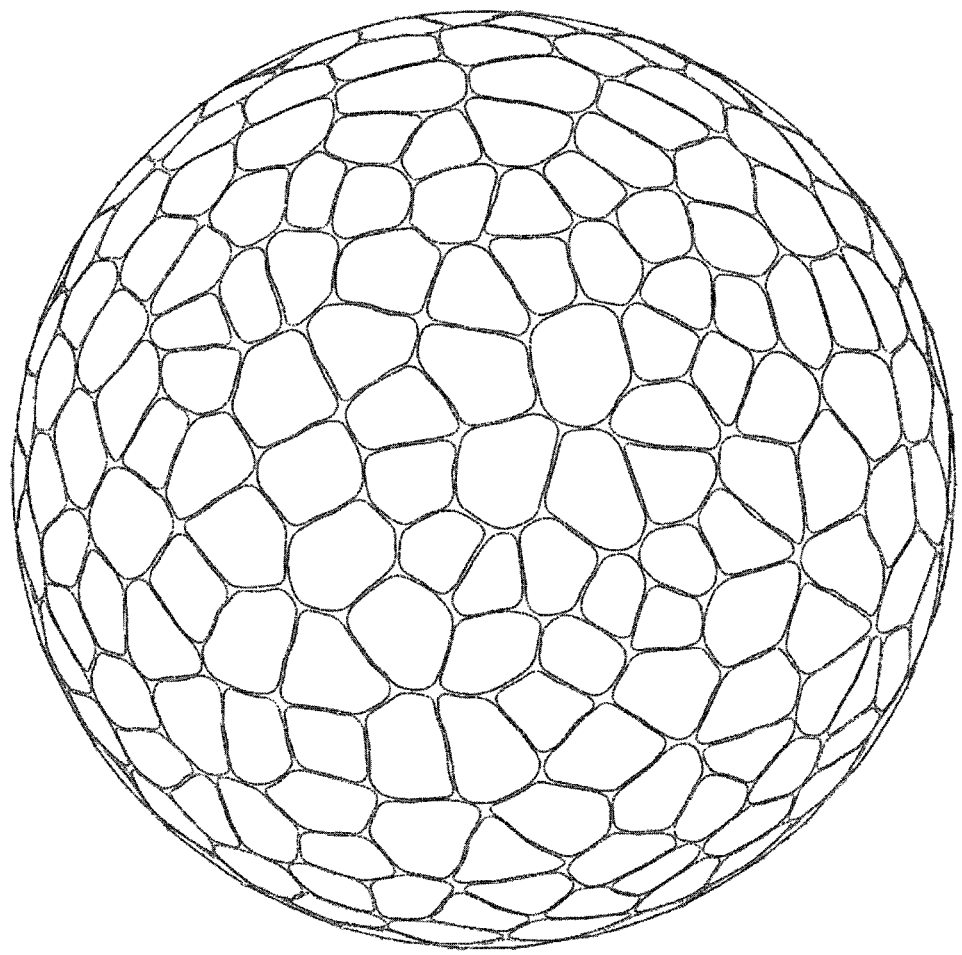
FIG. 70 is a front view of a golf ball according to Comparative Example 10.
Figure 71:
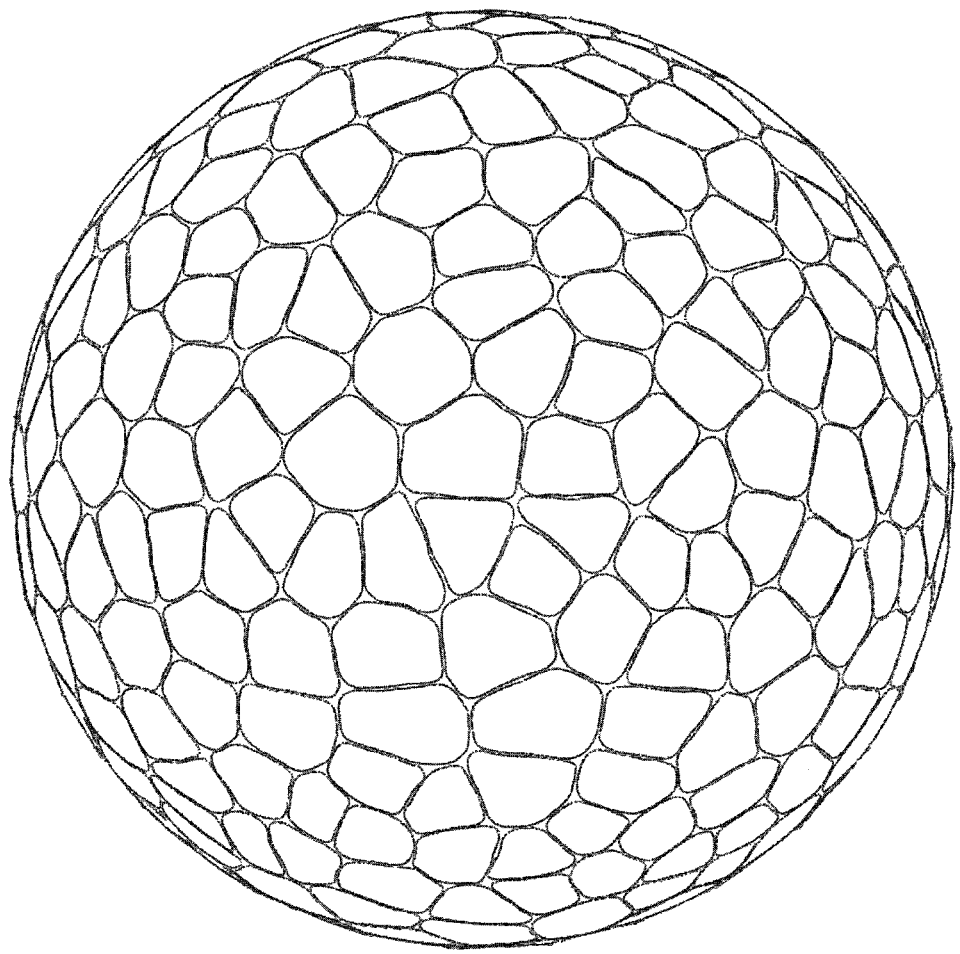
FIG. 71 is a plan view of the golf ball in FIG. 70.
Figure 72:
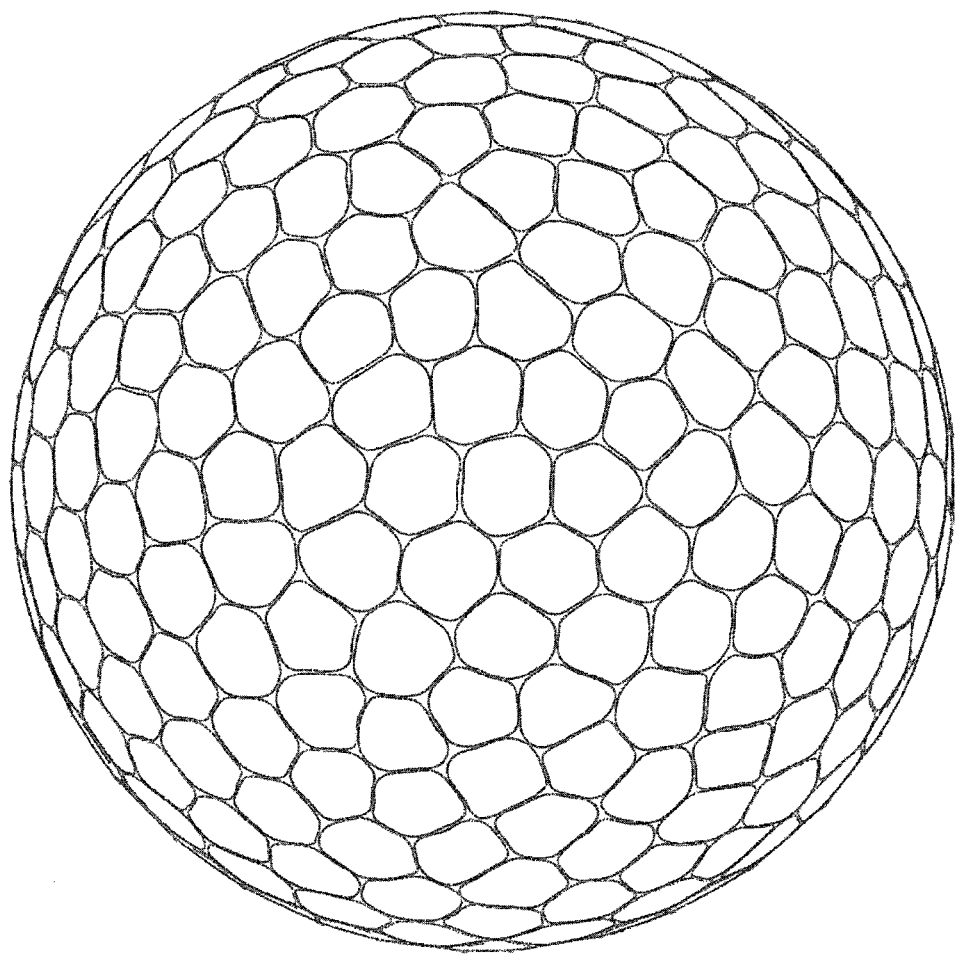
FIG. 72 is a front view of a golf ball according to Example 7 of the present invention.
Figure 73:
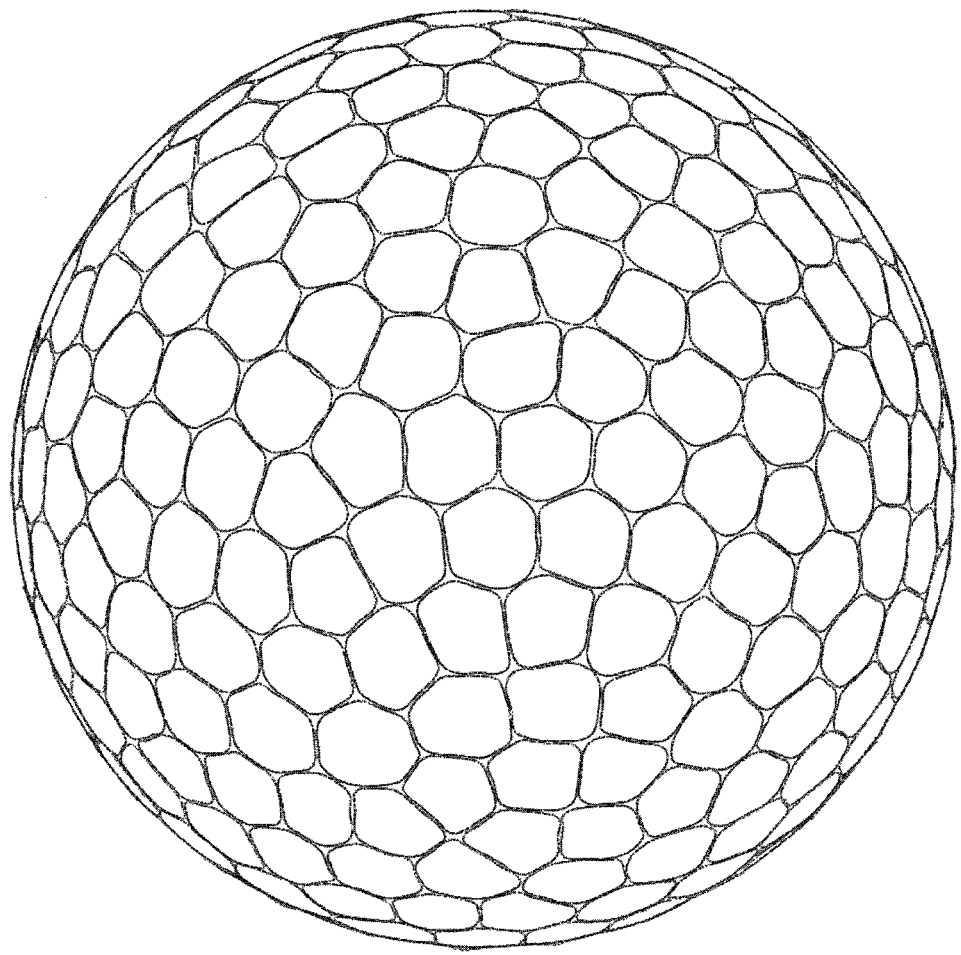
FIG. 73 is a plan view of the golf ball in FIG. 72.
Figure 74:
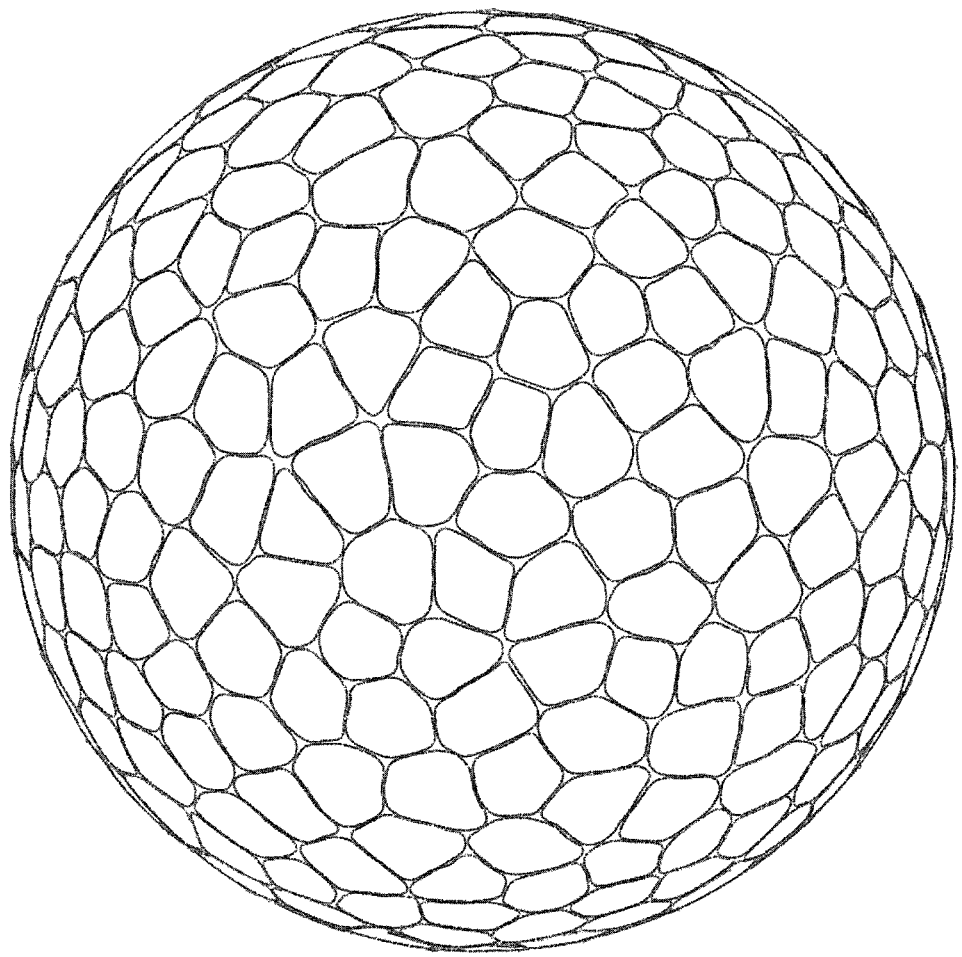
FIG. 74 is a front view of a golf ball according to Comparative Example 11.
Figure 75:
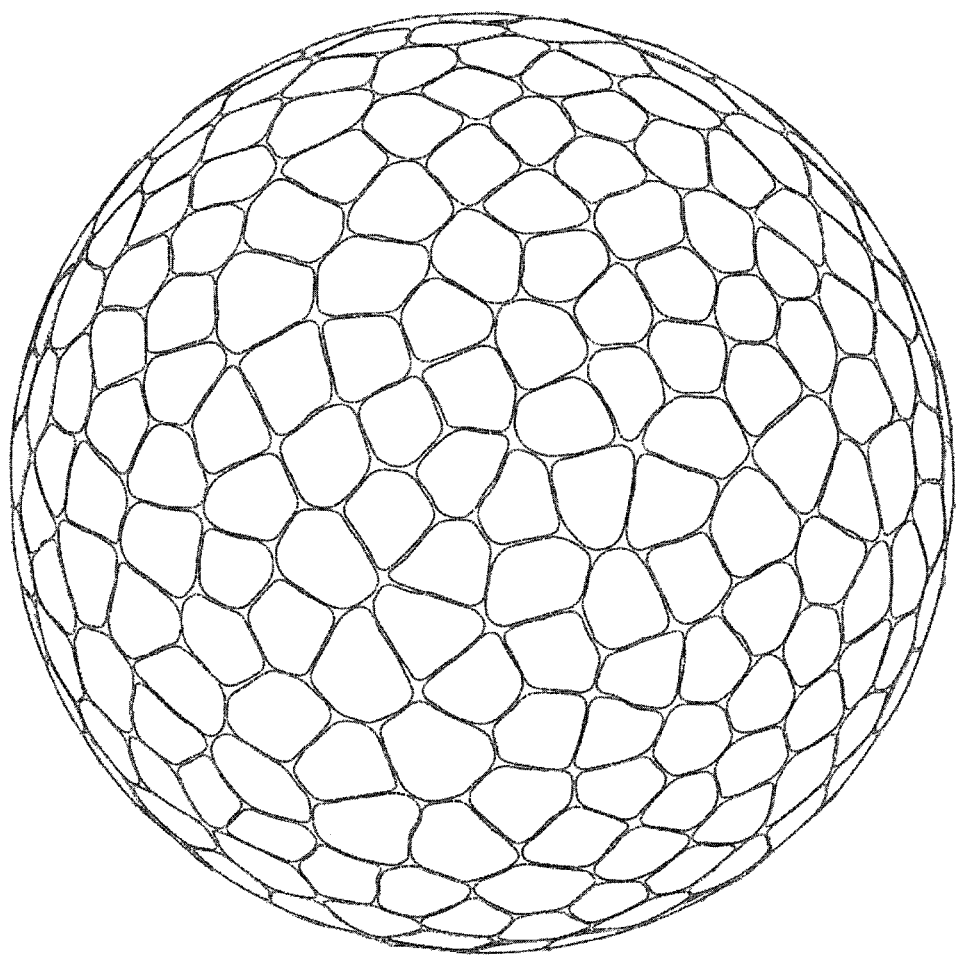
FIG. 75 is a plan view of the golf ball in FIG. 74.
Figure 76:
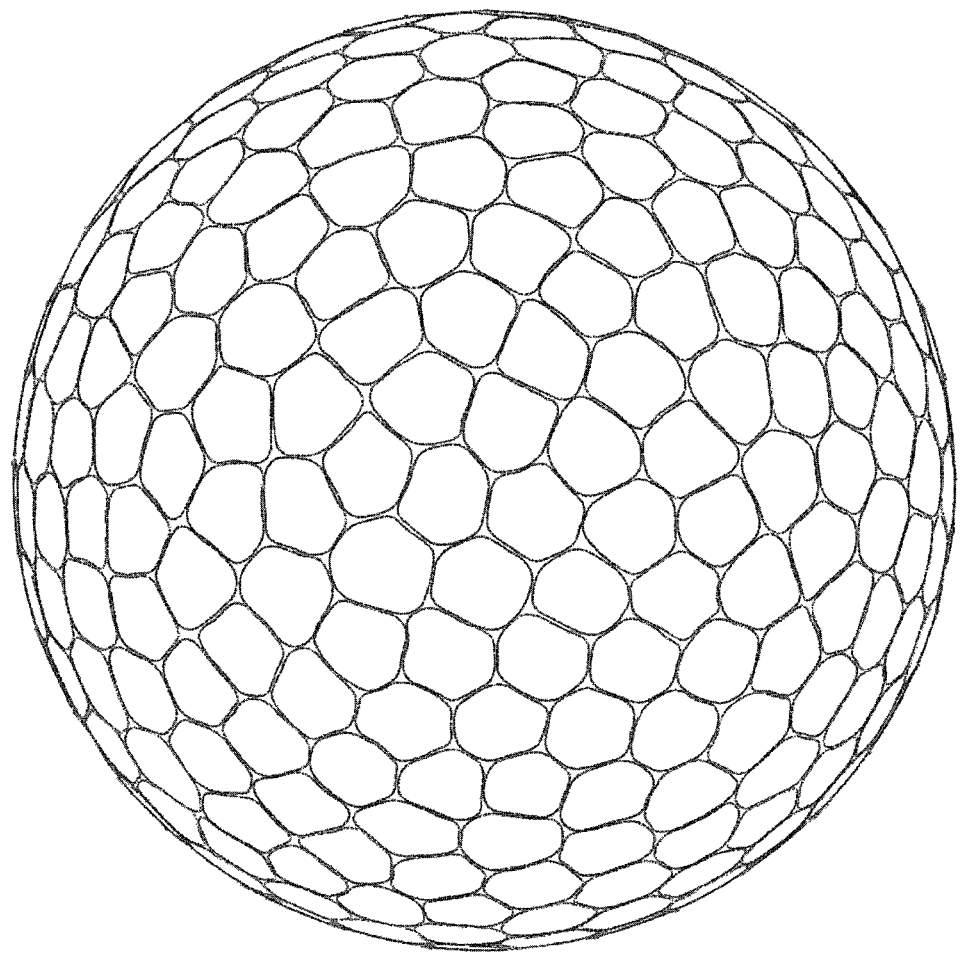
FIG. 76 is a front view of a golf ball according to Example 8 of the present invention.
Figure 77:
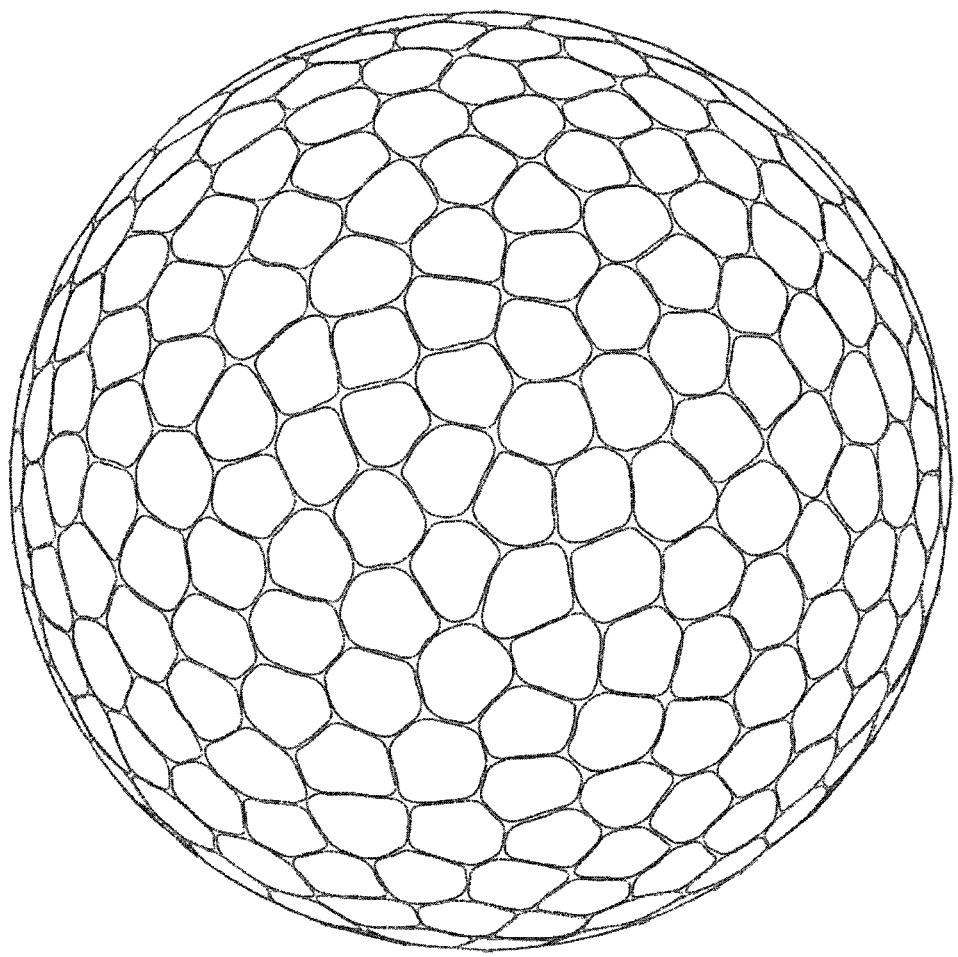
FIG. 77 is a plan view of the golf ball in FIG. 76.

| | Comp. Ex. 10 | Ex. 7 | Comp. Ex. 11 | Ex. 8 |
|---|---|---|---|---|
| Front view | FIG. 70 | FIG. 72 | FIG. 74 | FIG. 76 |
| Plan view | FIG. 71 | FIG. 73 | FIG. 75 | FIG. 77 |
| n | 0 | 50 | 0 | 50 |
| Number of dimples | 360 | 360 | 390 | 390 |
| Lmax(n) (mm) | — | 0.130 | — | 0.098 |
| Lmax(n − 1) − Lmax(n) (mm) | — | −0.008 | — | −0.009 |
| Lave(n) (mm) | — | 0.013 | — | 0.008 |
| Lave(n − 1) − Lave(n) (mm) | — | 0.000 | — | 0.000 |
| σA(n) (mm$^2$) | 4.697 | 1.136 | 1.985 | 1.043 |
| σA(n − 1) − σA(n) (mm$^2$) | — | 0.220 | — | 0.006 |
| σA(n)/Aave(n) (%) | 31.5 | 7.6 | 14.5 | 7.6 |
| Amax(n) (mm$^2$) | 27.965 | 18.244 | 20.339 | 17.004 |
| Amax(n − 1) − Amax(n) (mm$^2$) | — | 0.847 | — | 0.150 |
| Aave(n) (mm$^2$) | 14.892 | 14.893 | 13.697 | 13.677 |
| Y (mm$^2$) | 19.453 | 19.453 | 17.956 | 17.956 |
| σD(n) (mm$^2$) | 0.681 | 0.165 | 0.303 | 0.158 |
| σD(n − 1) − σD(n) (mm$^2$) | — | 0.032 | — | 0.000 |
| AveRave(n) (mm) | 2.216 | 2.189 | 2.109 | 2.097 |
| σD(n)/AveRave(n) (%) | 30.7 | 7.5 | 14.4 | 7.5 |
| σRh(n) (mm) | 0.452 | 0.160 | 0.223 | 0.143 |
| Rhmax(n) (mm) | 2.804 | 1.120 | 1.515 | 1.010 |
| Rhmax(n − 1) − Rhmax(n) (mm) | — | 0.125 | — | −0.016 |
| Rhmax(n)/AveRave(n) (%) | 126.5 | 51.1 | 71.8 | 48.1 |
| Rhmin(n) (mm) | 0.441 | 0.305 | 0.329 | 0.293 |
| Rhmax(n) − Rhmin(n) (mm) | 2.363 | 0.815 | 1.186 | 0.717 |
| X (mm$^2$) | — | 0.056 | — | 0.028 |
| Occupation ratio (%) | 92 | 92 | 92 | 92 |
| Ratio P1 (%) | 100.0 | 95.6 | 98.5 | 93.1 |
| Ratio P2 (%) | 99.4 | 73.9 | 96.7 | 70.5 |
| Flight distance (yard) | 266.1 | 273.2 | 259.4 | 263.3 |

TABLE 14

Results of Evaluation

Figure 78:
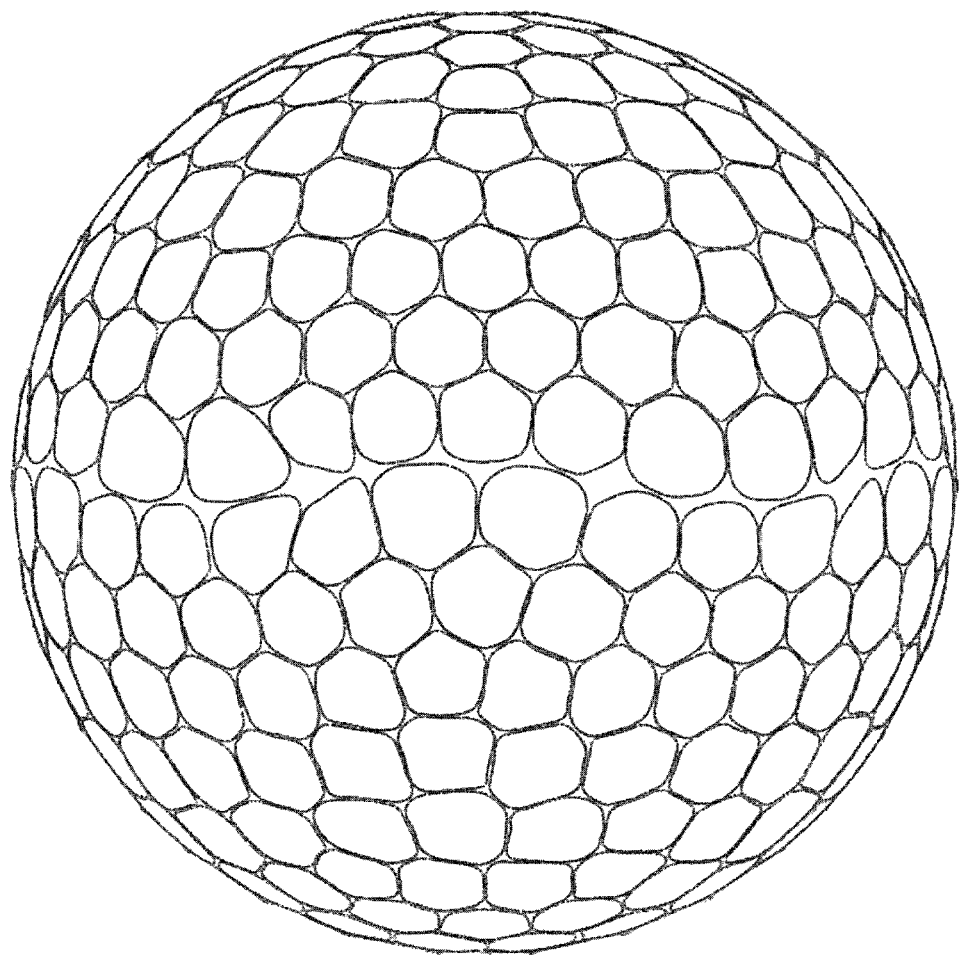
FIG. 78 is a front view of a golf ball according to Comparative Example 12.
Figure 79:
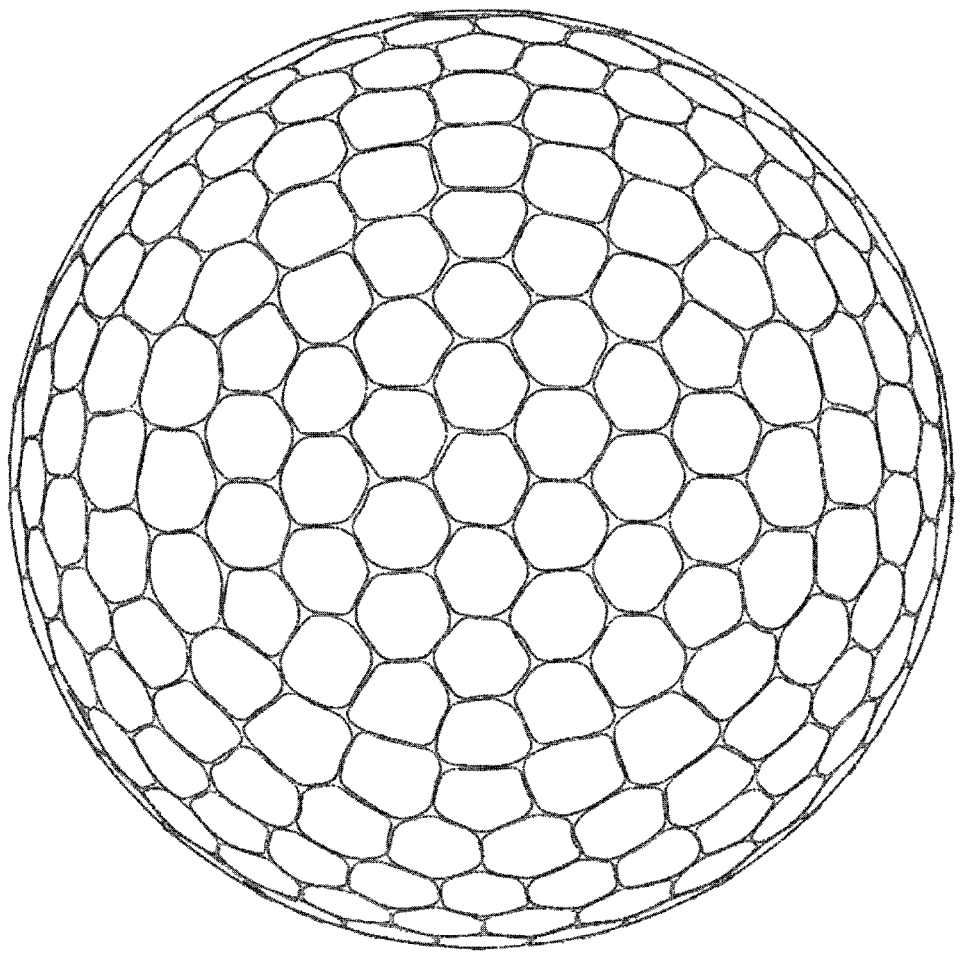
FIG. 79 is a plan view of the golf ball in FIG. 78.
Figure 80:
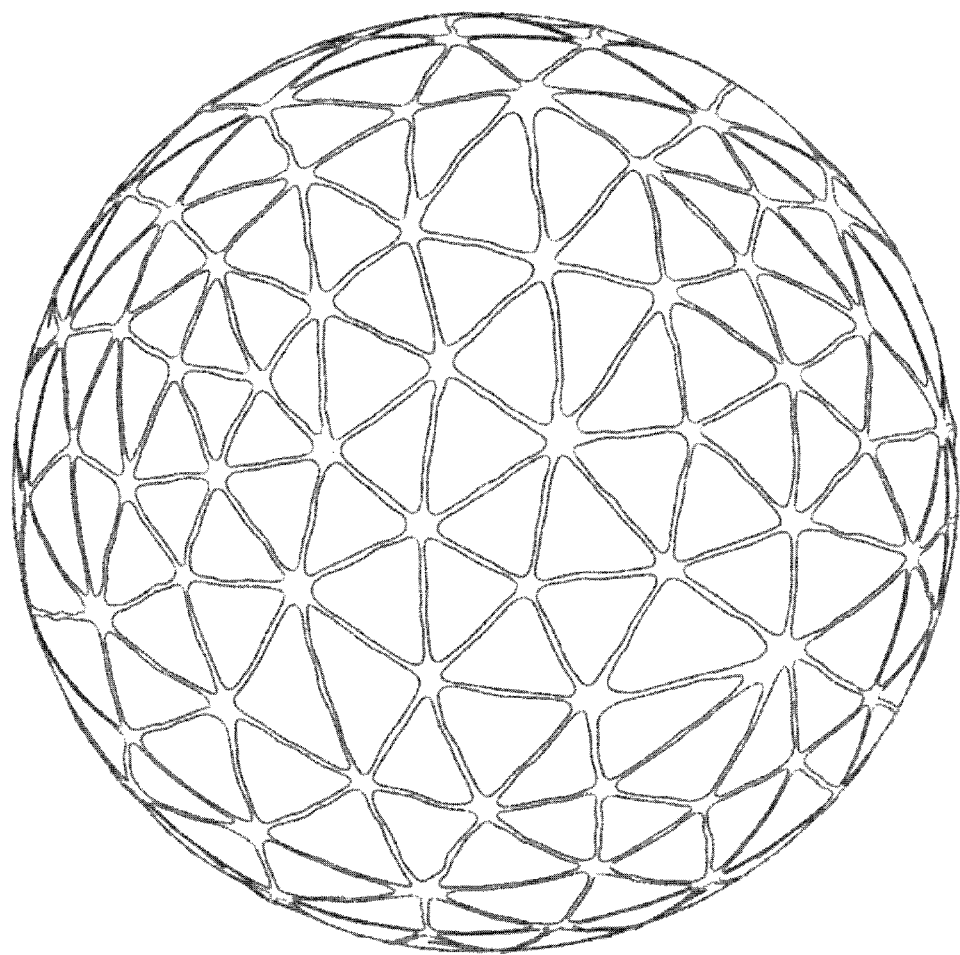
FIG. 80 is a front view of a golf ball according to Comparative Example 13.
Figure 81:
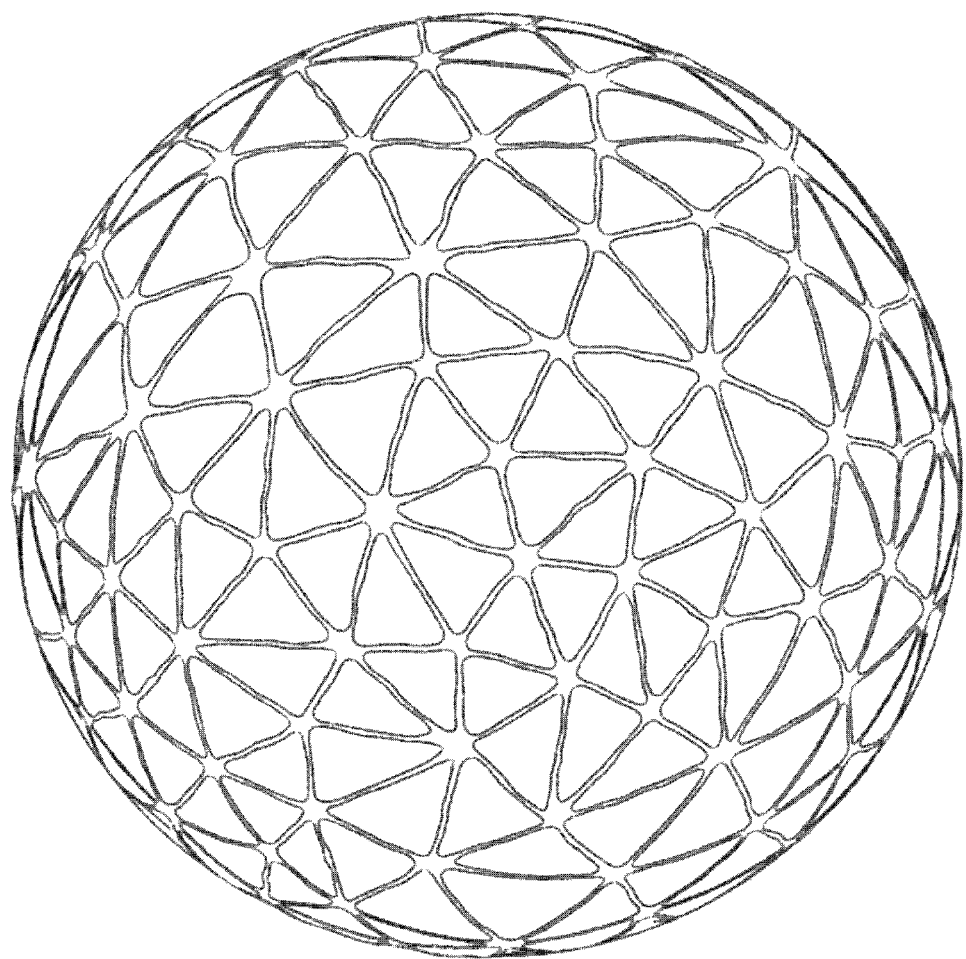
FIG. 81 is a plan view of the golf ball in FIG. 80.

| | Comp. Ex. 12 | Comp. Ex. 13 | Comp. Ex. 7 |
|---|---|---|---|
| Front view | FIG. 78 | FIG. 80 | FIG. 50 |
| Plan view | FIG. 79 | FIG. 81 | FIG. 51 |
| n | — | — | — |
| Number of dimples | 344 | 312 | 332 |
| Lmax(n) (mm) | — | — | — |
| Lmax(n − 1) − Lmax(n) (mm) | — | — | — |
| Lave(n) (mm) | — | — | — |
| Lave(n − 1) − Lave(n) (mm) | — | — | — |
| σA(n) (mm$^2$) | 1.641 | 4.781 | 2.035 |
| σA(n − 1) − σA(n) (mm$^2$) | — | — | — |
| σA(n)/Aave(n) (%) | 10.5 | 29.4 | 13.7 |
| Amax(n) (mm$^2$) | 19.720 | 45.443 | 16.399 |
| Amax(n − 1) − Amax(n) (mm$^2$) | — | — | — |
| Aave(n) (mm$^2$) | 15.632 | 16.287 | 14.876 |
| Y (mm$^2$) | 20.358 | 22.446 | 21.093 |
| σD(n) (mm$^2$) | 0.234 | 0.685 | 0.331 |
| σD(n − 1) − σD(n) (mm$^2$) | — | — | — |
| AveRave(n) (mm) | 2.239 | 2.403 | 2.170 |
| σD(n)/AveRave(n) (%) | 10.4 | 28.5 | 15.3 |
| σRh(n) (mm) | 0.134 | 0.567 | 0.015 |
| Rhmax(n) (mm) | 0.901 | 4.030 | 0.337 |
| Rhmax(n − 1) − Rhmax(n) (mm) | — | — | — |
| Rhmax(n)/AveRave(n) (%) | 40.2 | 167.7 | 15.5 |
| Rhmin(n) (mm) | 0.249 | 1.119 | 0.296 |
| Rhmax(n) − Rhmin(n) (mm) | 0.652 | 2.912 | 0.041 |
| X (mm$^2$) | — | — | — |
| Occupation ratio (%) | 92 | 83.4 | 86 |
| Ratio P1 (%) | 83.4 | 100.0 | 0.0 |
| Ratio P2 (%) | 41.6 | 100.0 | 0.0 |
| Flight distance (yard) | 263.2 | 257 | 262.2 |

As shown in Tables 12 to 14, the golf ball of each Example has excellent flight performance. From the results of evaluation, advantages of the present invention are clear.

The dimple pattern described above is applicable to a one-piece golf ball, a multi-piece golf ball, and a thread-wound golf ball, in addition to a two-piece golf ball. The above descriptions are merely illustrative examples, and various modifications can be made without departing from the principles of the present invention.

What is claimed is:

1. A process for designing a rugged pattern on a golf ball surface, of a golf ball, the process comprising the steps of:
   (1) creating a phantom sphere corresponding to the golf ball surface of the golf ball;
   (2) arranging a plurality of generating points on a surface of the phantom sphere;
   (3) assuming a plurality of Voronoi regions on the surface of the phantom sphere by a Voronoi tessellation based on the plurality of generating points;
   (4) calculating a center of gravity of each of the Voronoi regions and setting the centers of gravity as new generating points;
   (5) assuming a plurality of new Voronoi regions on the surface of the phantom sphere by a Voronoi tessellation based on the plurality of the new generating points; and
   (6) assigning dimples and a land to the surface of the phantom sphere based on contours of the plurality of new Voronoi regions; and
   (7) making a rugged pattern including dimples and lands on the golf ball surface based on the assigned dimple and land on the surface of the phantom sphere.

2. The process according to claim 1, wherein when n is a natural number, the step (4) and the step (5) are further repeated n times between the step (3) and the step (6).

3. The process according to claim 2, wherein
   (I) when a maximum value Lmax(n) of distances between centers of gravity of Voronoi regions obtained when a number of times of the repetition is n and centers of gravity of Voronoi regions obtained when the number of times of the repetition is (n−1) is equal to or less than a predetermined value, or
   (II) when a difference (Lmax(n−1)−Lmax(n)) between a maximum value Lmax(n−1) of distances between the centers of gravity of the Voronoi regions obtained when the number of times of the repetition is (n−1) and centers of gravity of Voronoic regions obtained when the number of times of the repetition is (n−2) and the maximum value Lmax(n) of the distances between the centers of gravity of the Voronoi regions obtained when the number of times of the repetition is n and the centers of gravity of Voronoi regions obtained when the number of times of the repetition is (n−1) is equal to or less than a predetermined value,
   the dimples and the land are assigned to the surface of the phantom sphere based on contours of the Voronoi regions obtained when the number of times of the repetition is n.

4. The process according to claim 2, wherein
   (I) when an average Lave(n) of distances between centers of gravity of Voronoi regions obtained when a number of times of the repetition is n and centers of gravity of Voronoi regions obtained when the number of times of the repetition is (n−1) is equal to or less than a predetermined value, or
   (II) when a difference (Lave(n−1)−Lave(n)) between an average Lave(n−1) of distances between the centers of gravity of the Voronoi regions obtained when the number of times of the repetition is (n−1) and centers of gravity of Voronoi regions obtained when the number of times of the repetition is (n−2) and the average Lave(n) of the distances between the centers of gravity of the Voronoi regions obtained when the number of times of the repetition is n and the centers of gravity of the Voronoi regions obtained when the number of times of the repetition is (n−1) is equal to or less than a predetermined value, the dimples and the land are assigned to the surface of the phantom sphere based on contours of the Voronoi regions obtained when the number of times of the repetition is n.

5. The process according to claim 2, wherein (I) when a standard deviation σA(n) of areas of Voronoi regions obtained when a number of times of the repetition is n is equal to or less than a predetermined value, (II) when a difference (σA(n−1)−σA(n)) between a standard deviation σA(n−1) of areas of Voronoi regions obtained when the number of times of the repetition is (n−1) and the standard deviation σA(n) of the areas of the Voronoi regions obtained when the number of times of the repetition is n is equal to or less than a predetermined value, or (III) when a ratio of the standard deviation σA(n) of the areas of the Voronoi regions obtained when the number of times of the repetition is n, relative to an average Aave(n) of the areas of these Voronoi regions, is equal to or less than a predetermined value, the dimples and the land are assigned to the surface of the phantom sphere based on contours of the Voronoi regions obtained when the number of times of the repetition is n.

6. The process according to claim 2, wherein (I) when a maximum value Amax(n) of areas of Voronoi regions obtained when a number of times of the repetition is n is equal to or less than a predetermined value, or (II) when a difference (Amax(n−1)−Amax(n)) between a maximum value Amax(n−1) of areas of Voronoi regions obtained when the number of times of the repetition is (n−1) and the maximum value Amax(n) of the areas of the Voronoi regions obtained when the number of times of the repetition is n is equal to or less than a predetermined value, the dimples and the land are assigned to the surface of the phantom sphere based on contours of the Voronoi regions obtained when the number of times of the repetition is n.

7. The process according to claim 2, wherein (I) when a standard deviation σD(n) of average diameters of Voronoi regions obtained when a number of times of the repetition is n is equal to or less than a predetermined value, (II) when a difference (σD(n−1)−σD(n)) between a standard deviation σD(n−1) of average diameters of Voronoi regions obtained when the number of times of the repetition is (n−1) and the standard deviation σD(n) of the average diameters of the Voronoi regions obtained when the number of times of the repetition is n is equal to or less than a predetermined value, or (III) when a ratio of the standard deviation σD(n) of the average diameters of the Voronoi regions obtained when the number of times of the repetition is n, relative to an average of average radii Rave(n) of these Voronoi regions, is equal to or less than a predetermined value, the dimples and the land are assigned to the surface of the phantom sphere based on contours of the Voronoi regions obtained when the number of times of the repetition is n.

8. The process according to claim 2, wherein (I) when a radius variation range Rhmax(n) of a Voronoi region having a maximum radius variation range Rh among Voronoi regions obtained when a number of times of the repetition is n is equal to or less than a predetermined value, (II) when a difference (Rhmax(n−1)−Rhmax(n)) between a radius variation range Rhmax(n−1) of a Voronoi region having a maximum radius variation range Rh among Voronoi regions obtained when the number of times of the repetition is (n−1) and the radius variation range Rhmax(n) of the Voronoi region having a maximum radius variation range Rh among the Voronoi regions obtained when the number of times of the repetition is n is equal to or less than a predetermined value, or (III) when a ratio of the radius variation range Rhmax(n) of the Voronoi region having a maximum radius variation range Rh among the Voronoi regions obtained when the number of times of the repetition is n, relative to an average of average radii Rave(n) of these Voronoi regions, is equal to or less than a predetermined value, the dimples and the land are assigned to the surface of the phantom sphere based on contours of the Voronoi regions obtained when the number of times of the repetition is n.

9. The process according to claim 2, wherein (I) when a difference (Rhmax(n)−Rhmin(n)) between a radius variation range Rhmax(n) of a Voronoi region having a maximum radius variation range Rh and a radius variation range Rhmin(n) of a Voronoi region having a minimum radius variation range Rh among Voronoi regions obtained when a number of times of the repetition is n is equal to or less than a predetermined value, or (II) when a difference ((Rhmax(n−1)−Rhmin(n−1))−(Rhmax(n)−Rhmin(n))) between a difference (Rhmax(n−1)−Rhmin(n−1)) between a radius variation range Rhmax(n−1) of a Voronoi region having a maximum radius variation range Rh and a radius variation range Rhmin(n−1) of a Voronoi region having a minimum radius variation range Rh among Voronoi regions obtained when the number of times of the repetition is (n−1) and the difference (Rhmax(n)−Rhmin(n)) between the radius variation range Rhmax(n) of the Voronoi region having a maximum radius variation range Rh and the radius variation range Rhmin(n) of the Voronoi region having a minimum radius variation range Rh among the Voronoi regions obtained when the number of times of the repetition is n is equal to or less than a predetermined value, the dimples and the land are assigned to the surface of the phantom sphere based on contours of the Voronoi regions obtained when the number of times of the repetition is n.

10. The process according to claim 1, wherein, at the step (6), the land is assigned to a vicinity of a contour of each Voronoi region of the surface of the phantom sphere.

11. A golf ball having a rugged pattern on a surface thereof, the rugged pattern being obtained by a designing process comprising the steps of:

(1) creating a phantom sphere corresponding to the golf ball surface of the golf ball;

(2) arranging a plurality of generating points on a surface of the phantom sphere;
(3) assuming a plurality of Voronoi regions on the surface of the phantom sphere by a Voronoi tessellation based on the plurality of generating points;
(4) calculating a center of gravity of each of the Voronoi regions and setting the centers of gravity as new generating points;
(5) assuming a plurality of new Voronoi regions on the surface of the phantom sphere by a Voronoi tessellation based on the plurality of the new generating points; and
(6) assigning dimples and a land to the surface of the phantom sphere based on contours of the plurality of new Voronoi regions; and
(7) making the rugged pattern including dimples and lands on the golf ball surface based on the assigned dimple and land on the surface of the phantom sphere.

12. The golf ball according to claim 11, wherein
the golf ball has a plurality of dimples on the surface thereof, and
a ratio P1 of a number of dimples having a radius variation range Rh of 0.4 mm or greater relative to a total number of the dimples is equal to or greater than 30%.

13. The golf ball according to claim 11, wherein a ratio of a total area of all the dimples relative to a surface area of the phantom sphere is equal to or greater than 85%.

14. The golf ball according to claim 11, wherein a ratio of a standard deviation of average diameters of all the dimples relative to an average of average radii of all the dimples is equal to or less than 10%.

15. The golf ball according to claim 11, wherein a ratio of a standard deviation of areas of all the dimples relative to an average area of all the dimples is equal to or less than 10%.

* * * * *